United States Patent
Ikeda et al.

(10) Patent No.: US 6,323,490 B1
(45) Date of Patent: Nov. 27, 2001

(54) X-RAY SEMICONDUCTOR DETECTOR

(75) Inventors: Mitsushi Ikeda, Yokohama; Manabu Tanaka, Otawara; Masaki Atsuta, Yokosuka; Akira Kinno, Yokohama; Kohei Suzuki, Yokohama; Norihiko Kamiura, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/271,981

(22) Filed: Mar. 19, 1999

(30) Foreign Application Priority Data

Mar. 20, 1998 (JP) .................................................. 10-071692
Mar. 20, 1998 (JP) .................................................. 10-072628

(51) Int. Cl.$^7$ ...................................................... H05G 1/64
(52) U.S. Cl. .............................. 250/370.09; 250/370.07
(58) Field of Search ........................ 250/370.09, 370.07, 250/208.1

(56) References Cited

U.S. PATENT DOCUMENTS

| | | | |
|---|---|---|---|
| 4,689,487 | | 8/1987 | Nishiki et al. . |
| 5,200,876 | * | 4/1993 | Takeda et al. .......................... 361/91 |
| 5,319,206 | * | 6/1994 | Lee et al. ......................... 250/370.09 |
| 5,589,705 | * | 12/1996 | Saito et al. ............................ 257/459 |
| 5,757,040 | * | 5/1998 | Saito et al. ............................ 257/232 |
| 5,812,191 | * | 9/1998 | Orava et al. ..................... 250/370.09 |
| 5,818,898 | * | 10/1998 | Tsukamoto et al. ............. 250/370.09 |
| 5,930,591 | * | 7/1999 | Huang ..................................... 438/36 |
| 5,981,931 | * | 11/1999 | Kinno et al. ....................... 250/208.1 |
| 6,035,013 | * | 3/2000 | Orava et al. ..................... 250/370.09 |
| 6,044,128 | * | 3/2000 | Tanaka et al. ................... 250/370.09 |
| 6,051,827 | * | 4/2000 | Mei et al. .......................... 250/208.1 |
| 6,157,066 | * | 12/2000 | Kobayashi ............................. 257/363 |
| 6,185,274 | * | 2/2001 | Kinno et al. ..................... 250/370.07 |

FOREIGN PATENT DOCUMENTS 10-10237   1/1998  (JP) .

OTHER PUBLICATIONS

1997 Sid International Symposium Digest of Technical Papers, Application of a–Si Active–Matrix Technology in a X–Ray Detector Panel, L.S. Jeromin, D. Lee, pp. 91–94.
Medical Imaging 1995, Physics of Medical Imaging, A New Digital Detector for Projection Radiography, Denny L. Lee, Lawrence K. Cheung, Lothar S. Jeromin pp. 237–249.

* cited by examiner

Primary Examiner—Constantine Hannaher
Assistant Examiner—Otilia Gabor
(74) Attorney, Agent, or Firm—Oblon, Spivak, McClelland, Maier & Neustadt, P.C.

(57) ABSTRACT

An X-ray semiconductor detector has a pixel array structure in which a plurality of pixel elements are arrayed in a matrix. Each pixel element includes an X-ray/charge conversion film for generating charges in accordance with an incident X-ray, a storage capacitor for storing the signal charges generated in the X-ray/charge conversion film, a signal read transistor for reading the signal charges from the storage capacitor, and a protective diode arranged to remove excessive charges from the storage capacitor and prevent dielectric breakdown of the signal read transistor. The protective diode is arranged below the storage capacitor. Since the protective diode is arranged below the storage capacitor, it does not decrease the pixel density. Since the protective diode is covered with the storage capacitor, it can be shielded from an X-ray. Therefore, variations in OFF current of the protective diode by an X-ray and dielectric breakdown of the protective diode can be prevented.

22 Claims, 44 Drawing Sheets

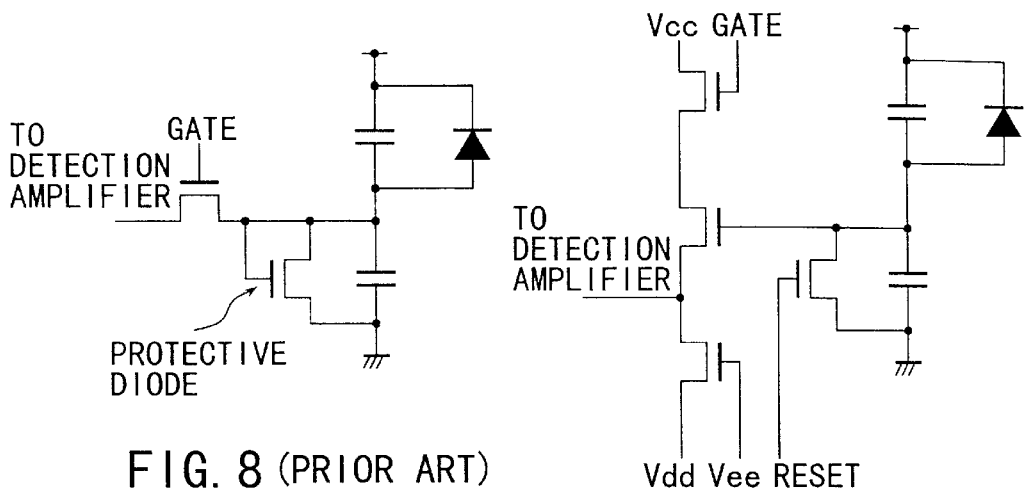
FIG. 8 (PRIOR ART)
FIG. 9 (PRIOR ART)
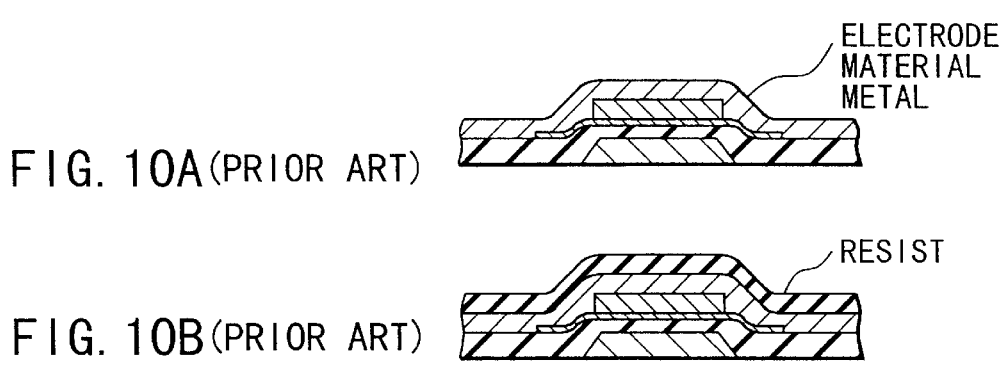
FIG. 10A (PRIOR ART)
FIG. 10B (PRIOR ART)
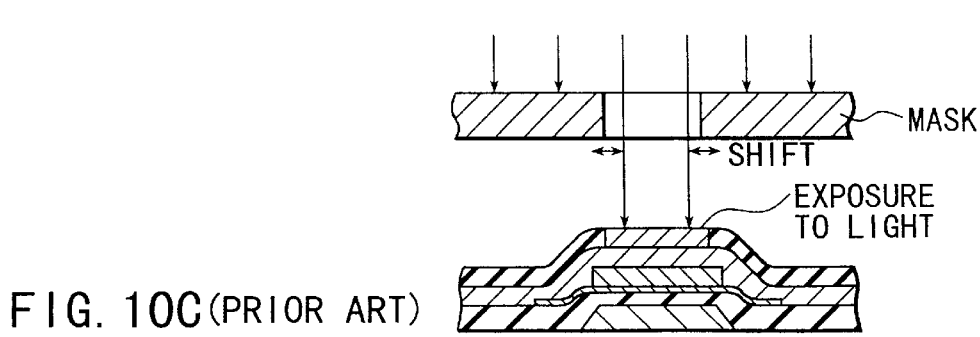
FIG. 10C (PRIOR ART)
FIG. 10D (PRIOR ART)

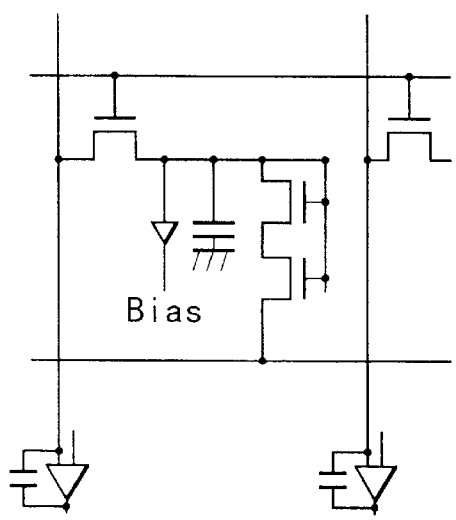
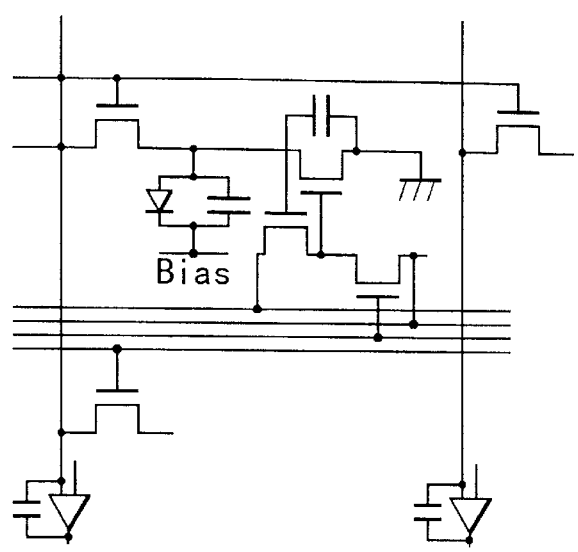
FIG. 17    FIG. 18
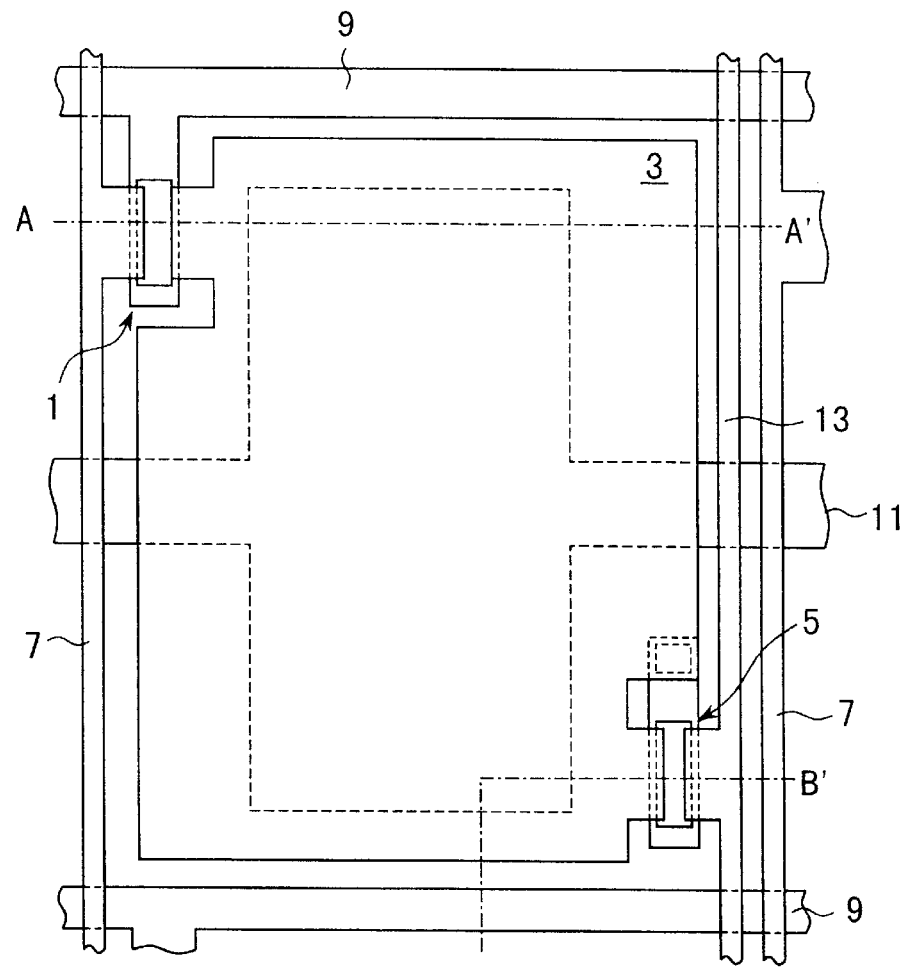
FIG. 19

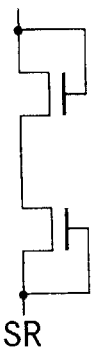
FIG. 76A
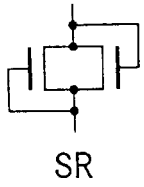
FIG. 76B
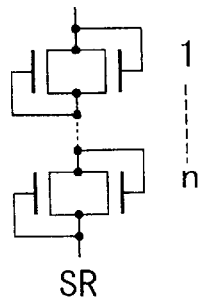
FIG. 76C
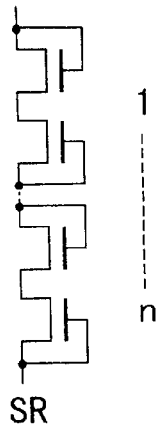
FIG. 76D
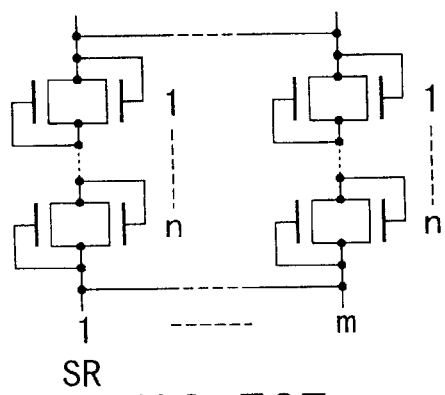
FIG. 76E
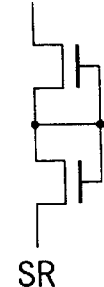
FIG. 76F
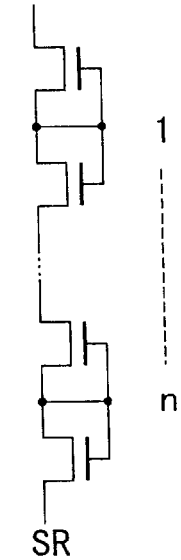
FIG. 76G
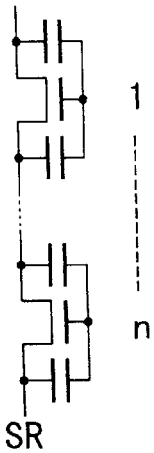
FIG. 76H
FIG. 76I

X-RAY SEMICONDUCTOR DETECTOR

BACKGROUND OF THE INVENTION

The present invention relates to an X-ray semiconductor detector suitable for a medical X-ray diagnostic apparatus.

In recent years, in the medical fields, medical data of patients have been formed into a database for quick, proper treatment. The patient often uses a plurality of medical institutes. In this case, the patient may not receive proper treatment without data of other medical institutes. For example, the patient may suffer affective reaction with drugs administered by other medical institutes. The patient must be properly treated in consideration of drugs administered by other medical institutes.

Demands have arisen for a database of X-ray photographing image data and digital X-ray photographing images. A conventional medical X-ray diagnostic apparatus uses a silver chloride film. To digitize an X-ray image formed on the silver chloride film, the image on the developed film must be converted into an electrical signal by the scanner. This is very cumbersome and time-consuming.

Recently, digital image data can be obtained by directly photographing an X-ray image with a CCD camera about one inch. However, when, e.g., lungs are to be photographed, an optical device for focusing light is required to photograph an area about 40 cm×40 cm, which makes the apparatus large. Further, a resolution is lowered by a conversion of a optical system.

To eliminate the time-consuming, cumbersome processing, downsize the apparatus and improve a resolution, an X-ray semiconductor detector using an amorphous silicon thin-film transistor (a-Si TFT) is proposed (U.S. Pat. No. 4,689,487). FIG. 1 shows an example of the arrangement of this X-ray semiconductor detector.

In FIGS. 1 and 2, a pixel $e_{1,1}$ is made up of an a-Si TFT 9105, a photosensitive film (photoconductor film) 9101, and an storage capacitor 9103. Pixels e are laid out in an array (to be referred to as a TFT array hereinafter) made up of several hundred to thousand pixels on each of line and column sides.

The photosensitive film 9101 receives a bias voltage from a power supply 9109. The a-Si TFT 9105 is connected to a signal read line S1 and a gate line Gl, and turned on/off under the control of a gate electrode driver 9113. The terminal end of the signal read line Si is connected to a signal detection amplifier 9115 via a signal read TFT 9107.

When light is incident, a current flows through the photosensitive film 9101 to storage charges in the storage capacitor 9103. The gate electrode driver 9113 drives the gate line to turn on all TFTs connected to one gate line, and then the stored charges are transferred toward the amplifier 9115 via the signal read line S1. The signal read TFT 9107 inputs the charges to the amplifier 9115 in units of pixels, and the amplifier 9115 converts the charges into dot-sequential signals so as to be displayed on the CRT or the like. The charge amount changes depending on the light quantity incident on pixels, and the output amplitude of the amplifier 9115 changes.

In the detector shown in FIGS. 1 and 2, an output signal from the amplifier 9115 can be directly A/D-converted into a digital image. The pixel area shown in FIGS. 1 and 2 has the same structure as in a TFT-LCD (Thin-Film Transistor Liquid Crystal Display) adopted in a notebook personal computer, and can be easily formed into a low profile, small thickness, large-screen display.

The above description concerns an X-ray semiconductor detector of an indirect conversion type in which an incident X-ray is converted into a visible light by a phosphor or the like, and the converted light is converted into charges by the photoconductor or photosensitive film of each pixel. In addition, there is an X-ray semiconductor detector of a direct conversion type in which an X-ray incident on pixels is directly converted into charges.

The X-ray semiconductor detector of this direct conversion type is different from that of the indirect conversion type in the magnitude of a bias voltage and the method of applying it to the charge conversion film. In indirect conversion, a negative bias of several V is applied to only the photosensitive film, and when light is incident on the photosensitive film, charges are stored in the storage capacitor arranged parallel to the photosensitive film and a capacitance Csi of the photosensitive film itself in each pixel. In this case, the maximum voltage applied to the storage capacitor is the several-V bias applied to the photosensitive film. To the contrary, in direct conversion-type, the X-ray/charge conversion film and storage capacitor are series-connected to each other, and receive a high bias of several kV. When an X-ray is incident on pixels, charges generated in the X-ray/charge conversion film are stored in the storage capacitor. If the quantity of incident X-ray is excessively large, charges stored in the storage capacitor increase to apply a voltage of several kV at maximum to the storage capacitor, causing dielectric breakdown of a TFT formed as a pixel switch or the storage capacitor.

For this reason, direct conversion must adopt any measure to protect the storage capacitor from an excessive voltage. For example, as shown in FIGS. 3 and 4 (Denny L. Lee etc., SPIE, Vol. 2,432, p. 237, 1995), a dielectric layer (insulating layer) is formed on the X-ray/charge conversion film to series-connect three capacitors (dielectric layer Cd, X-ray/charge conversion film Cse, and storage capacitor), and charges generated in the X-ray/charge conversion film are partially stored in the capacitance formed by this dielectric layer to prevent dielectric breakdown of the TFT. As shown in FIG. 5, when an excessive quantity of X-ray is incident on pixels, a necessary amount of generated charges is stored in the storage capacitor, and the remaining charges are removed outside the pixel via a protective diode formed on each pixel, thereby preventing dielectric breakdown of the TFT.

In the example of FIGS. 3 and 4, no electrode layers for discharging charges are inserted between the X-ray/charge conversion film Cse and the dielectric layer Cd. Accordingly, resetting of Cd after receiving an image spends a relatively long time, so no moving picture can be obtained.

In the example of FIG. 5, since capacitors are not formed in series, unlike the example of FIGS. 3 and 4, the reset time of Cd is relatively short, and a fluoroscopy mode can be realized. However, when, e.g., a TFT is used as a protective diode, if the drain electrode on the opposite side to the pixel out of the terminals of the protective diode is set to a potential of 0V, i.e., connected to the electrode of the storage capacitor, the pixel potential (threshold voltage) at which removal of charges from the pixel starts becomes small (0 to 4V), the leakage current becomes large, and the TFT cannot be used as a protective diode. This problem can be solved by supplying a positive potential to the drain electrode. However, signal noise may increase or the yield of the TFT array may decrease depending on the layout of the power supply line (bias line) for applying the voltage.

As the number of TFTs used as protective diodes increases, the number of power supply lines increases, and the yield seriously decreases.

At the same time, since the occupation rate of the TFT and power supply line in the pixel increases, a pixel electrode serving as an effective area for the sensor of one pixel and the capacitance of the pixel are difficult to ensure.

In photographing a patient or the like, the X-ray intensity must be set as low as possible. To ensure a large dynamic range, even a weak signal is preferably detected.

The lower limit of this weak signal is determined by the OFF current of the protective diode, a signal shift by the stray capacitance, noise of the operational amplifier, and the like. Since another noise can be reduced by another appropriate means, a change in pixel potential by the leakage current of the protective diode finally determines the lowest detectable signal level of the weak signal. To prevent the change in pixel potential, the value and variation of the leakage current must be suppressed small.

Particularly when X-ray image of a human body is observed, a weak signal is preferably detected to minimize the influence of the X-ray on the human body. Also, dielectric breakdown of the protective diode by application of the pixel voltage must be prevented.

FIG. 6 shows the whole arrangement of an X-ray diagnostic apparatus equipped with an X-ray semiconductor detector using an a-Si TFT. FIG. 7 is an equivalent circuit diagram showing the X-ray semiconductor detector using an a-Si TFT. An X-ray emitted by an X-ray source 9251 passes through an object 9252 to be examined, and is incident on an X-ray semiconductor detector 9253 having an a-Si TFT array structure. The X-ray semiconductor detector 9253 converts the X-ray quantity having passed through the object 9252 into an analog electrical signal. The obtained analog signal is converted into a time-series digital signal by an A/D converter 9257, and the digital signal is stored in an image memory 9258. The image memory 9258 can store data of one or several images, and sequentially stores data at a specific address by a control signal from a controller 9263. An arithmetic processor 9259 extracts data from the image memory 9258, arithmetically processes the data, and stores the result back in the image memory. The processed data in the image memory 9258 is converted into an analog signal by a D/A converter 9260, and the analog signal is displayed as an X-ray image on a monitor 9261.

In FIG. 7, a pixel $e_{1,1}$ is made up of an a-Si TFT 9274, a photosensitive film 9270, and an storage capacitor 9273. Pixels e are laid out in a 2,000×2,000 array (to be referred to as a TFT array hereinafter). The photosensitive film 9270 receives a bias voltage from a power supply 9271. The a-Si TFT 9274 is connected to a signal read line Si and a gate line G1, and turned on/off under the control of a gate electrode driver 9277. The terminal end of the signal read line Si is connected to a signal detection amplifier 9276.

When light is incident, a current flows through the photosensitive film 9270 to storage charges in the storage capacitor 9273. The gate electrode driver 9277 drives the gate line to turn on all TFTs connected to one gate line, and then the stored charges are transferred toward the amplifier 9276 via the signal read line S1. The charge amount changes depending on the light quantity incident on pixels, and the output amplitude of the amplifier 9276 changes.

In the detector shown in FIG. 7, an output signal from the amplifier 9276 can be directly A/D-converted into a digital image. The pixel area shown in FIG. 7 has the same structure as in a TFT-LCD (Thin-Film Transistor Liquid Crystal Display) adopted in a notebook personal computer, and can be easily formed into a small thickness, large-screen display.

One pixel is formed from one a-Si TFT in FIG. 7, but the pixel is formed from a plurality of a-Si TFTs in an actual device. In some cases, the a-Si TFT may be formed outside the pixel area. For example, the diode may be formed in the pixel as shown in FIG. 8, or stored charges may be converted into a voltage and output as shown in FIG. 9 (AMI (Amplified MOS Imager).

The X-ray semiconductor detector used in the medical fields is demanded for a high S/N ratio and a wide dynamic range. For this reason, a plurality of a-Si TFTs in the pixel must have the same characteristics. Variations in TFT characteristics, particularly, variations in OFF resistance and Vth degrade the image quality of a detected image. If the OFF resistance varies, the leakage current cannot be minimized and increases noise, i.e., decreases the S/N ratio and dynamic range. Variations in Vth offset the output signal and cause fixed pattern noise.

Owing to changes in Vth over time, correction data must be obtained every photographing in order to attain a high-quality image, resulting in a low working efficiency.

As described above, when a plurality of a-Si TFTs are formed in the pixel or when the AMI structure is employed, a high-quality image having a high S/N ratio and a wide dynamic range cannot be obtained due to variations in characteristics of the a-Si TFTs.

In many cases, variations in TFT characteristics are caused by variations in TFT shapes owing to mask misalignment in manufacturing a TFT array. To make the TFT characteristics uniform, the shapes of TFTs must be formed uniform.

FIGS. 10A, 10B, 10C, and 10D sequentially show the steps in manufacturing a TFT array. In FIGS. 10A, 10B, 10C, and 10D, source and drain electrodes are formed. After an electrode material metal (e.g., Al or Mo) is deposited (1), a resist is applied (2), exposed to light via a mask (3), and etched (4), thereby forming electrodes. The TFT is formed from respective layers (gate electrode, insulating layer, pixel electrode, and the like), and these layers use predetermined masks. To form the TFT into a designed shape, these masks must be accurately aligned. However, since misalignment of the masks is inevitable to a certain degree, the TFT array must be designed in consideration of mask misalignment so as to obtain desired performance even in the worst case.

L. S. Jeromin et al., have introduced a two-dimensional X-ray semiconductor detector in which an amorphous Se layer for converting an X-ray into charges is stacked on an a-Si (amorphous silicon) TFT (Thin-Film Transistor) array (SID 97 DIGEST (1997) p. 91).

FIG. 11 shows a conventional TFT array. This TFT is a top gate electrode type a-Si TFT. An $SiO_x$ film 9302 is formed on a glass substrate 9301. A drain electrode 9313, a source electrode 9303 made of ITO, and a lower capacitor electrode 9305 are formed on the $SiO_x$ film 9302. An a-Si layer 9304, a capacitor insulating film 9306, an insulating film 9307, a gate electrode 9309, a passivation film 9310, an upper capacitor electrode 9308, and a pixel electrode 9311 made of ITO are formed on the resultant structure. The passivation film 9310 is generally made of an $SiN_x$ film. Since $SiN_x$ is poor in step coverage, interlevel short circuits readily occur between the gate electrode 9309 and pixel electrode 9311, resulting in low manufacturing yield. Since $SiN_x$ is formed by a CVD process, it cannot be made thick and is formed to a thickness of about 2,000 to 3,000 Å (angstrom). If this thin $SiN_x$ film is used, an electrostatic capacitance is generated between the gate electrode 9309 and pixel electrode 9311, distorting or delaying a gate electrode signal pulse.

The conventional X-ray semiconductor detector uses ITO for the pixel electrode. A chest photographing detector requires an area of 40 cm×40 cm for the pixel area. However, the ITO film is difficult to deposit uniformly in this large area. ITO is patterned by a hydrochloric acid-based etching solution using a photoresist as a mask. Since the etching rate of ITO by the hydrochloric acid-based etching solution changes depending on the crystallinity, the etching rate is high for bad crystallinity and low for good crystallinity. Etching is performed until all the ITO film is removed, namely a portion having the lowest etching rate within the plane is completely etched. At this time, a portion having a high etching rate is excessively etched. Especially, ITO is amorphous-like at the interface between the organic insulating film and ITO.

Since, therefore, the etching rate at the interface is very high, the etching solution penetrates to cause serious side etching. When a 1,500-Å (angstrom) ITO film is etched in an 8 cm×8 cm pixel area for an over etching rate of 10%, the side etching amount is 0.5 $\mu$m at minimum and 10 $\mu$m at maximum. In this case, when the pixel electrode resist pattern size is 100 $\mu$m×100 $\mu$m, the maximum pixel area is 9,900 $\mu m^2$, and the minimum pixel area is 6,400 $\mu m^2$ which is 64.6% of the maximum pixel area. If the pixel area varies between pixels in this manner, the signal amount varies not to obtain an accurate image.

In manufacturing a TFT array, an electrostatic TFT error may occur and appears as a point or line defect on a detected image to degrade a display image.

FIG. 12 is a sectional view showing the pixel area of the X-ray semiconductor detector. In FIG. 12, a gate electrode 9122, a gate line 9123, a storage capacitor line (including an storage capacitor electrode) 9124 are formed on a glass substrate 9121, and an insulating film 9125 is formed on them. An a-Si film 9126 serving as a channel formation layer for an a-Si TFT is formed on the insulating film 9125, and a silicon nitride film (not shown) is formed as a stopper insulating film on the a-Si film 9126. N$^+$-type a-Si films (not shown) serving as source and drain electrodes are formed in regions corresponding to the two sides of the a-Si film 9126, and connected to source and drain electrodes 9128 and 9127. The drain electrode 9127 is connected to a signal read line 9129 formed from the same layer in the same step. An insulating film 9130 is formed on the electrodes 9127 and 9128 and the signal read line 9129. A pixel electrode 9131 is formed on the insulating film 9130 via an opening formed in this insulating film. An X-ray/charge conversion film 9132 is formed on the pixel electrode 9131, and an upper electrode 9133 is formed on the X-ray/charge conversion film 9132.

In the conventional structure, only one insulating film 9130 is interposed between the signal read line 9129, pixel electrode 9131, and X-ray/charge conversion film 9132. Large noise may be generated by capacitive coupling between them. Further, only the insulating film 9125 is interposed between the signal read line 9129, lower storage capacitor line 9124, and the like. Also at this portion, a large noise component may be generated by capacitive coupling between them. The noise component of the signal read line is amplified by a detection amplifier, failing to obtain an accurate photographing result (diagnostic result).

As described above, in the conventional X-ray semiconductor detector, large noise may be generated by capacitive coupling between the signal read line and another conductive region, and an accurate photographing result is difficult to obtain particularly for a weak signal.

BRIEF SUMMARY OF THE INVENTION

It is an object of the present invention to increase the pixel density while preventing characteristic errors and dielectric breakdown of a protective diode caused by an X-ray in an X-ray semiconductor detector equipped with the protective diode in order to protect a signal read transistor from dielectric breakdown.

According to the present invention, since the protective diode is arranged below a pixel electrode, it does not decrease the pixel density. Since the protective diode is covered with the pixel electrode, it can be shielded from a high voltage and an X-ray. This prevents variations in OFF current of the protective diode and dielectric breakdown of the protective diode caused by a high voltage and an X-ray.

According to the present invention, the protective diode is arranged below the pixel electrode, and in addition the power supply line of the protective diode and a signal read line are arranged parallel to each other so as not to overlap each other. No parasitic capacitance is generated between the power supply line of the protective diode and the signal read line.

According to the present invention, the protective diode is arranged below the pixel electrode. Further, a series-connected capacitor structure is formed by sandwiching an a-Si film together with an insulating film between the gate line of a signal read transistor and the signal read line at the intersection of the gate and signal read lines. The parasitic capacitance can be substantially halved, and the S/N ratio can be substantially doubled compared to the conventional S/N ratio.

According to the present invention, the protective diode is arranged below the pixel electrode, and the storage capacitor line and the signal read line are arranged parallel to each other so as not to overlap each other. Electrical coupling between the capacitor and signal read lines can be suppressed to reduce noise and increase the S/N ratio.

According to the present invention, the protective diode is arranged below the pixel electrode, and a signal read transistor and a protective diode transistor in the pixel are formed parallel to each other in the channel direction. Even if a mask is slightly misaligned during the manufacture, transistor characteristics such as the OFF current and threshold voltage can be kept uniform to a certain degree.

According to the present invention, the protective diode is arranged below the pixel electrode, and a pixel electrode is formed from an Al alloy. When the pixel electrode is formed from only Al, a hillock is formed in a high-temperature step. However, when the pixel electrode is formed from an Al alloy, any hillock can be prevented, and a high pixel-numerical aperture can be realized by a high pattern accuracy.

According to the present invention, the protective diode is arranged below the electrode of the storage capacitor, and the signal read line is arranged below the gate insulating film of the signal read transistor. Hence, noise caused by coupling between the signal read line and storage capacitor electrode can be greatly reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 8 is an equivalent circuit diagram showing one pixel of an X-ray semiconductor detector using a conventional protective diode;

FIG. 9 is an equivalent circuit diagram showing one pixel of an X-ray semiconductor detector of a conventional AMI type;

FIG. 10A is a sectional view showing the TFT portion of a conventional X-ray semiconductor detector;

FIG. 10B is a sectional view showing the TFT portion of the conventional X-ray semiconductor detector;

FIG. 10C is a sectional view showing the TFT portion of the conventional X-ray semiconductor detector;

FIG. 10D is a sectional view showing the TFT portion of the conventional X-ray semiconductor detector;

FIG. 17 is an equivalent circuit diagram showing one pixel according to Embodiment 1;

FIG. 18 is an equivalent circuit diagram showing one pixel using an amplification protective diode according to Embodiment 1;

FIG. 19 is a plan view showing one pixel of an X-ray semiconductor detector according to Embodiment 2 of the present invention;

FIG. 76A is an equivalent circuit diagram showing another electrostatic discharge means in FIG. 74;

FIG. 76B is an equivalent circuit diagram showing still another electrostatic discharge means in FIG. 74;

FIG. 76C is an equivalent circuit diagram showing still another electrostatic discharge means in FIG. 74;

FIG. 76D is an equivalent circuit diagram showing still another electrostatic discharge means in FIG. 74;

FIG. 76E is an equivalent circuit diagram showing still another electrostatic discharge means in FIG. 74;

FIG. 76F is an equivalent circuit diagram showing still another electrostatic discharge means in FIG. 74;

FIG. 76G is an equivalent circuit diagram showing still another electrostatic discharge means in FIG. 74;

FIG. 76H is an equivalent circuit diagram showing still another electrostatic discharge means in FIG. 74;

FIG. 76I is an equivalent circuit diagram showing still another electrostatic discharge means in FIG. 74;

DETAILED DESCRIPTION OF THE INVENTION (Embodiment 1; Protective Diode is Formed Below Pixel Electrode)

Figure 1:
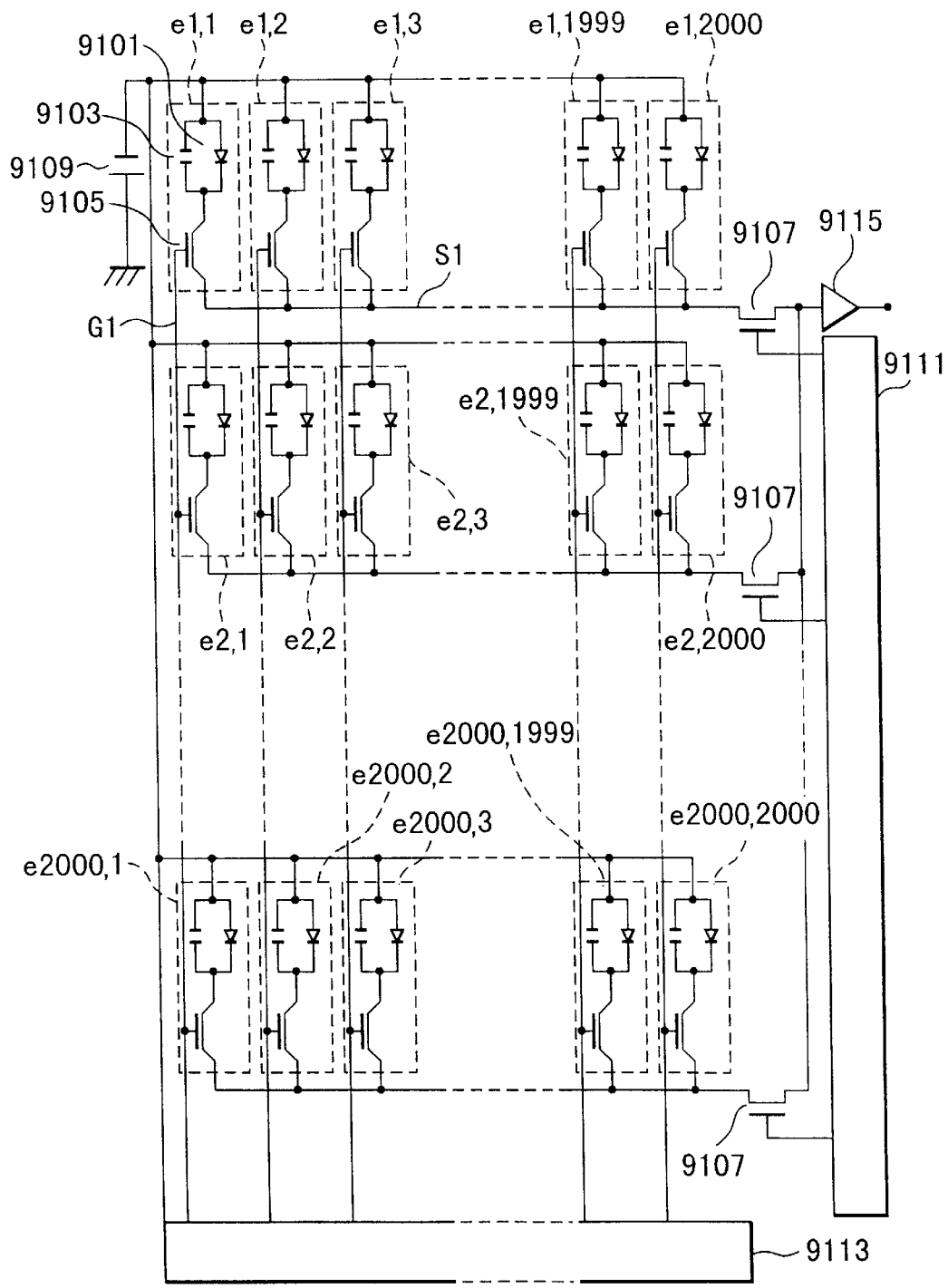
FIG. 1 is an equivalent circuit diagram showing a conventional X-ray semiconductor detector.
Figure 2:
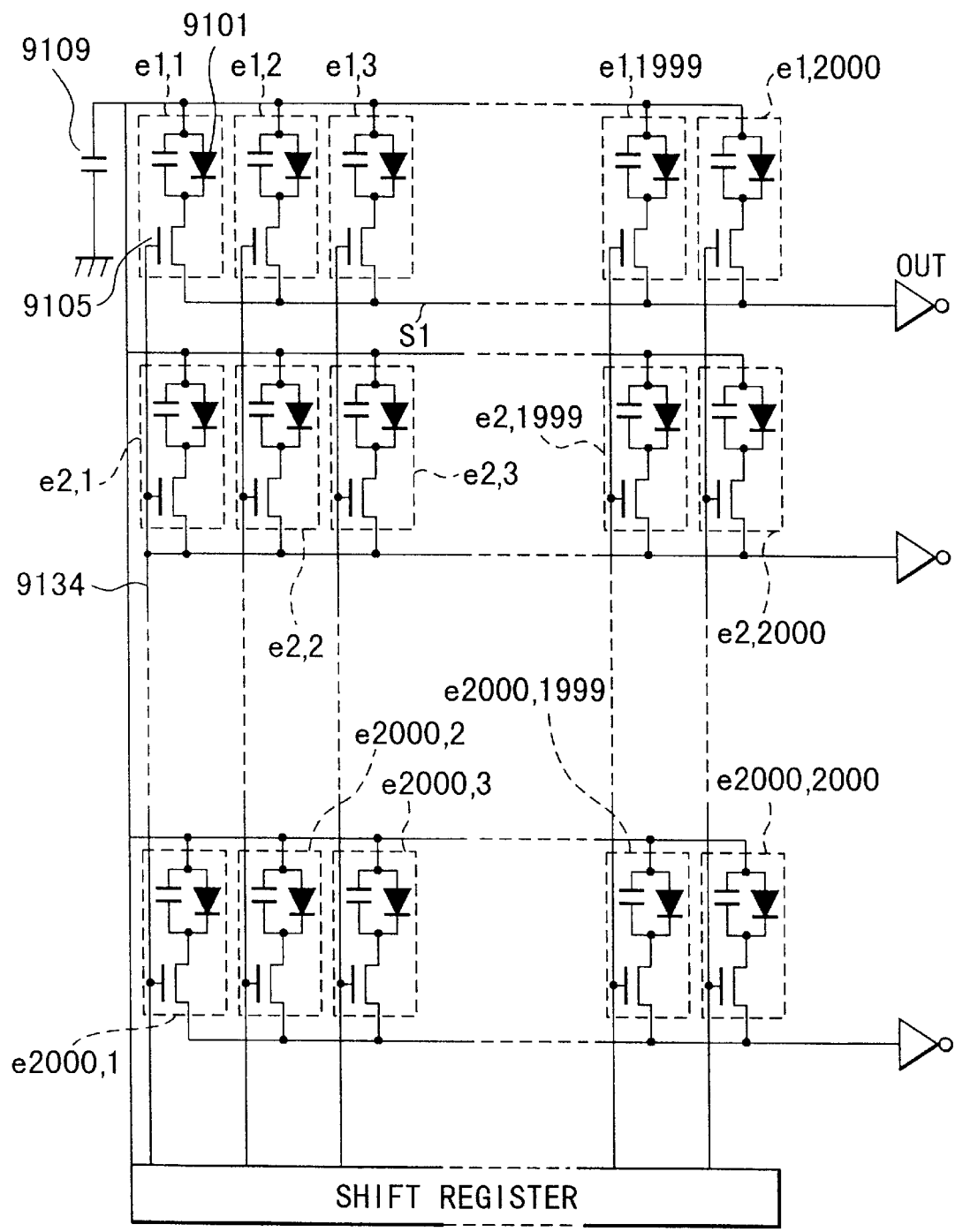
FIG. 2 is an equivalent circuit diagram showing the conventional X-ray semiconductor detector.
Figure 3:
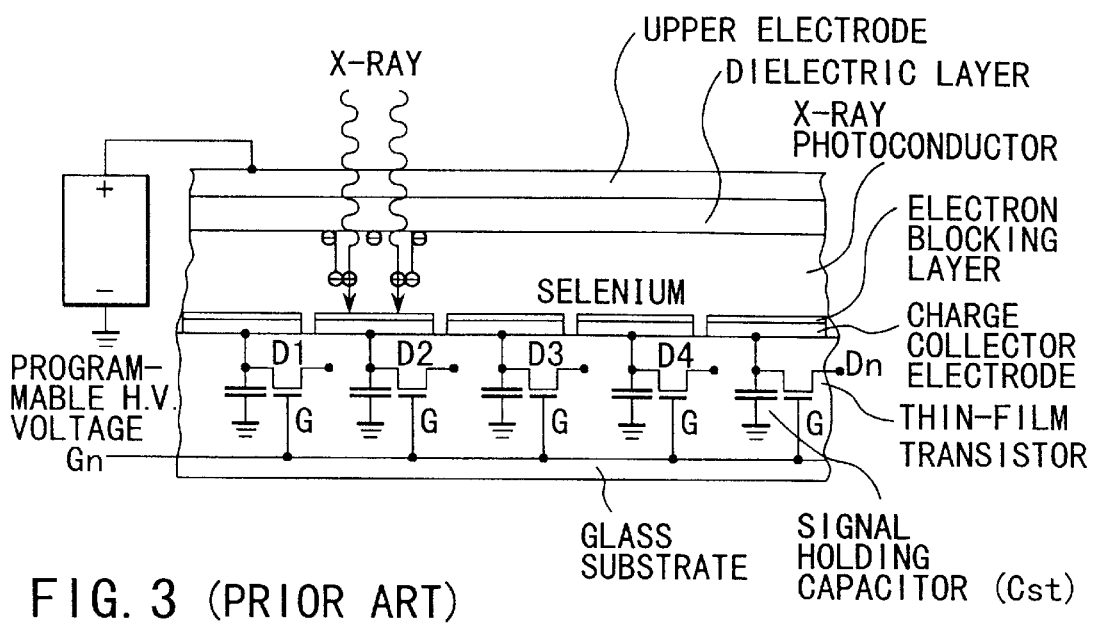
FIG. 3 is a view for explaining the principle of X-ray detection by the conventional X-ray semiconductor detector.
Figure 4:
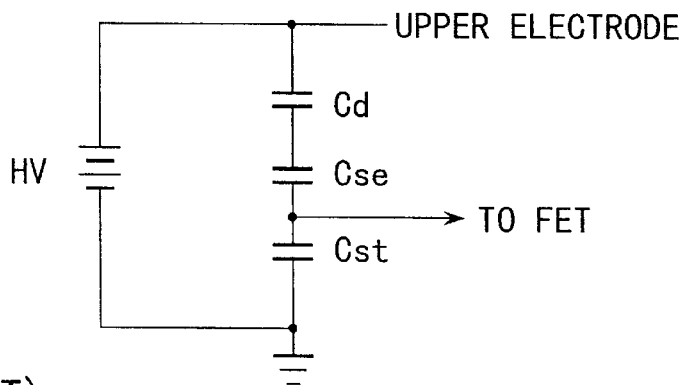
FIG. 4 is an equivalent circuit diagram showing a TFT breakdown preventive portion of the conventional X-ray semiconductor detector.
Figure 5:
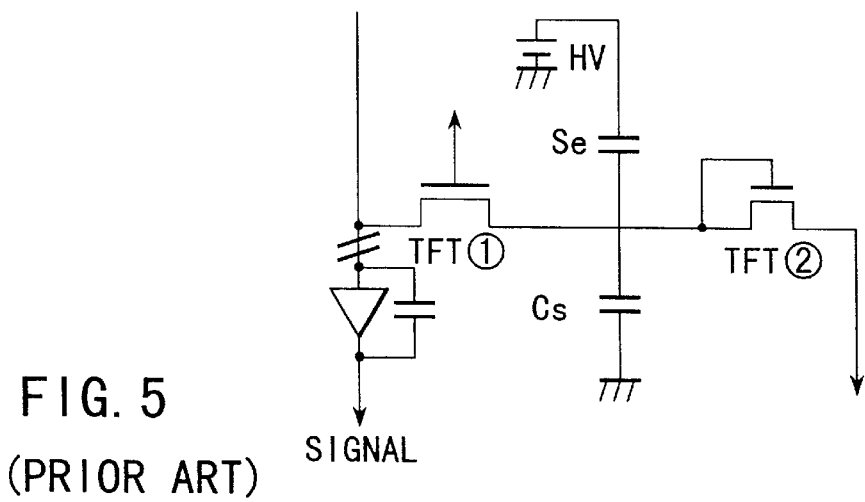
FIG. 5 is an equivalent circuit diagram showing a short-reset-time portion of the conventional X-ray semiconductor detector.
Figure 6:
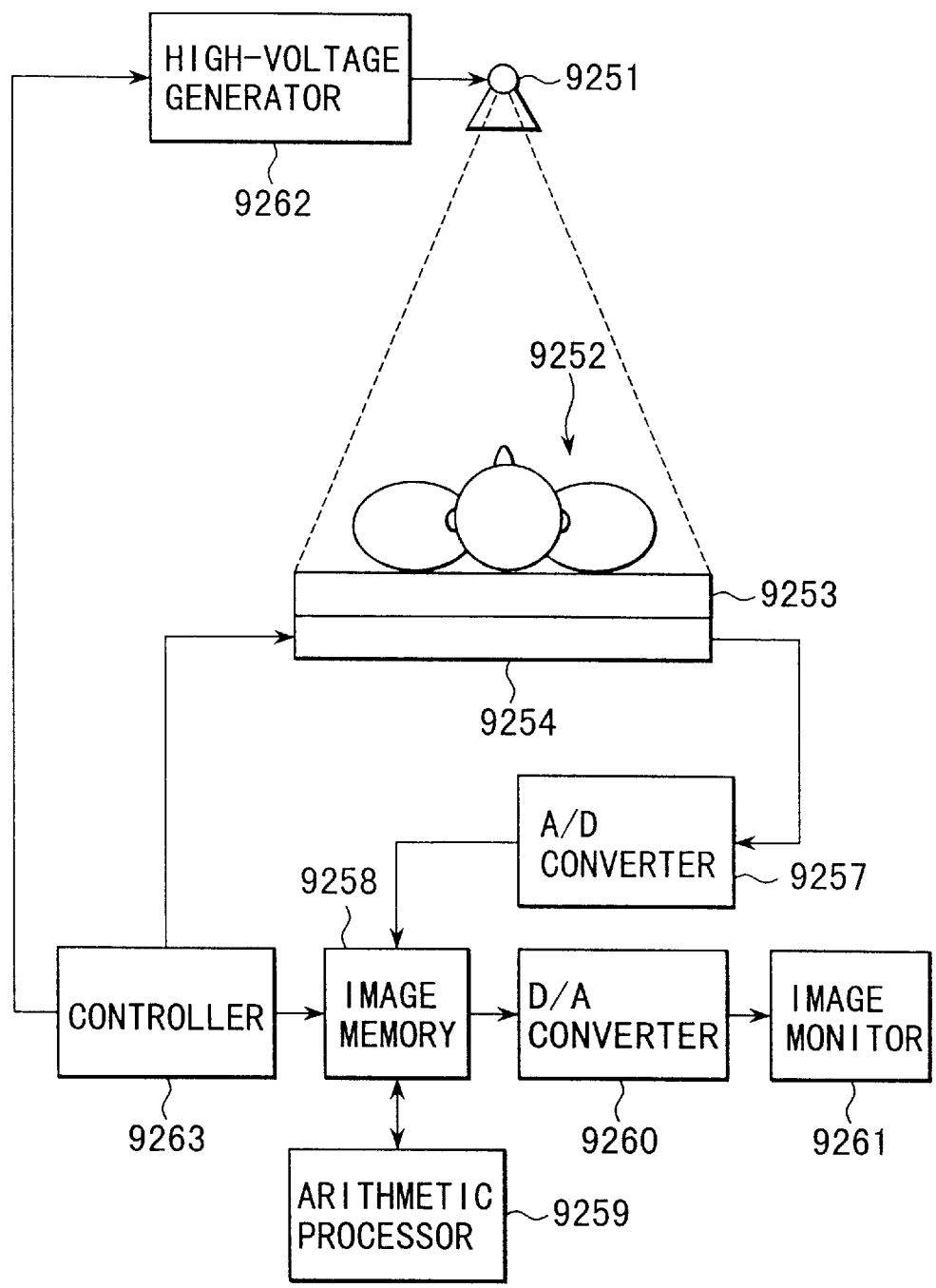
FIG. 6 is a block diagram showing the whole arrangement of an X-ray diagnostic apparatus using the conventional X-ray semiconductor detector.
Figure 7:
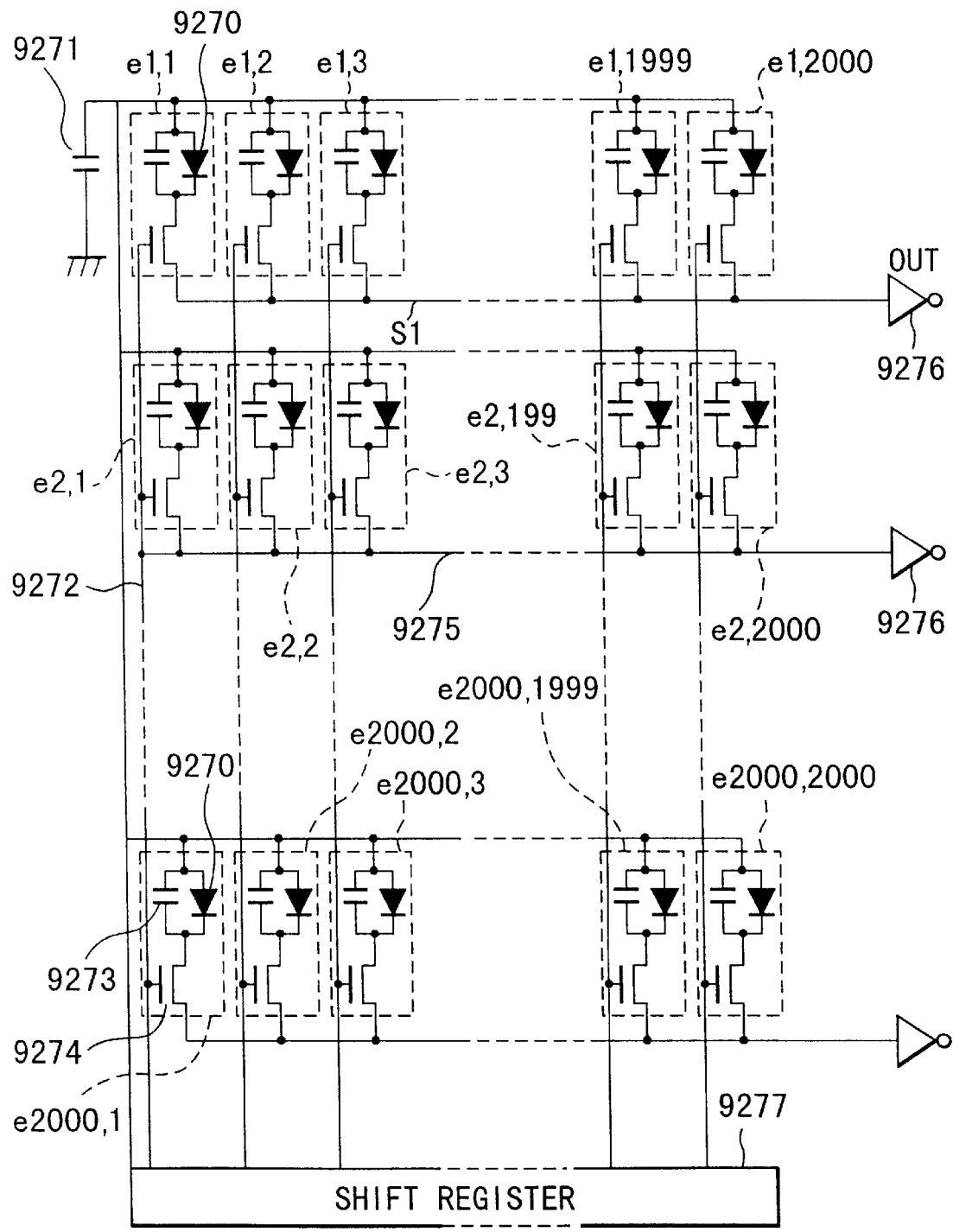
FIG. 7 is an equivalent circuit diagram showing the X-ray semiconductor detector in FIG. 6.
Figure 11:
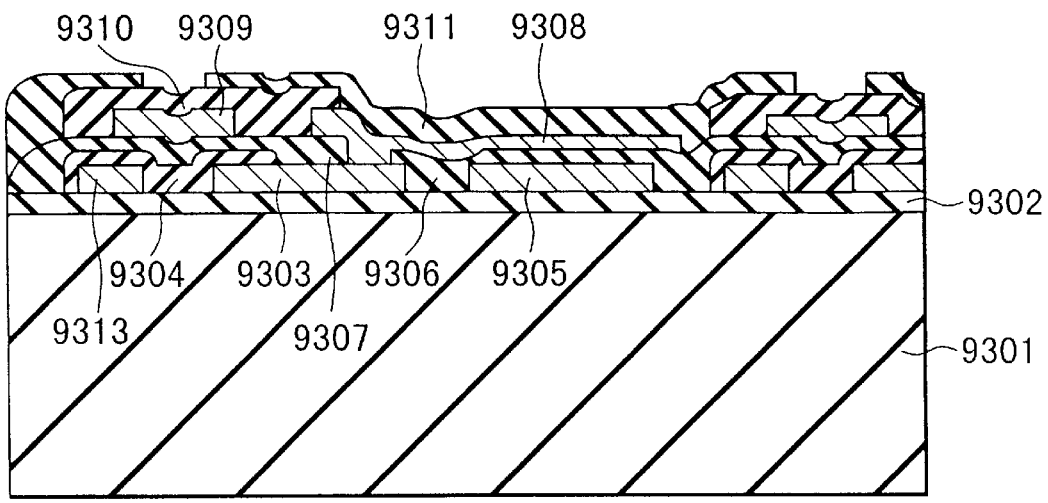
FIG. 11 is a sectional view showing the TFT portion of a conventional X-ray semiconductor detector.
Figure 12:
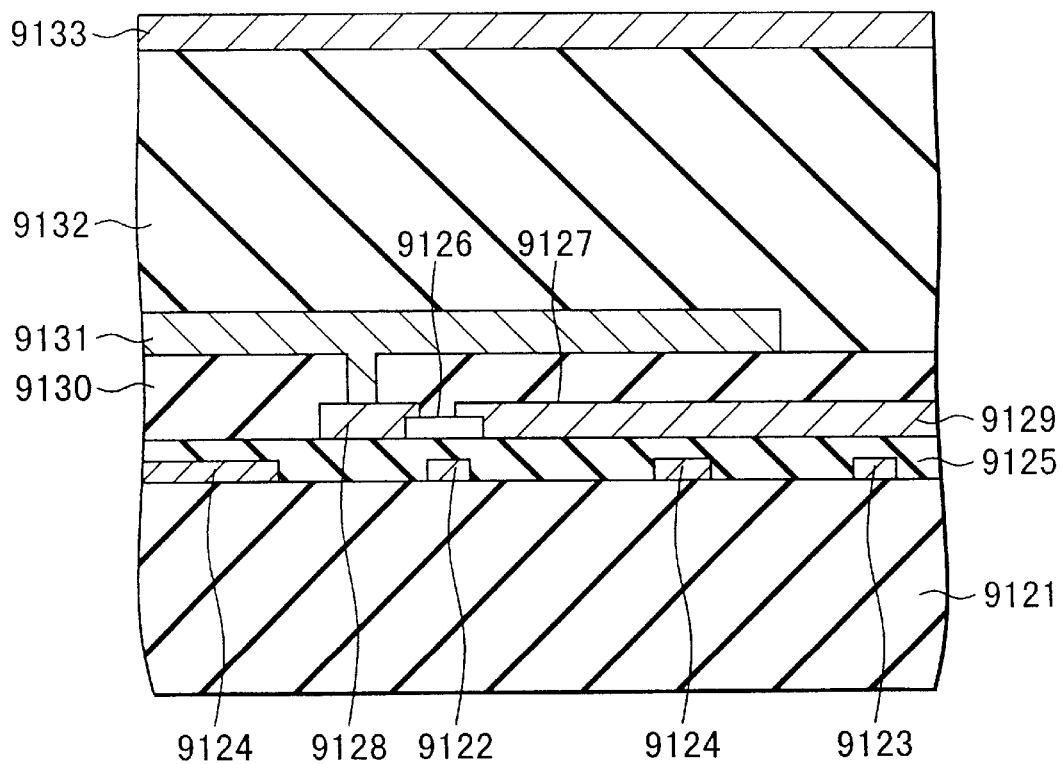
FIG. 12 is a sectional view showing one pixel of a conventional X-ray semiconductor detector.
Figure 13:
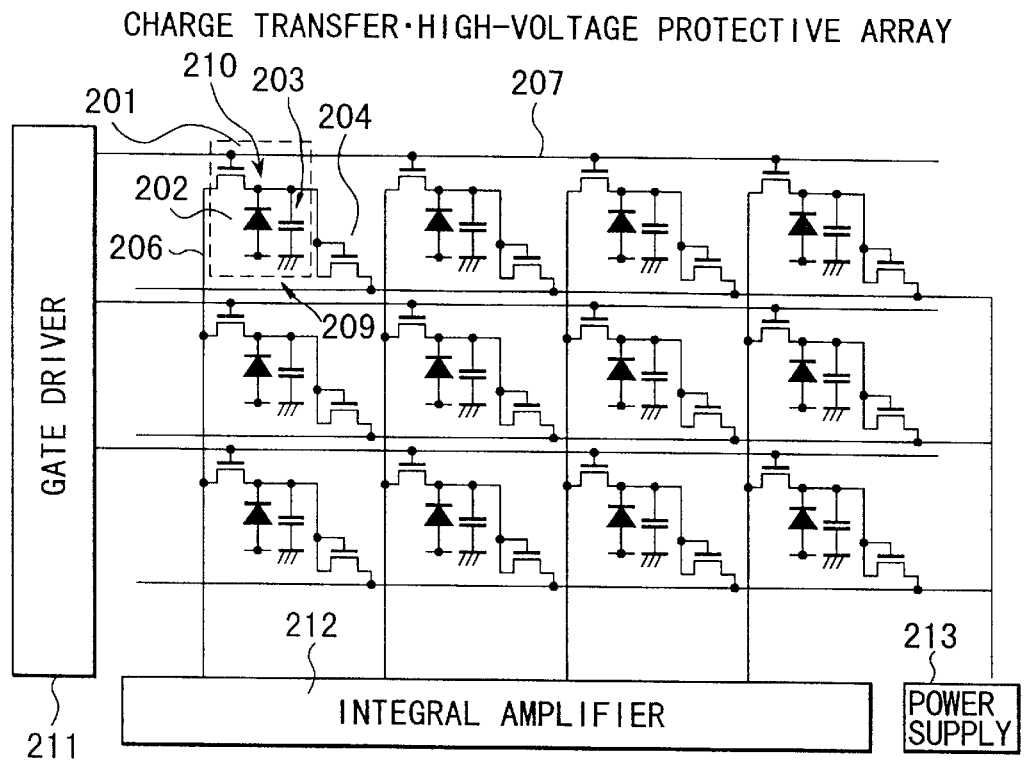
FIG. 13 is an equivalent circuit diagram showing an X-ray semiconductor detector according to Embodiment 1 of the present invention.

FIG. 13 is an equivalent circuit diagram showing an X-ray semiconductor detector according to Embodiment 1 of the present invention. Embodiment 1 will exemplify an X-ray semiconductor detector of a direction conversion type in which an X-ray is directly converted into a signal. A pixel 210 is made up of an X-ray/charge conversion film 202, which is a photoconductor, of, e.g., a-Se for directly converting an X-ray into charges, an storage capacitor (pixel capacitor) 203 for storing charges generated in the X-ray/charge conversion film 202, a signal read amorphous silicon thin-film transistor (to be referred to as an a-Si TFT) 201, and a protective diode 204 for removing excessive charges stored in the storage capacitor 203. For storage capacitor, any kind of capacitors connected to source electrode of switching TFT can be used, such as TFT source/gate electrodes overlap capacitance or other floating capacitors. And an intentional storage capacitor can be removed and only floating capacitors can be used as a storage capacitor. Many pixels 210 are regularly arrayed in a matrix. The structure in which many pixels 210 are arrayed will be called a TFT array hereinafter.

The X-ray/charge conversion film 202 receives a high voltage from the power supply. The signal read a-Si TFT 201 is connected to a signal read line (signal line) 206 and a gate line (scanning line) 207. The ON/OFF states of the a-Si TFT 201 is controlled by a gate electrode voltage applied from a gate electrode driver 211 via the gate line 207. Signal charges generated in the X-ray/charge conversion film 202 by an incident X-ray and stored in the storage capacitor 203 are transferred to and amplified by an integral amplifier 212 via the signal read line 206.

The protective thin-film transistor (to be referred to as a protective diode) 204 functioning as a protective diode for removing excessive charges stored in the storage capacitor 203 receives a bias voltage from a power supply 213 via a power supply line (bias line) 209. If the storage charges in the storage capacitor 203 exceed the threshold, excessive charges flow from the storage capacitor 203 via the protective diode 204 and power supply line 209. This prevents dielectric breakdown of the signal read TFT 201. The bias potential of the power supply line 209 from the power supply 213 can adjust a voltage (threshold voltage) at which charges start flowing from the protective diode 204. Charges stored in the storage capacitor 203 are output via the turned-on TFT 201, signal read line 206, and integral amplifier 212.

Figure 14:
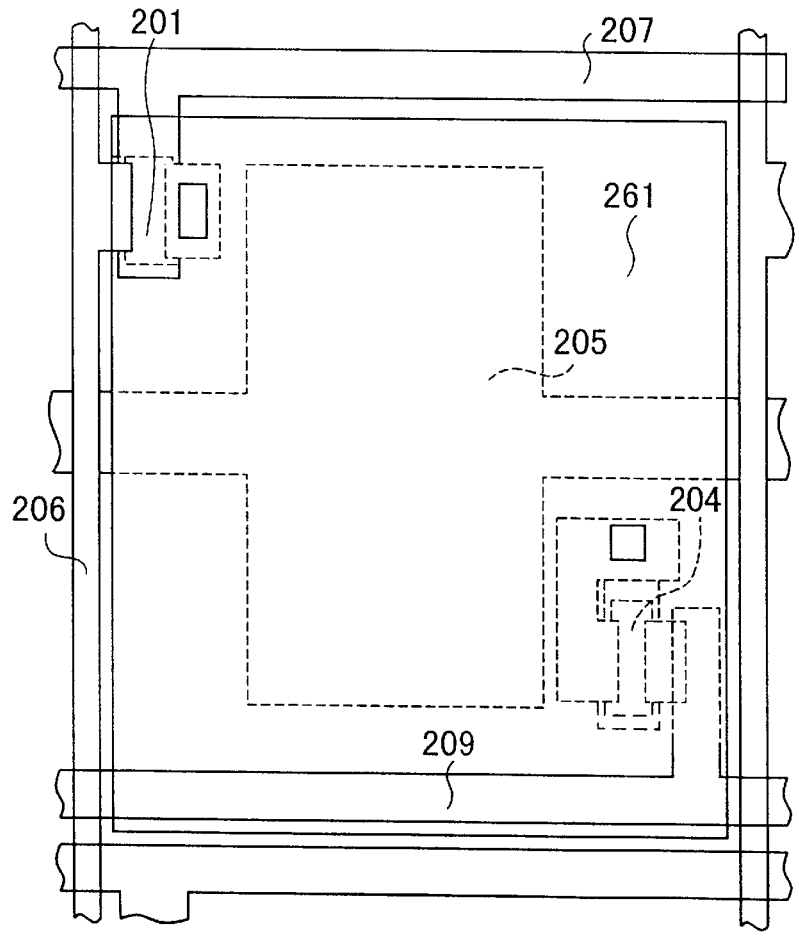
FIG. 14 is a plan view showing one pixel of the X-ray semiconductor detector in FIG. 13.

As shown in FIG. 14, one pixel is made up of the a-Si TFT 201, a pixel electrode 261, the protective diode 204, the signal read line 206, the gate line 207, a storage capacitor line (auxiliary capacitor electrode) 205, and the power supply line 209 of the protective diode. The storage capacitor 203 is made up of the pixel electrode 261 and the storage capacitor line (auxiliary capacitor electrode) 205. The X-ray/charge conversion film 202 is sandwiched between the pixel electrode 261 and storage capacitor line 205.

One feature of Embodiment 1 is that the protective diode 204 is formed below the X-ray/charge conversion film 202, and the pixel electrode 261, i.e., storage capacitor 203. This feature can increase the pixel density, in other words, can improve the spatial resolution.

Figure 15:
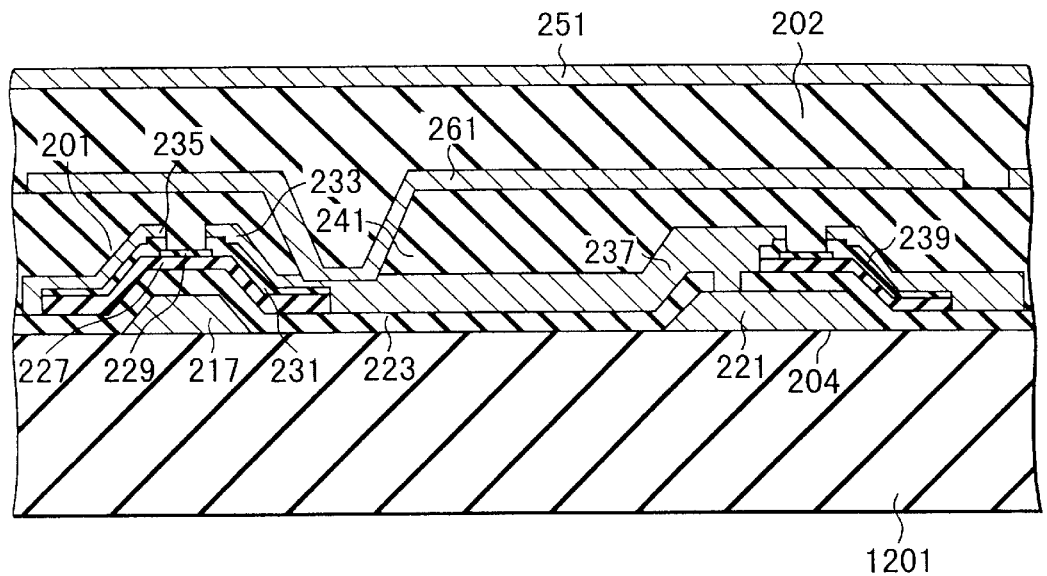
FIG. 15 is a sectional view showing one pixel of the X-ray semiconductor detector in FIG. 13.

As shown in the sectional view of FIG. 15, the a-Si TFT 201 and protective diode 204 are formed on a glass substrate 1201. Gate electrodes 217 and 221 of the signal read a-Si TFT 201 and protective diode 204 are made of a metal A17. These gate electrodes 217 and 221 are covered with an insulating film 223. In the a-Si TFT 201, an a-Si film 227 and an etching stopper $SiN_x$ film 229 are formed on the insulating film 223. An $n^+$-type a-Si (N) film 231 is formed on the a-Si film 227 by plasma CVD using a gas mixture of $SiH_4$, $H_2$, and $PH_3$. Source and drain electrodes 233 and 235 of the a-Si TFT 201 are formed from a metal B49 on the $n^+$-type a-Si (N) film 231. The $n^+$-type a-Si (N) film 231 is etched using the metal B49 as a mask. The gate line 207, the power supply line 209, an extraction pad 219, a voltage application line 225, and source and drain electrodes 237 and 239 of the protective diode 204 are also made of the metal B49.

The pixel electrode 261 is formed on the a-Si TFT 201 and protective diode 204 via an insulating film 241. The X-ray/charge conversion film 202 is formed on the pixel electrode 261. A common electrode 251 is formed from a metal C51 on the X-ray/charge conversion film 202.

A method of manufacturing this X-ray semiconductor detector will be explained with reference to FIG. 15. MoTa, Ta, TaN, Ta/$TaN_x$, Al, an Al alloy, Cu, MoW, or the like is deposited to a thickness of 3,000 Å on the glass substrate 1201, and etched into the patterns of the gate electrodes 217 and 221. $SiO_x$ is deposited to a thickness of 3,000 Å by plasma CVD to form an insulating film 223. An undoped a-Si film 227 is formed to a thickness of 1,000 Å on the insulating film 223. $SiN_x$ is deposited to a thickness of 2,000 Å on the a-Si film 227 to form a stopper film 229.

The stopper film 229 of the a-Si TFT 201 is patterned by backside exposure in accordance with the gate electrode 217. An $n^+$-a-Si film 231 is deposited to a thickness of 500 Å, and then $n^+$-type a-Si and a-Si for the a-Si TFT 201 are etched into an a-Si island. $SiN_x$/$SiO_x$ at the contact is etched to form a contact hole. Mo/Al/Mo or Mo is sputtered to a thickness of 500 Å/3,500 Å/500 Å or 2,000 Å on the substrate, thereby forming a signal read line 206.

$SiN_x$ is deposited to a thickness of 2,000 Å on the a-Si TFT 201 and protective diode 204, and photopatternable BCB is further deposited to form an insulating film 241. The insulating film 241 has a thickness of 1 to 3 $\mu$m, and preferably 2 $\mu$m.

After contact holes to the source electrodes 233 and 237 of the a-Si TFT 201 and protective diode 204 are formed, a pixel electrode 261 is formed from ITO to a thickness of 1,000 Å. At this time, the pixel electrode 261 is formed to cover the whole protective diode 204. A p-i-n Se layer is deposited to form an X-ray/charge conversion film 202. A common electrode 251 is formed from Al to a thickness of 1,000 Å. The resultant pixel is finally connected to a peripheral driving circuit.

Figure 16:
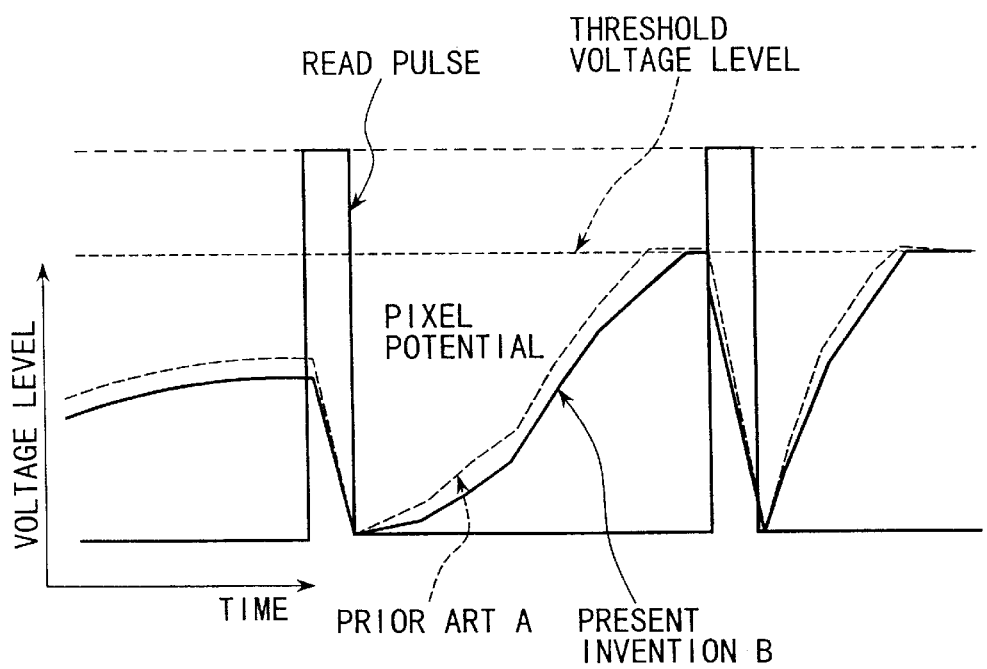
FIG. 16 is a graph showing the time curve of the pixel potential in the X-ray semiconductor detector according to Embodiment 1.

FIG. 16 shows the time curve of the pixel potential. Time curve B represents the present invention, and time curve A represents the prior art. Upon application of a read pulse, the a-Si TFT 201 is turned on to transfer charges stored in the storage capacitor 203 to the integral amplifier 212. Then, the pixel voltage drops. When the application of the read pulse stops to turn off the a-Si TFT 201, charges are stored in the storage capacitor 203. At this time, an incident X-ray reduces the resistance of the X-ray/charge conversion film 202 to make the pixel potential closer to a voltage (5 kV) applied to the common electrode 251 on the X-ray/charge conversion film 202. If the pixel potential exceeds the threshold voltage (10V) of the protective diode 204, the protective diode 204 is turned on to flow charges. If the pixel potential is lower than the threshold voltage, the protective diode 204 is turned off to raise the pixel potential. The pixel potential stabilizes at a value lower than the threshold voltage by the ON/OFF state of the protective diode 204.

If the insulating film 241 between the pixel electrode 261 and protective diode 204 is thin and the capacitance between the electrode 261 and a-Si is large, capacitive coupling occurs between the pixel electrode 261 and the a-Si film of the protective diode 204. Therefore the protective diode 204 is set to the "on" state, a leak current generates, and charges are supplied into the capacitor.

In this case, as shown in FIG. 16, the pixel potential rises excessively close to the threshold voltage level to cause errors. In the present invention, since the insulating film 241 is as relatively thick as 1 to 3 μm, and preferably 2 μm, this capacitive coupling can be prevented to hold an accurate potential. To the contrary, when the insulating film between the pixel electrode 261 and protective diode 204 is thin or an insulating film having a high permittivity (5 or more) is used, even if the light intensity is lower than the white level, an image becomes whitish by charges supplied due to an off-current, and the dynamic range becomes small to fail to display an accurate image.

The same results were obtained with other protective circuits. FIG. 17 shows a series protective diode, and FIG. 18 shows a current-controlled protective diode. In both FIGS. 17 and 18, the same effects can be realized.

In Embodiment 1, the protective diode 204 is arranged below the storage capacitor, i.e., pixel electrode 261, which also works as the top electrode of a storage capacitor. If the protective diode 204 is arranged between adjacent pixel electrodes 261, dielectric breakdown occurs. In direct conversion, a high voltage of about 5 to 10 kV is applied to the common electrode 251 on the X-ray/charge conversion film 202. This high voltage is divided by the capacitances of the 500-μm thick X-ray/charge conversion film 202, 2-μm thick insulating film 241, and 3,000-Å thick gate electrode oxide film. A high voltage around 130V is applied to the drain and gate electrodes of the protective diode 204 to cause dielectric breakdown of the insulating film of the protective diode 204 or vary Vth of the a-Si TFT 201, resulting in poor characteristics. If the resistance of the X-ray/charge conversion film is decreased by an X-ray, most of the high voltage is applied to the drain electrode of the protective diode to apply an excessive voltage between the drain and gate electrodes, causing dielectric breakdown of the insulating film.

To the contrary, when the protective diode 204 is formed below the pixel electrode 261, like Embodiment 1, no high voltage is applied to the protective diode 204 because it is electrostatically shielded by the pixel electrode 261.

The entire structure or channel portion of the protective diode 204 is preferably formed below the pixel electrode 261. When the pixel includes a plurality of protective diodes 204, at least one suffices to be arranged below the pixel electrode 261. When the pixel includes a plurality of insulating films 241, the protective diode 204 is preferably arranged below the lowermost insulating film.

The power supply line of the protective diode 204 may also be arranged below the pixel electrode 261 to prevent an uneven display caused by dielectric breakdown and changes in bias voltage by a high voltage to the common electrode 251 on the X-ray/charge conversion film 202 and the pixel electrode 261.

Examples of the metal A47 are Ti, Cr, Ta, Mo, MoW, MoTa, TaN, Al, ITO, an Al alloy, and a stacked structure of these metals. Since the metal A47 is used for the gate line, MoW and MoTa are preferable because they allow taper-etching the gate electrode of the TFT so as to prevent the insulating film 223 stacked on the gate electrode from poor step coverage.

Examples of the metals B'48 and B49 are Ti, Cr, Ta, Mo, MoW, MoTa, Al, ITO, an Al alloy, TaN, and a stacked structure of these metals. A preferable example is MoAlMo. Since the metal B49 is used for the signal read line, the resistance is desirably low, and thus Al, an Al-stacked structure, an Al alloy, and the like are preferable. When the metal B'48 is used, the metal B'48 must be free from the influence of etching of the metal B49, or an etching method which does not influence the metal B'48 must be adopted.

Examples of the metal C51 forming the common electrode 251 are Ti, Cr, Ta, Mo, MoW, MoTa, Al, ITO, an Al alloy, and a stacked structure of these metals. Preferable examples are InZnO or amorphous ITO because of easy etching.

Examples of the material for the insulating film 223 are $SiO_2$, $SiN_x$, $SiO_xN_y$, and a stacked structure of these metals.

Examples of the material for the insulating film 241 are an inorganic insulating film such as an $SiN_x$ or $SiO_2$ film, an organic insulating film such as polyimides (∈: 3.3, dielectric resistance: 300 V/mm), a BCB film (∈: 2.7, dielectric resistance: 400 V/mm)), an acrylic photosensitive resin Optomer PC film ∈: 3.2), resist, or a black resist, and a stacked structure of these films. A fluorocarbow plastics such as Saitop is effective because of a small relative dielectric constant (2.1). When the protective diode is formed below the pixel electrode, the insulating film 241 suffices to be 2 to 10 μm in thickness. To eliminate the influence of the pixel potential on the protective diode, a voltage applied to the protective diode must be about ⅒ the pixel potential (about 10V). For this purpose, when the insulating film 241 is made of an organic resin, the thickness must be 2 μm or more, and preferably 4 μm or more. Since a thick insulating film 241 may cause poor step coverage at the step of the pixel electrode, the thickness is preferably 15 μm or less. When the protective diode is formed outside the pixel electrode or between pixel electrodes, the insulating film 241 must have a thickness of about 10 to 15 μm.

Examples of the material for the X-ray/charge conversion film 202 are an a-Se, a-Si, a-Te, and $PbI_2$.

The above-described a-Si TFT 201 is of an etching stopper type in the inverted staggered structure, but may be a back-channel cut type in the inverted staggered structure. The etching stopper type TFT hardly varies in TFT characteristics and is suitable for a large-size array because the channel is protected in etching the TFT channel. The back-channel cut type TFT realizes a low manufacturing cost because the number of process steps is smaller than in the etching stopper type TFT.

Si for forming the a-Si TFT 201 is a-Si (amorphous silicon). Instead, the a-Si TFT 201 can be formed from poly-Si (polysilicon) to downsize the TFT and widen the effective pixel area. Further, since a peripheral circuit can be formed on the same glass substrate, the manufacturing cost including the cost of the peripheral circuit can be reduced.

According to Embodiment 1, since a high-voltage protective diode is arranged below the pixel electrode, and they are isolated by a relatively thick insulating film, signal errors of the pixel potential can be prevented or reduced. The X-ray semiconductor detector becomes more resistant to noise, and the image quality can be improved. Especially in the medical fields, even if the X-ray intensity is weakened to reduce the influence of radiation on the human body, a high-quality image can be obtained.

(Embodiment 2; Power Supply Line (Bias Line) of Protective Diode is Formed Parallel to Signal Read Line)

FIG. 19 is a plan view showing an X-ray semiconductor detector according to Embodiment 2 of the present invention. As shown in FIG. 19, a pixel is made up of an amorphous thin-film transistor (a-Si TFT) 1, a pixel electrode 3, a protective diode 5, a signal read line (signal line) 7, a gate line (scanning line) 9, an auxiliary electrode 11, and a power supply line (bias line) 13 of the protective diode 5. In FIG. 19, an insulating film between the pixel electrode 3 and protective diode 5, a common electrode, an X-ray/charge conversion film, and the like have the same arrangement and structure as in Embodiment 1.

One feature of Embodiment 2 is that the power supply line (bias line) 13 of the protective diode 5 and the signal read line 7 are formed parallel so as not to overlap each other even partially, thereby eliminating the parasitic capacitance between the power supply line 13 of the protective diode 5 and the signal read line 7.

As shown in FIG. 19, an storage capacitor 15 is made of up the pixel electrode 3 and auxiliary electrode 11. Charges generated in the X-ray/charge conversion film by an incident X-ray are stored in the storage capacitor 15. When the voltage reaches a predetermined value which does not cause dielectric breakdown of the a-Si TFT 1, charges flow outside the pixel from the protective diode 5 to prevent application of a high voltage to the a-Si TFT 1 and storage capacitor 15. The charge flow path at this time is the power supply line 13, and the charge flow start voltage of the protective diode 5 can be changed by the potential of the power supply line 13. By scanning the gate line 9, charges stored in pixels turn on the a-Si TFTS 1 of pixels on the gate line and flow to the signal read line 7. The flowing charges are transferred to an amplifier (not shown).

Figure 20A:
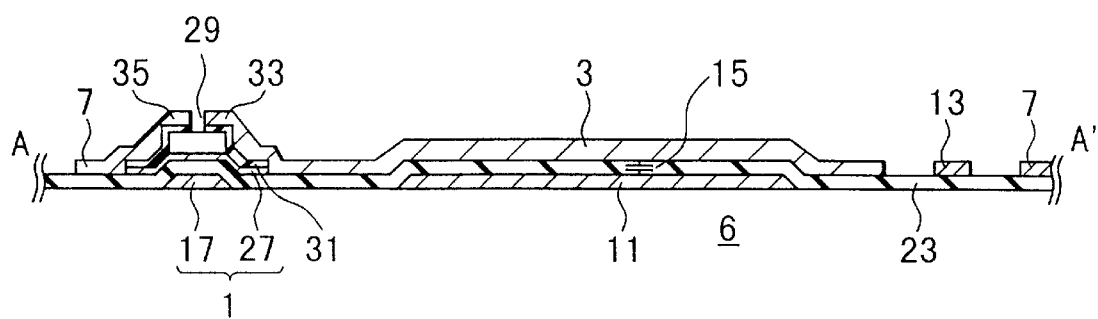
FIG. 20A is a sectional view taken along the line A–A' in FIG. 19.
Figure 20B:
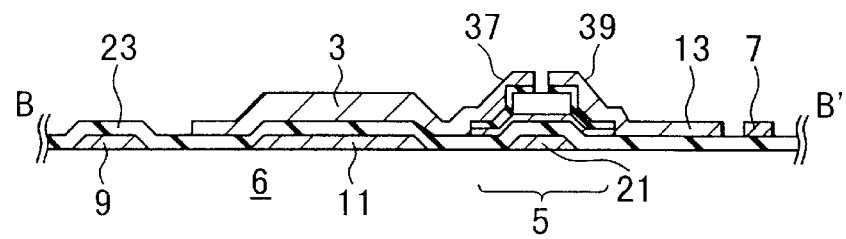
FIG. 20B is a sectional view taken along the line B–B' in FIG. 19.

FIG. 20A is a sectional view taken along the line A–A' in FIG. 19, and FIG. 20B is a sectional view taken along the line B–B' in FIG. 19. A gate electrode 17 of the a-Si TFT 1, the gate line 9, the auxiliary electrode 11, and a gate electrode 21 of the protective diode 5 are formed on a glass substrate 6. An insulating film 23 is formed on the obtained structure though the insulating film 23 is removed from the through hole of the protective diode 5. The pixel electrode 3 is formed on the insulating film 23 within a pixel except for the a-Si TFT 1 and protective diode 5. In the a-Si TFT 1 and protective diode 5, an a-Si film 27, an etching stopper $SiN_x$ film 29, and an $n^+$-type a-Si film 31 are formed on the insulating film 23. Source and drain electrodes 33 and 35 of the a-Si TFT 1 are formed from a metal B49 on the obtained structure. The signal read line 7, the power supply line 13 for the protective diode, an extraction pad, a voltage application line, source and drain electrodes 37 and 39 of the protective diode 5, and the like are also made of the metal B49.

The pixel electrode 3 can be formed at the same time. In this case, the source electrode 33 of the a-Si TFT 1 on the pixel electrode side, the source electrode 37 of the protective diode 5 on the pixel electrode side, and the pixel electrode 3 are integrally formed. With this structure, the TFT array is complete. An insulating film, an X-ray/charge conversion film, and a common electrode made of a metal C51 are formed on the a-Si TFT 1 and protective diode 5.

In FIG. 19, one a-Si TFT 1 is used as the protective diode. Alternatively, the protective diode 5 may be formed by series-connecting two or more a-Si TFTs 1 to suppress the leakage current from the protective diode 5, or the leakage current from the protective diode 5 may be reduced by any means.

Although not shown, an interlevel insulating film may be formed on the TFT array described in Embodiment 1, and a top pixel electrode in contact with and equal in potential to the pixel electrode 3 via the through hole of the interlevel insulating film may be formed. With this structure, the opening rate (the occupation rate of the pixel electrode in one pixel) which is decreased by increases in numbers of power supply lines and the like can always be kept high regardless of the numbers of power supply lines and TFTs in one pixel.

Examples of the metal A47 are Ti, Cr, Ta, Mo, MoW, MoTa, Al, ITO, an Al alloy, and a stacked structure of these metals. Since the metal A47 is used for the gate line, MoW and MoTa are preferable because they allow taper-etching the gate electrode of the TFT so as to prevent the insulating film 23 stacked on the gate electrode from poor step coverage. An Al alloy can form a low-resistance gate line and is more preferable for a large-size detector because the Al alloy can prevent a hillock formed in a high-temperature step when only Al is used.

Examples of the metal B'48 are Ti, Cr, Ta, Mo, MoW, MoTa, Al, ITO, an Al alloy, and a stacked structure of these metals.

Examples of the metal B49 are Ti, Cr, Ta, Mo, MoW, MoTa, Al, ITO, an Al alloy, and a stacked structure of these metals. Since the metal B49 is used for the signal read line, the resistance is desirably low, and thus Al, an Al-stacked structure, an Al alloy, and the like are preferable. When the metal B'48 is used, the metal B'48 must be free from the influence of etching of the metal B49, or an etching method which does not influence the metal B'48 must be adopted.

Examples of the material for the top pixel electrode are Ti, Cr, Ta, Mo, MoW, MoTa, Al, ITO, and a stacked structure of these metals. The material must be one which does not influence the metal B49 in etching the top pixel electrode, or an etching method which does not influence the metal B49 must be adopted.

Examples of the metal C51 forming the common electrode are Ti, Cr, Ta, Mo, MoW, MoTa, Al, ITO, an Al alloy, and a stacked structure of these metals.

Examples of the material for the insulating film 23 are $SiO_2$, $SiN_x$, $SiO_xN_y$, and a stacked structure of these metals.

Examples of the material for the insulating film between the pixel electrode and protective diode 5 are an inorganic insulating film such as an $SiN_x$ or $SiO_2$ film, and an organic insulating film such as polyimides, a BCB film, an HRC film, or a black resist.

Examples of the material for the interlevel insulating film are an inorganic insulating film such as an $SiN_x$ or $SiO_2$ film, and an organic insulating film such as polyimides, a BCB film, an HRC film, or a black resist. Examples of the material for the X-ray/charge conversion film are an a-Se and a-Si.

The above-described a-Si TFT 1 is of an etching stopper type in the inverted staggered structure, but may be a back-channel cut type in the inverted staggered structure. The etching stopper type TFT hardly varies in TFT characteristics and is suitable for a large-size array because the channel is protected in etching of the channel of the TFT. The back-channel cut type TFT realizes a low manufacturing cost because the number of steps is smaller than in the etching stopper type TFT.

Si for forming the TFT 1 is a-Si (amorphous silicon). Instead, the TFT 1 can be formed from poly-Si (polysilicon) to downsize the TFT and widen the effective pixel area. Further, since a peripheral circuit can be formed on the same glass substrate, the manufacturing cost including the cost of the peripheral circuit can be reduced.

Embodiment 2 has exemplified the scheme of reading charges stored in the pixel using the ON/OFF state of the TFT. This embodiment is more effective for a non-destructive read scheme using a source electrode follower principle because the numbers of TFTs and power supply lines in the pixel are large.

According to the present invention, the power supply line of the protective diode and the signal read line are formed parallel so as not to overlap each other even partially, thereby eliminating the parasitic capacitance between the power supply line of the protective diode and the signal read line.

(Embodiment 3-1; a-Si Film is Arranged at Intersection of Gate Line (Scanning Line) of Signal Read a-Si TFT and Signal Read Line (Signal Line))

Figure 21:
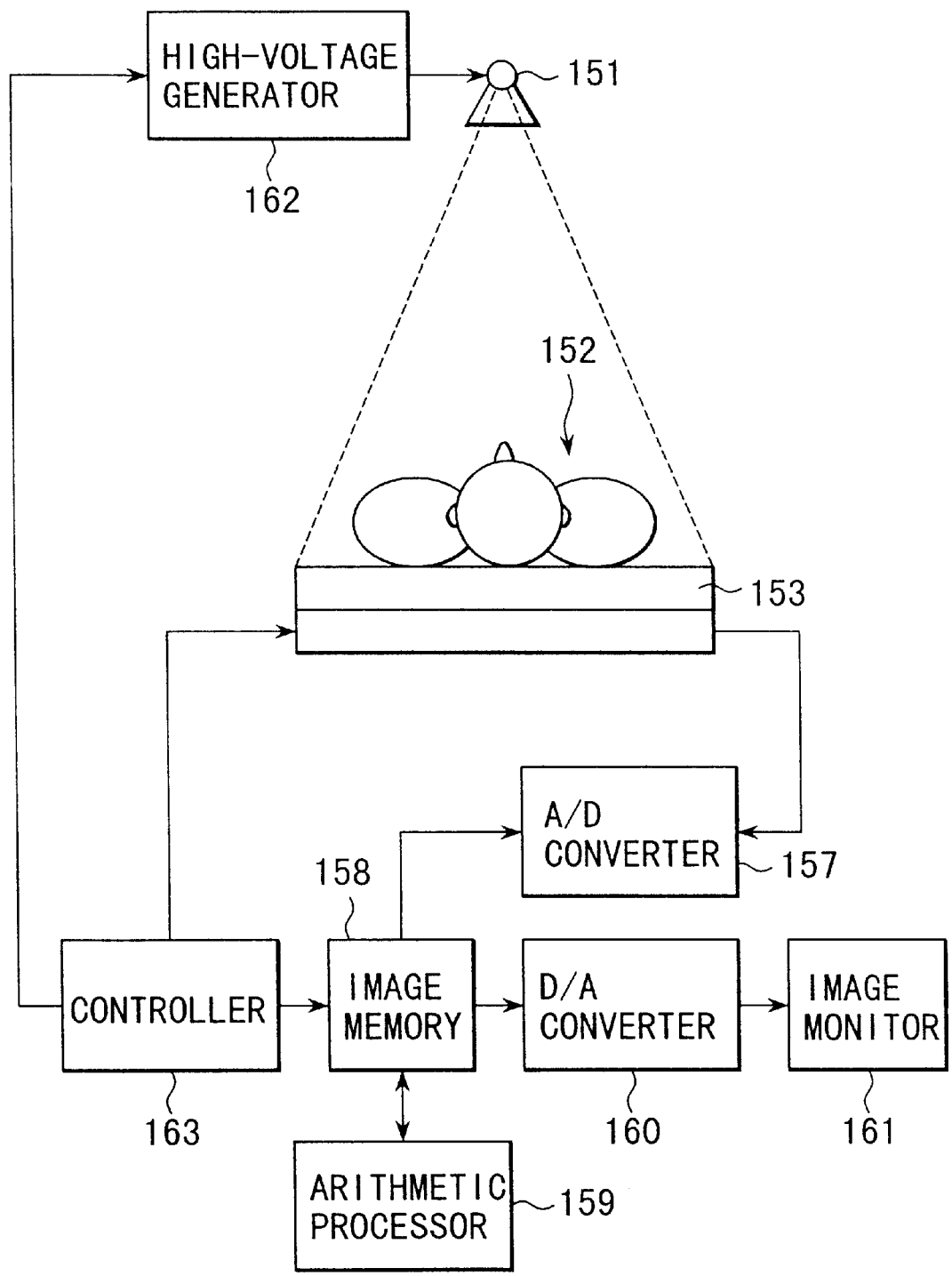
FIG. 21 is a block diagram showing the whole arrangement of a medical X-ray diagnostic apparatus to which an X-ray semiconductor detector according to Embodiment 3-1 is applied.

FIG. 21 is a view showing the whole arrangement of an X-ray diagnostic apparatus to which an X-ray semiconductor detector according to Embodiment 3-1 is applied.

Figure 22:
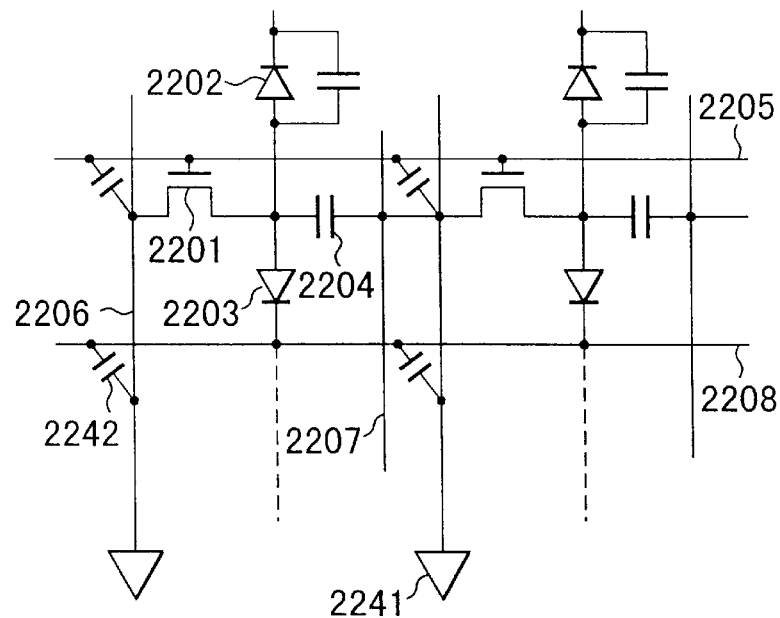
FIG. 22 is an equivalent circuit diagram showing conventional problems.

As shown in FIG. 22, charges stored in an storage capacitor 2204 are output to a detection amplifier 2241 via an a-Si TFT 2201 and a signal read line 2206. Since the detection amplifier 2241 has a high-resistance input, even if noise is weak, the S/N ratio may greatly decrease to seriously degrade the image quality.

Noise is generated at the intersection of a gate line (scanning line) 2205 of the signal read a-Si TFT 2201 and the signal read line 2206. The gate and signal read lines 2205 and 2206 cross each other via an insulating film. At this intersection, a parasitic capacitance 2242 is generated. If the potential of the gate line 2205 varies, charges are generated in the parasitic capacitance 2242 at the intersection. The charges are transferred together with signal charges to the detection amplifier 2241 via the signal read line 2206.

One feature of Embodiment 3-1 is that a series-connected capacitor structure is formed by sandwiching an a-Si film together with the insulating film between the gate and signal read lines 2205 and 2206 at the intersection of the gate line 2205 of the a-Si TFT 2201 and the signal read line 2206. This can substantially halve the parasitic capacitance to double the S/N ratio, compared to the conventional S/N ratio.

Figure 23:
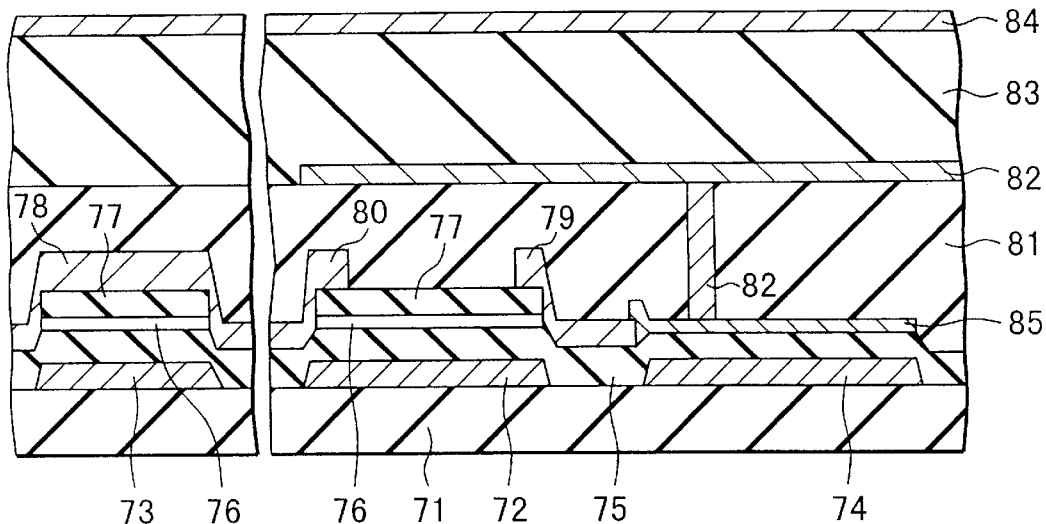
FIG. 23 is a sectional view showing the X-ray semiconductor detector according to Embodiment 3-1.

FIG. 23 is a sectional view showing the main part of the X-ray semiconductor detector according to Embodiment 3-1. A refractory metal such as MoTa or MoW is deposited on a silicon wafer or glass substrate 71 and patterned into a gate electrode 72, a gate line 73, and an auxiliary electrode (storage capacitor electrode) 74.

$SiO_x$ or $SiN_x$ is deposited on the gate electrode 72, gate line 73, and auxiliary electrode 74 to form an insulating film 75. a-Si is deposited on the insulating film 75 to form an a-Si layer 76. $SiN_x$ is deposited on the a-Si layer 76 to form an $SiN_x$ layer 77. The a-Si and $SiN_x$ layers 76 and 77 are patterned.

Although the a-Si and etching stopper insulating films 76 and 77 are generally formed on only the TFT, they are also formed at the intersection of the gate line 73 and a signal read line 78 in addition to the TFT portion in Embodiment 3-1.

Source and drain electrodes 79 and 80 of a TFT and a signal read line 78 are formed from a metal such as Al or Mo. After the signal read line 78 is formed, an organic film 81 is formed, a pixel electrode 82 is formed from a metal such as Al, an Al alloy, or Ti, or ITO on the organic film 81, and an X-ray/charge conversion film 83 (formed from an a-Se or the like) for converting an X-ray into charges is stacked on the pixel electrode 82. A high-voltage application electrode 84 is finally formed on the X-ray/charge conversion film 83.

Figure 24A:
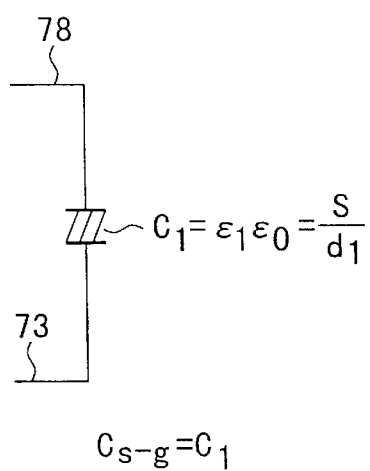
FIG. 24A is a view showing the total capacitance at the intersection of the signal read and gate lines according to Embodiment 3-1.
Figure 24B:
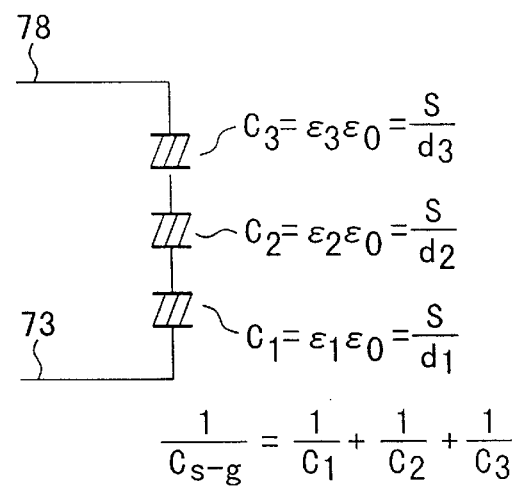
FIG. 24B is a view showing the total capacitance at the intersection of conventional signal read and gate lines.

As shown in FIG. 24B, a parasitic capacitance $C_{s-g}$ at the intersection of the signal read and gate lines is made by a series-connected structure of a capacitance C1 by the insulating film 75, a capacitance C2 by the a-Si film 76, and a capacitance C3 by the etching stopper insulating film 77. FIG. 24A shows a conventional parasitic capacitance in which the a-Si and insulating films 76 and 77 are not formed on the insulating film 75.

The parasitic capacitance in Embodiment 3-1 will be explained in comparison with the conventional parasitic capacitance. Assume that the gate line is 10 μm in width, the signal read line is 10 μm in width, the intersection of the gate and signal read lines has an area S of 100 μm², and the insulating film 75 has a thickness d1 of 0.3 μm and a relative dielectric constant ∈1 of 5, the a-Si film 76 has a thickness d2 of 0.05 mm and a relative dielectric constant ∈2 of 11, and the etching stopper insulating film 77 has a thickness d3 of 0.3 μm and a relative dielectric constant ∈3 of 6.

A conventional parasitic capacitance C is given by $$C = C1 = \varepsilon 1 \varepsilon 0 S / d1$$
$$= 5 \times 8.854 \times 10^{-12} \times (10 \times 10^{-6})^2 / 0.3 \times 10^{-6}$$
$$= 14.8 [fF]$$

If the number of gate lines is 1,000, the parasitic capacitance is 14.8 pF. That is, if the potential of the gate line varies only 1 mV by the gate electrode driver, charges of 14.8 fC are generated in the signal detection circuit side. Charges stored in the pixel are almost equal in order, and charges from the parasitic capacitance greatly degrade the image quality.

In Embodiment 3-1, since the capacitance C1 by the insulating film 75, the capacitance C2 by the a-Si film 76, and the capacitance C3 by the etching stopper insulating film 77 are series-connected, a parasitic capacitance C' is given by $$C' = C1C2C3 / (C2C3 + C3C1 + C1C2)$$
$$= \varepsilon 1 \varepsilon 2 \varepsilon 3 \varepsilon 0 S / (\varepsilon 2 \varepsilon 3 d1 + \varepsilon 3 \varepsilon 1 d2 + \varepsilon 1 \varepsilon 2 d3)$$
$$= 7.7 [fF]$$

which is almost ½ the conventional parasitic capacitance C.

Accordingly, noise caused by the parasitic capacitance at the intersection of the gate and signal read lines is substantially halved. This means that the dynamic range widens 6 dB. In a field where a high dynamic range is demanded, like an X-ray diagnostic apparatus, the structure described in Embodiment 3-1 is very effective.

The structure in which the a-Si and etching stopper insulating films 76 and 77 are sandwiched together with the insulating film 75 between the signal read and gate lines can be formed by some steps in the TFT manufacturing process, as described above. For this reason, noise can be reduced without any complicated process or high cost.

In Embodiment 3-1, the storage capacitor line 74 is formed on the same layer as the gate line 74 and gate electrode 72, but may be formed on another layer via an insulating film.

(Embodiment 3-2; Gate Line is Made Narrow at Intersection of Gate and Signal Read Lines)

Figure 25:
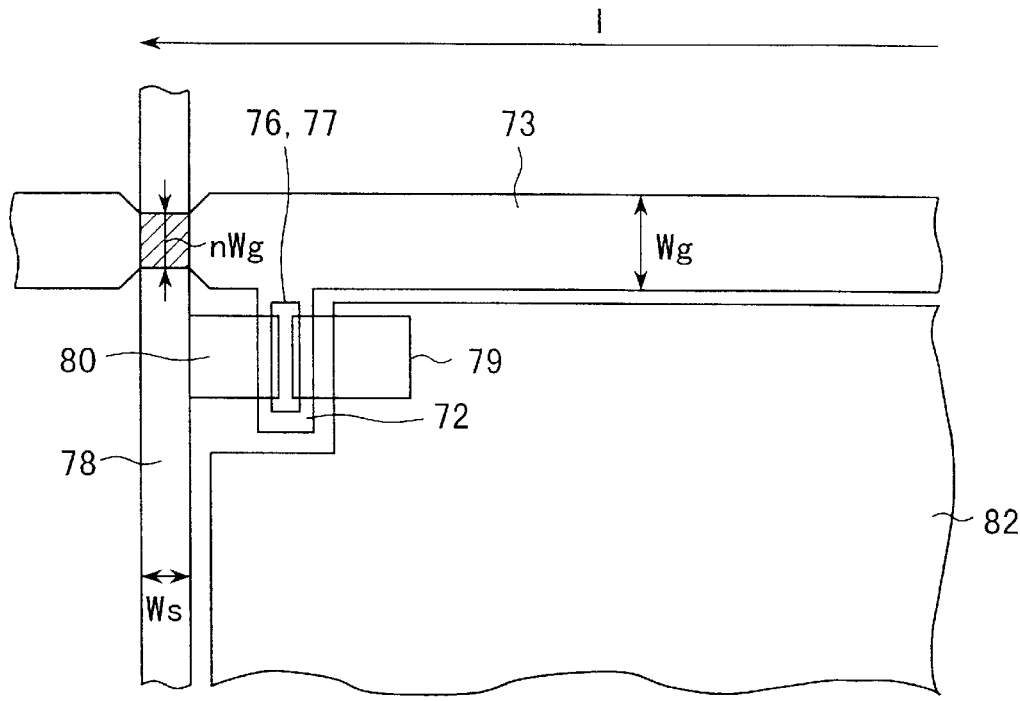
FIG. 25 is a plan view showing part of an X-ray semiconductor detector according to Embodiment 3-2.

FIG. 25 is a plan view showing the TFT array of an X-ray semiconductor detector according to Embodiment 3-2. Note that the same reference numerals as in FIG. 23 denote the same parts, and a detailed description thereof will be omitted. In the following description, a TFT in the pixel is a signal read TFT. Even when the pixel includes a high-voltage protective diode in addition to the signal read a-Si TFT, the signal read a-Si TFT and high-voltage protective diode are formed from the same layer, and this embodiment can be similarly applied.

A gate line 73 is made narrower at the intersection of gate and signal read lines 73 and 78 than at a portion where they do not cross each other. Ws represents the width of the signal read line 78; Wg, the width of the gate line 73 at a portion except for the intersection of the gate and signal read lines 73 and 78; n×Wg (0<n≦1), the width of the gate line 73 at the intersection of the gate and signal read lines 73 and 78.

When the gate line 73 crosses the signal read line 78 with the line width Wg, as in the prior art, the parasitic capacitance $C_{s-g}$ is given by $$C_{s-g} = (\varepsilon \times Ws \times Wg)/D \quad (1)$$

A resistance R is given by $$R = (\rho \times WS)/(Wg \times d) \quad (2)$$

where D is the thickness of an insulating film 75, ρ is the resistivity of the gate line 73, and $\underline{d}$ is the film thickness of the gate line 73.

When the gate line 73 crosses the signal read line 78 with the line width n×Wg (0<n≦1), the parasitic capacitance $C'_{s-g}$ is given by $$C'_{s-g}=(n\times\in\times Ws\times Wg)/D \quad (1')$$

A resistance R' is given by $$R'=(\rho\times Ws)/(n\times Wg\times d) \quad (2')$$

More specifically, the time constant in equations (1) and (2) has the same value as the time constant in equations (1') and (2'). From equation (1'), the parasitic capacitance can be reduced by narrowing the line. Consequently, noise caused by potential variations of the gate line 73 by the gate electrode driver can be reduced to widen the dynamic range of the X-ray diagnostic apparatus.

As described above, the parasitic capacitance and noise can be reduced by narrowing the gate line at the intersection of the gate and signal read lines. As a result, the dynamic range can widen in the X-ray diagnostic apparatus demanded for a wide dynamic range.

Note that the X-ray/charge conversion film can be made of a-Se, a-Te, $PbI_2$, or the like.

(Embodiment 4-1; Storage capacitor line is Arranged Parallel to Signal Read Line)

Figure 26:
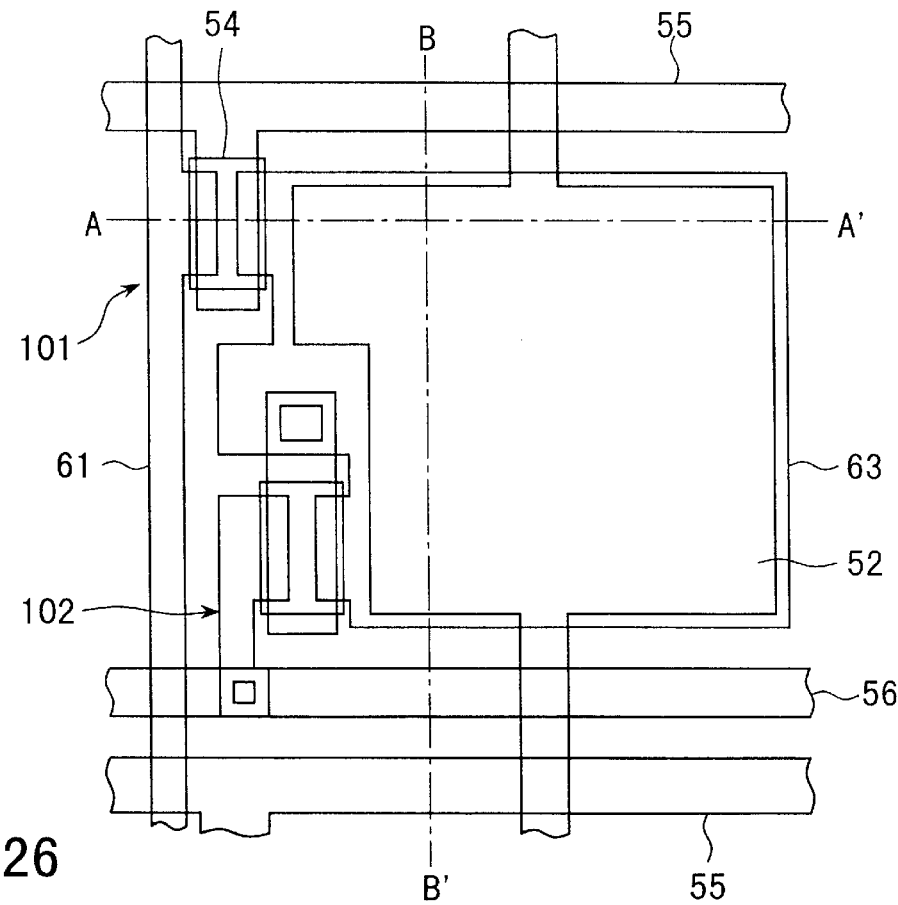
FIG. 26 is a plan view showing one pixel of an X-ray semiconductor detector according to Embodiment 4-1.
Figure 27A:
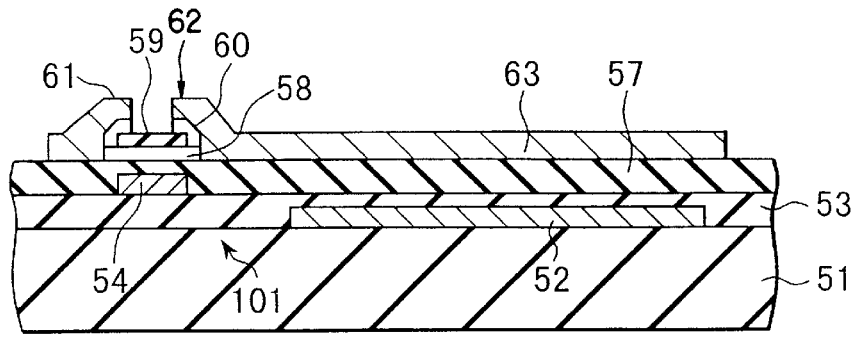
FIG. 27A is a sectional view taken along the line A–A' in FIG. 26.
Figure 27B:
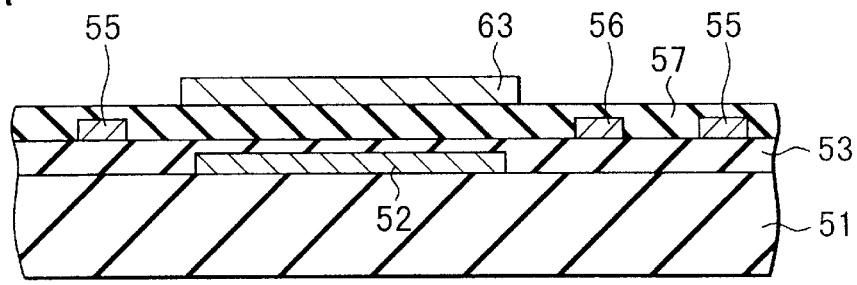
FIG. 27B is a sectional view taken along the line B–B' in FIG. 26.

FIGS. 26, 27A, and 27B show the arrangement of one pixel of an X-ray semiconductor detector according to Embodiment 4-1. FIG. 26 is a plan view, FIG. 27A is a sectional view taken along the line A–A' in FIG. 26, and FIG. 27B is a sectional view taken along the line B–B' in FIG. 26.

One feature of the present invention is that the storage capacitor line (line Cs) of an storage capacitor and a signal read line are formed parallel so as not to overlap each other, thereby suppressing electrical coupling between the capacitor and signal read lines, reducing noise, and increasing the S/N ratio.

FIGS. 26, 27A, and 27B show a read a-Si TFT 101, a protective diode 102, a pixel electrode 63, a signal read line 61, a gate line 55, a storage capacitor line 52, a power supply line (bias line) 56 of the protective diode 102, and the like. In practice, a passivation film, an X-ray/charge conversion film, an electrode of the X-ray/charge conversion film, and the like are formed on the structure in FIGS. 27A and 27B.

The storage capacitor is formed by arranging the pixel electrode 63 and storage capacitor line 52 parallel via an insulating film. The storage capacitor line 52 is defined as an electrode arranged to face the pixel electrode 63 via the insulating film, i.e., an electrode which constitutes the storage capacitor together with the pixel electrode 63 and insulating film. The electrode facing the pixel electrode 63 is coupled along the signal read line 61, and receives a predetermined voltage.

Charges generated in the X-ray/charge conversion film by an incident X-ray are stored in the storage capacitor. When the voltage reaches a predetermined value which does not cause dielectric breakdown of the a-Si TFT 101, charges flow outside the pixel from the protective diode 102 to prevent application of a high voltage to the a-Si TFT 101 and storage capacitor. The charge flow path at this time is the power supply line 56, and the charge flow start voltage of the protective diode 102 can be changed by the potential of the power supply line 56. By scanning the gate line 55, charges stored in pixels turn on the a-Si TFTs 101 of pixels on the gate line and flow to the signal read line 61. The flowing charges are transferred to an amplifier (not shown).

As shown in FIGS. 27A and 27B, the storage capacitor line 52 is formed on a glass substrate 51. An insulating film 53 is formed on the storage capacitor 52 though the insulating film 53 is removed from the contact of a voltage application line (not shown), and the like. A gate electrode 54 of the a-Si TFT 101, the gate electrode of the protective diode 102, a gate line 55, and a power supply line 56 of the protective diode 102 are formed on the insulating film 53. At the same time, an extraction pad (not shown) is formed. An insulating film 57 is formed on the obtained structure though the insulating film is removed from the extraction pad and the through holes of the protective diode 102 and the like.

The pixel electrode 63 is formed on the insulating film 57 in the pixel except for the a-Si TFT 101 and protective diode 102. In the a-Si TFT 101, an a-Si film 58, an etching stopper silicon nitride film 59, an n⁺-type a-Si film 60 are formed on the insulating film 57. Source and drain electrodes 62 and 61 are formed on the n⁺-type a-Si film 60. (The protective diode 102 also has the same structure.) Simultaneously when the source and drain electrodes are formed, the pixel electrode 63, signal read line 61, extraction pad (not shown), voltage application line (not shown), and the like are formed from the metal used for the source and drain electrodes. Although not shown, a passivation film, an X-ray/charge conversion film, an upper electrode, and the like are formed on the resultant structure.

A feature of Embodiment 4-1 is that the storage capacitor line 52 and the signal read line 61 are arranged parallel so as not to vertically overlap each other, i.e., not to cross each other. This feature can suppress electrical coupling between the storage capacitor line 52 and signal read lines 61, reduce noise, and increase the S/N ratio.

In addition to the arrangement shown in FIGS. 26, 27A, and 27B, the pixel electrode 63 may be formed onto the power supply line 56 of the protective diode 102. This can widen the effective pixel area. The signal read line 61 is formed on the upper layer side in the arrangement shown in FIGS. 26, 27A, and 27B, but may be formed on another layer so long as it is arranged parallel to the storage capacitor line 52. The power supply line 56 of the protective diode 102 may be arranged parallel to the signal read line 61 to reduce coupling between the signal read line 61 and power supply lines 56.

In the arrangement shown in FIGS. 26, 27A, and 27B, one TFT is used as the protective diode 102. Alternatively, the protective diode may be formed by series-connecting two or more TFTs to suppress the leakage current from the protective diode, or the leakage current from the protective diode may be reduced by any means. Further, the arrangement position of the TFT can be properly changed in the pixel.

Examples of the metal used for the gate, source, and drain electrodes, gate line, signal read line, storage capacitor line, power supply line, pixel electrode are Ti, Cr, Ta, Mo, MoW, MoTa, Al, ITO, an Al alloy (particularly an Al—Zr, Al—Nd, or Al—Y alloy), and a stacked structure of these metals.

Examples of the material for the gate electrode and line are MoW and MoTa because they allow taper-etching the gate electrode of the TFT so as to prevent the insulating film stacked on the gate electrode from poor step coverage. An Al alloy is preferable for a large-size X-ray semiconductor detector because the Al alloy can prevent a hillock formed in a high-temperature step when only Al is used. For the same reason, preferable examples of the metal for forming the storage capacitor line are MoW, MoTa, and an Al alloy. The metal used for the signal read line is demanded for a low resistance, and thus preferable examples are Al, an Al-stacked structure, an Al alloy, and the like.

Examples of the material for the insulating film are $SiO_2$, $SiN_x$, $SiO_xN_y$, and a stacked structure of these materials. Examples of the material for the passivation and interlevel insulating films are an inorganic insulating film such as an $SiO_2$ or $SiN_x$ film, an organic insulating film such as polyimides, a BCB film, an Optomer film, a black resist, or a fluoroplastic, and a stacked structure of these materials. These resins are preferably photosensitive because the pattern can be easily formed with a smaller number of steps.

The TFT is may be a back-channel cut type in addition to an etching stopper type in the inverted staggered structure. Si for forming the TFT may be polysilicon in addition to amorphous silicon. When polysilicon is used, a peripheral circuit may be formed on the same glass substrate. Charges stored in the pixel may be read by a non-destructive read scheme using a source electrode follower principle, in addition to the read scheme using the ON/OFF state of the TFT.

(Embodiment 4-2; Storage capacitor Line is Formed Parallel to Signal Read Line)

Figure 28:
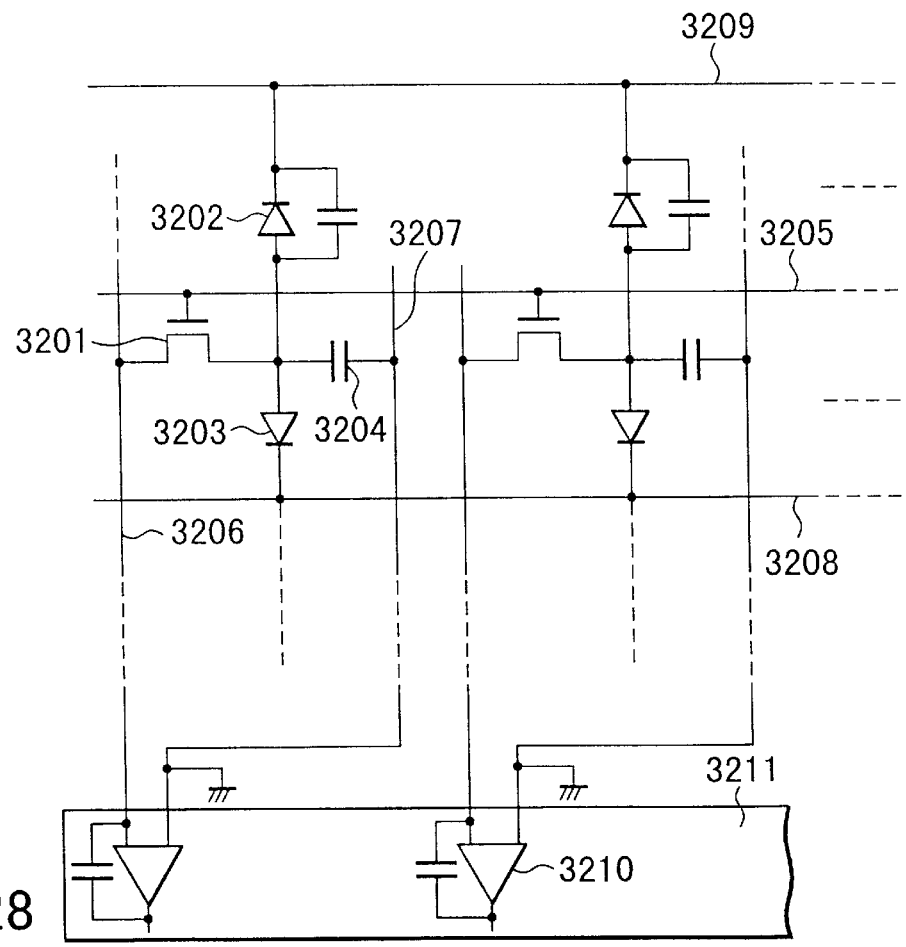
FIG. 28 is an equivalent circuit diagram showing an X-ray semiconductor detector according to Embodiment 4-2.

FIG. 28 is an equivalent circuit diagram showing an X-ray semiconductor detector according to Embodiment 4-2. Reference numeral 3201 denotes a signal read a-Si TFT; 3202, an X-ray/charge conversion film; 3203, a protective diode (made up of, e.g., a protective diode); 3204, an storage capacitor; 3205, a gate line; 3206, a signal read line; 3207, a storage capacitor line; 3208, a power supply line of the protective diode 3203; 3209, a high-voltage application line to the X-ray/charge conversion film; 3210, a detection amplifier; and 3211, a signal detection circuit constituted by a plurality of detection amplifiers 3210 (constituted by an integrated circuit).

The signal read and storage capacitor lines 3206 and 3207 are formed parallel in the pixel. In this embodiment, the storage capacitor line 3207 of the storage capacitor and the signal read line 3206 are arranged parallel so as not to vertically overlap each other, i.e., not to cross each other. This feature can suppress electrical coupling between the capacitor and signal read lines 3207 and 3206, reduce noise, and increase the S/N ratio.

Each signal read line 3206 is connected one of the input terminals of a detection amplifier 3210 in the signal detection circuit 3211, whereas each storage capacitor line 3207 is connected to the other input terminal of the detection amplifier 3210. With this arrangement, the potential difference between the signal read and storage capacitor lines 3206 and 3207 can always be kept constant, so that an increase in noise caused by voltage variations of the storage capacitor line 3207 can be suppressed to detect a high-quality image almost free from noise.

In FIG. 28, the signal read and storage capacitor lines 3206 and 3207 may be connected to the signal detection circuit 3211 by a COG (Chip On Glass), TCP (Tape Carrier Package), or FPC cable. In any case, the above arrangement can be realized to obtain the same effects.

Figure 29A:
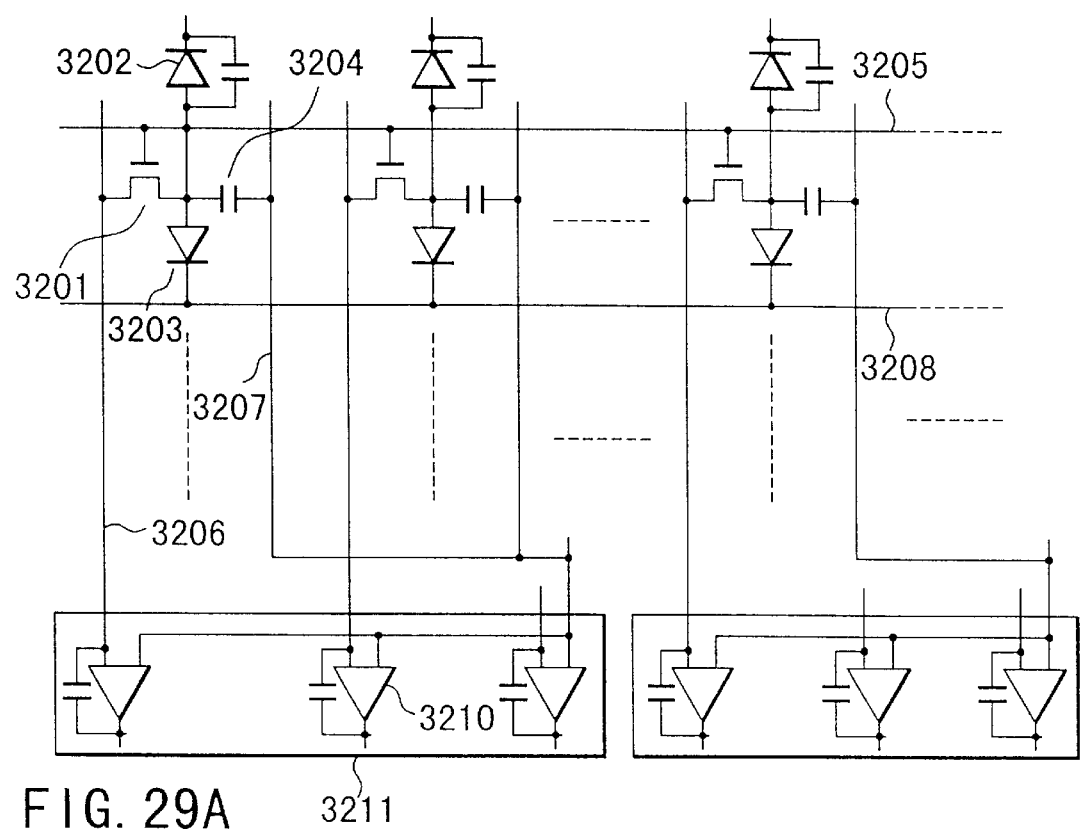
FIG. 29A is an equivalent circuit diagram showing another X-ray semiconductor detector according to Embodiment 4-2.
Figure 29B:
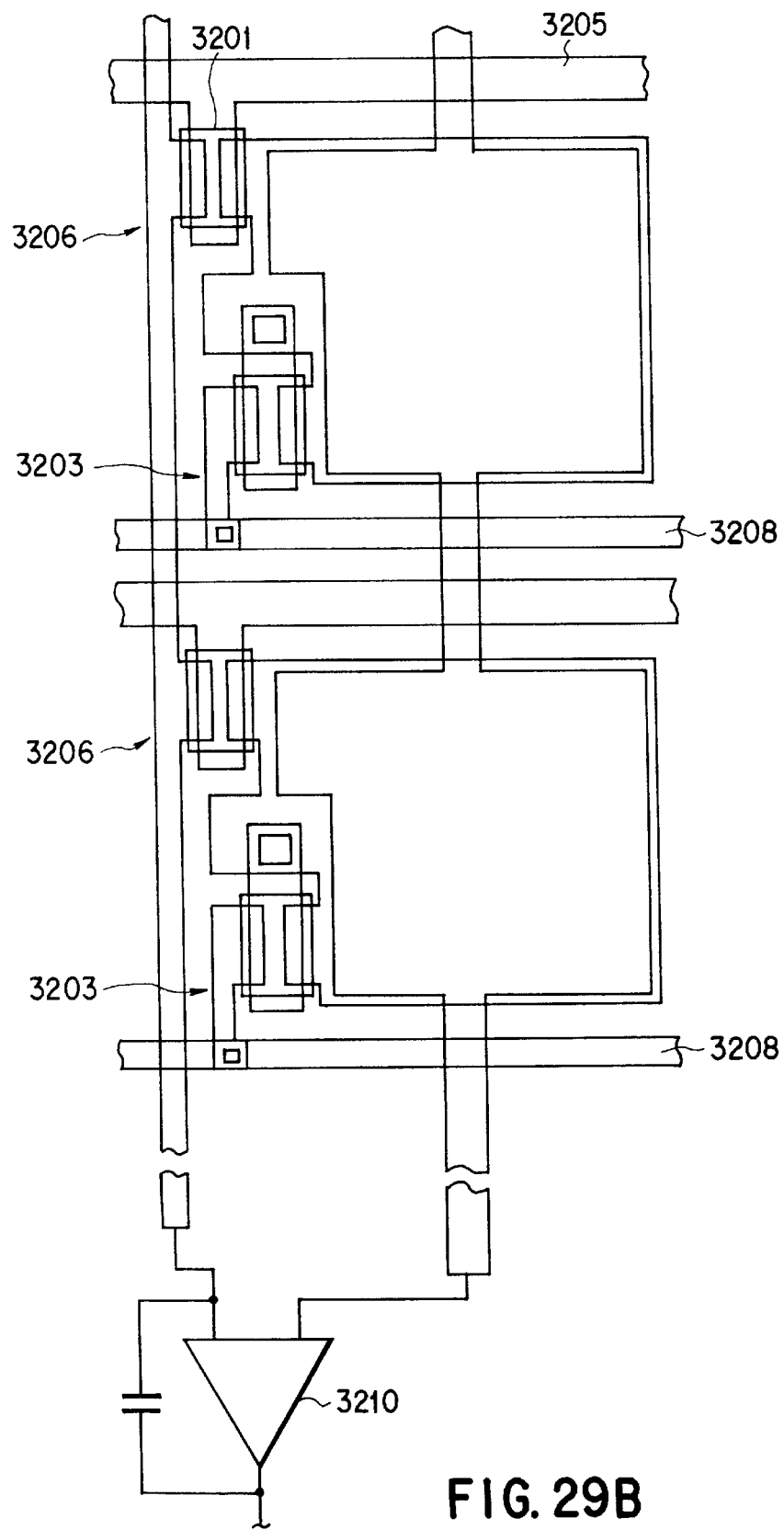
FIG. 29B is a plan view showing the X-ray semiconductor detector according to Embodiment 4-2.

FIG. 29A and FIG. 28B is an equivalent circuit diagram showing a modification of Embodiment 4. The same reference numerals as in FIG. 28 denote the same parts. Also in this modification, similar to Embodiment 4-2 of FIG. 28, the storage capacitor line 3207 is arranged parallel to the signal read line 3206.

In the modification of FIG. 29A, a plurality of storage capacitor lines 3207 are combined into one during wiring to the input of the detection amplifier 3210, and the combined storage capacitor line is connected to the input terminal of the detection amplifier 3210. In the modification of FIG. 29A, storage capacitor lines 3207 connected to respective pixels detected by one signal detection circuit (e.g., one integrated circuit chip) 3211 are combined into one, and storage capacitor lines connected to respective pixels detected by another signal detection circuit are combined into one for this signal detection circuit. The storage capacitor lines are preferably combined outside the array area where pixels are aligned. In the modification of FIG. 29A, the storage capacitor lines 3207 are combined before the input of the signal detection circuit 3211. Alternatively, the storage capacitor lines 3207 may be combined after the input of the signal detection circuit 3211 and before the input of the detection amplifier 3210.

In this modification, since the potential difference between the signal read and storage capacitor lines 3206 and 3207 is always kept constant, an increase in noise caused by voltage variations of the storage capacitor line can be suppressed to detect a high-quality image almost free from noise.

In FIG. 29A the signal read and storage capacitor lines 3206 and 3207 may be connected to the signal detection circuit 3211 by a COG (Chip On Glass), TCP (Tape Carrier Package), or FPC cable. In any case, the above arrangement can be realized to obtain the same effects.

(Embodiment 5-1; Channel Directions of all TFTs in Pixel are Aligned)

Figure 30:
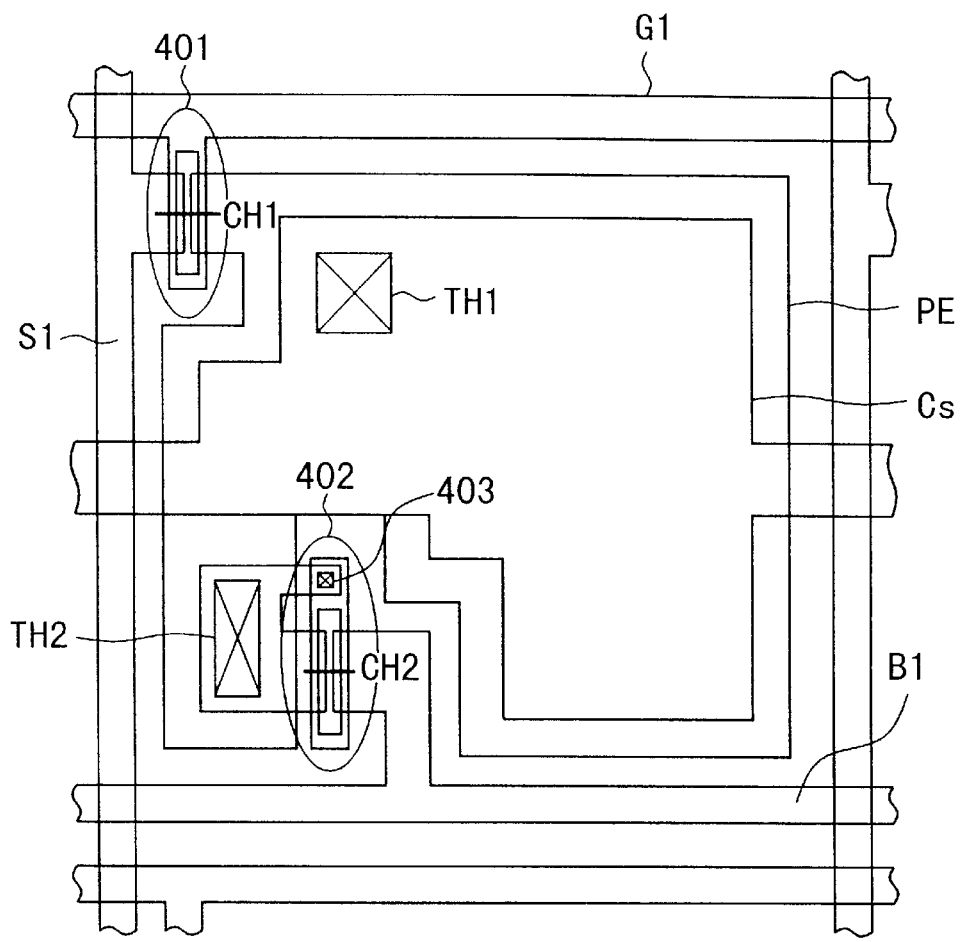
FIG. 30 is a plan view showing one pixel of an X-ray semiconductor detector according to Embodiment 5-1.

FIG. 30 is a plan view showing one pixel in the TFT array of an X-ray semiconductor detector according to Embodiment 5-1. The gate, source, and drain electrodes of a signal read a-Si TFT 401 are respectively connected to a gate line G1, a signal read line S1, and a pixel electrode PE of an storage capacitor. The pixel electrode PE is arranged to face a storage capacitor line Cs via an insulating film. The pixel electrode PE, insulating layer, and storage capacitor line Cs constitute an storage capacitor.

The signal read a-Si TFT 401 is turned on when the gate line G1 changes to "H", level (e.g., 20V). At this time, charges stored in the storage capacitor are transferred to an amplifier via the a-Si TFT 401.

The gate and drain electrodes of a protective diode (TFT) 402 are connected to the pixel electrode PE. The source electrode of the protective diode 402 is connected to a power supply line B1. The power supply line B1 is kept at a predetermined potential Vb to control the breakdown voltage of the protective diode 402. When the pixel electrode PE rises to a predetermined voltage or more (e.g., 10V or more), the protective diode 402 is turned on to transfer signal charges to the power supply line B1. Thus, the pixel electrode PE can be controlled not to receive an excessively high voltage.

Figure 31:
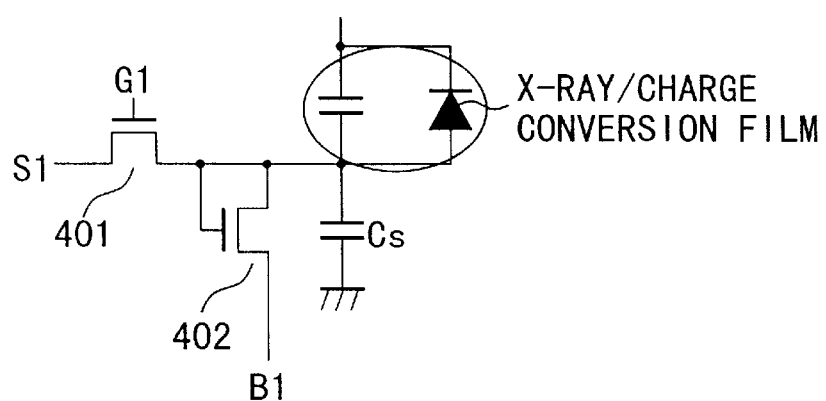
FIG. 31 is an equivalent circuit diagram showing one pixel of the X-ray semiconductor detector according to Embodiment 5-1.
Figure 34:
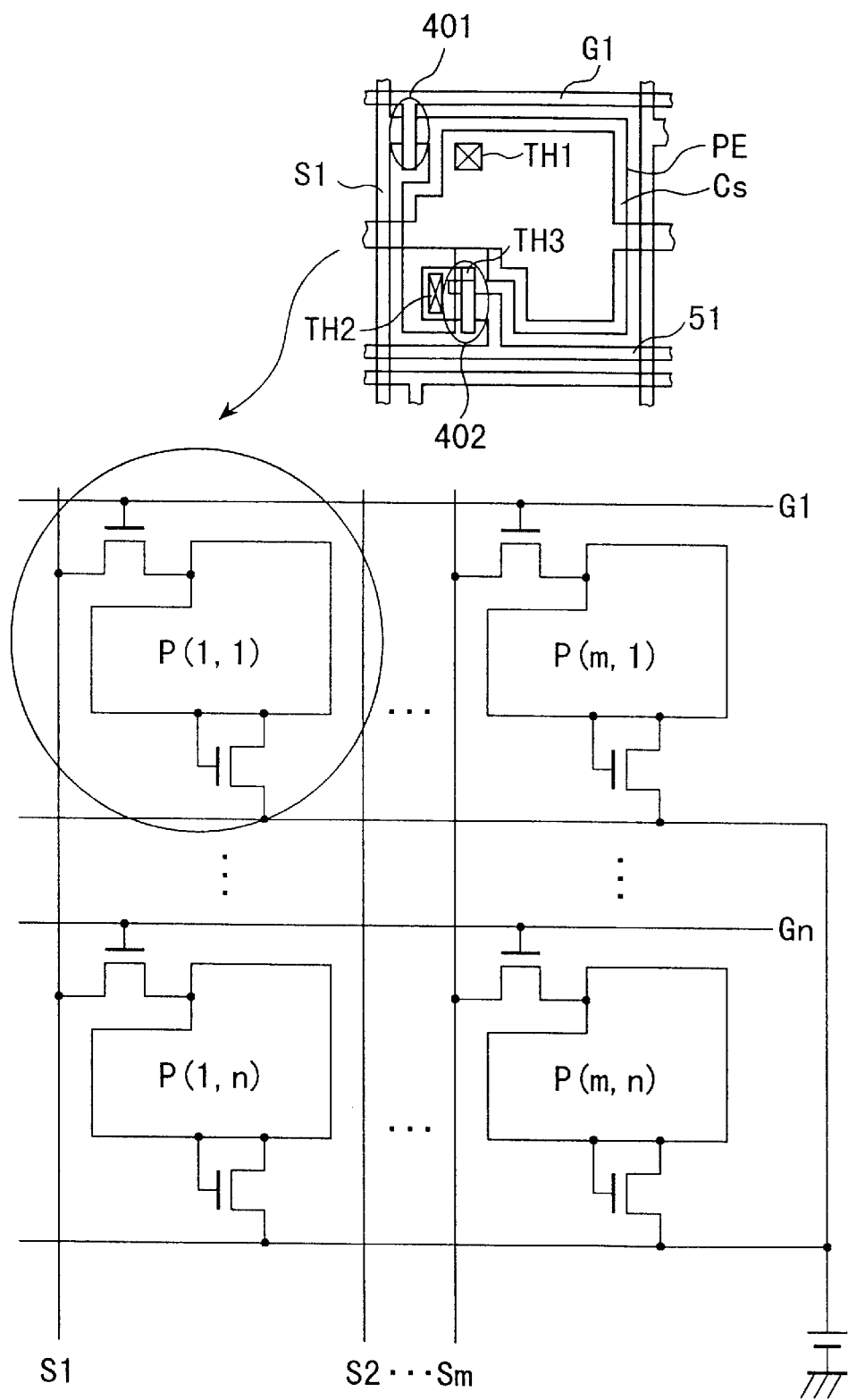
FIG. 34 is an equivalent circuit diagram showing the TFT array of the X-ray semiconductor detector according to Embodiment 5-1.

One feature of Embodiment 5-1 is that the channel directions of all TFTs, i.e., the signal read a-Si TFT 401 and protective diode 402 in the pixel are aligned parallel, as shown in FIGS. 30, 31, and 34. Note that the channel is defined as a path for allowing electrons or holes to move between the source and drain electrodes of the TFT, as indicated by channels CH1 and CH2 in FIG. 30. The channel direction is defined as the direction of this path.

Since the channel directions of the TFTs in the pixel are aligned, even if a mask is misaligned during the manufacture, TFT characteristics (OFF current, Vth, and the like) can be kept uniform.

Figure 32:
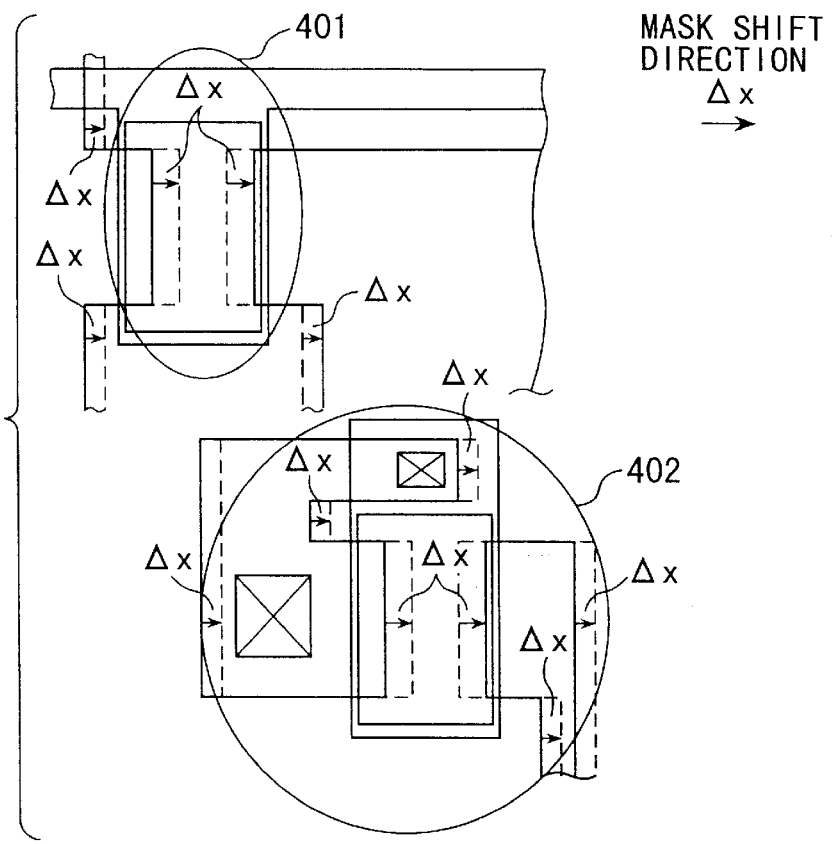
FIG. 32 is a plan view showing the shape of a TFT when a mask shifts parallel to the channel direction.
Figure 33:
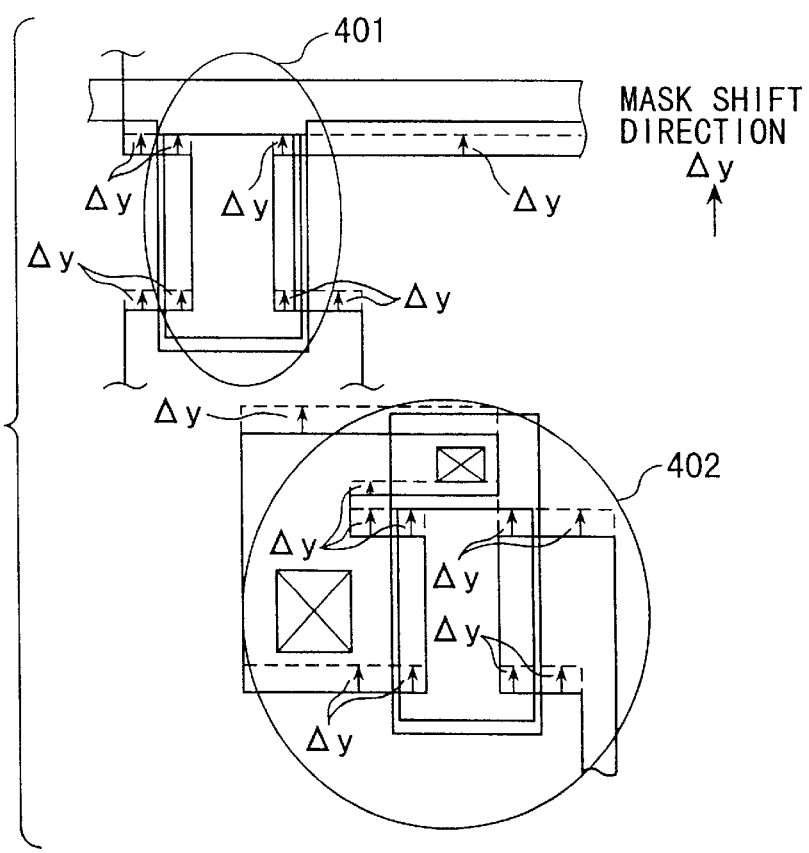
FIG. 33 is a plan view showing the shape of a TFT when a mask shifts perpendicularly to the channel direction.

FIGS. 32 and 33 show the TFT shape in one pixel when a mask is misaligned in forming source and drain electrodes. The solid line represents a desired TFT shape, and the dotted line represents an actual TFT shape with mask misalignment. FIG. 32 shows the case in which a mask shifts by Δx parallel to the channel direction. FIG. 33 shows the case in which a mask shifts by Δy perpendicularly to the channel direction. If a mask shifts parallel to the channel direction, the source and drain electrodes become different in length to cause TFT characteristic errors such as a change in threshold voltage Vth and an increase in OFF current. However, since the channel directions of all TFTs in the pixel are aligned in Embodiment 5-1, even if a mask is misaligned, the source and drain electrodes of all TFTs in the pixel shift by the same amount. Therefore, the characteristics (OFF current, Vth, and the like) of all TFTs in the pixel can be kept almost uniform. Similarly, if a mask shifts perpendicularly to the channel direction, the channel width changes to increase the ON resistance. However, since TFTs in the pixel shift by the same amount, no TFT characteristics vary.

More specifically, as shown in FIGS. 32 and 33, even if a mask is misaligned during the manufacture of the TFT array, a plurality of TFTs in the pixel can be formed with the same shape by aligning their channel directions parallel. As a result, variations in characteristics of a plurality of TFTs in the pixel can be suppressed to suppress degradation of the image quality such as an increase in noise.

Figure 35:
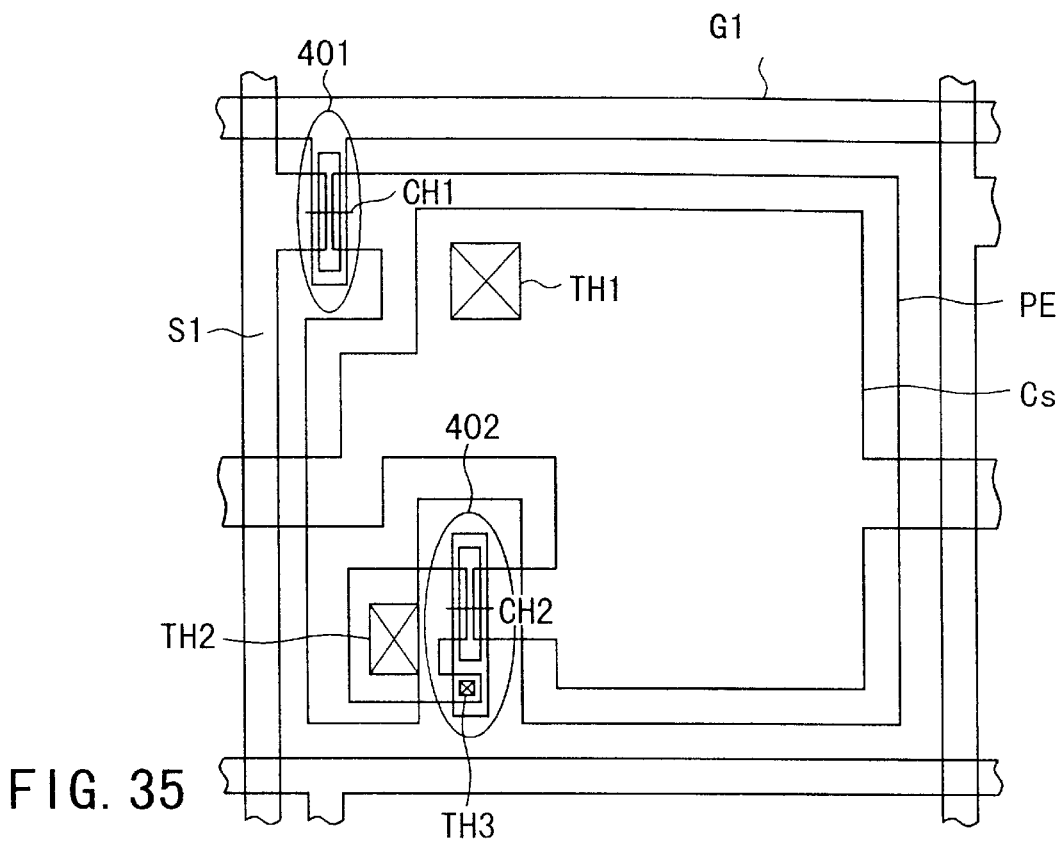
FIG. 35 is a plan view showing one pixel of the X-ray semiconductor detector according to Embodiment 5-1.
Figure 36A:
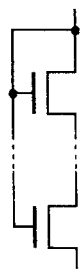
FIG. 36A is an equivalent circuit diagram showing an example in which the protective diode is made up of two TFTs in Embodiment 5-1.
Figure 36B:
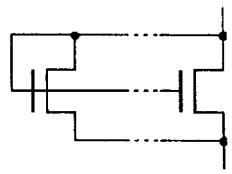
FIG. 36B is an equivalent circuit diagram showing another example in which the protective diode is made up of two TFTs in Embodiment 5-1.
Figure 36C:
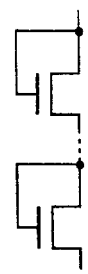
FIG. 36C is an equivalent circuit diagram showing still another example in which the protective diode is made up of two TFTs in Embodiment 5-1.
Figure 36D:
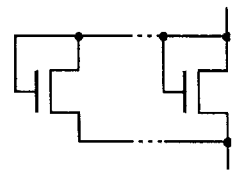
FIG. 36D is an equivalent circuit diagram showing still another example in which the protective diode is made up of two TFTs in Embodiment 5-1.

Note that the source electrode of the protective diode 402 is connected to the power supply line B1 in FIGS. 30 and 34, but may be connected to the storage capacitor line Cs, as shown in FIG. 35, to obtain the same effects. The signal charge read a-Si TFT 401 is constituted by one TFT in FIGS. 30 and 34, but may be constituted by series-connecting a plurality of TFTS. Similarly, the protective diode 402 is constituted by one TFT in FIGS. 30 and 34, but may be constituted by series- or parallel-connecting a plurality of TFTs, as shown in FIGS. 36A, 36B, 36C, and 36D.

(Embodiment 5-2; Channel Directions of all TFTs in Pixel are Aligned)

Figure 37:
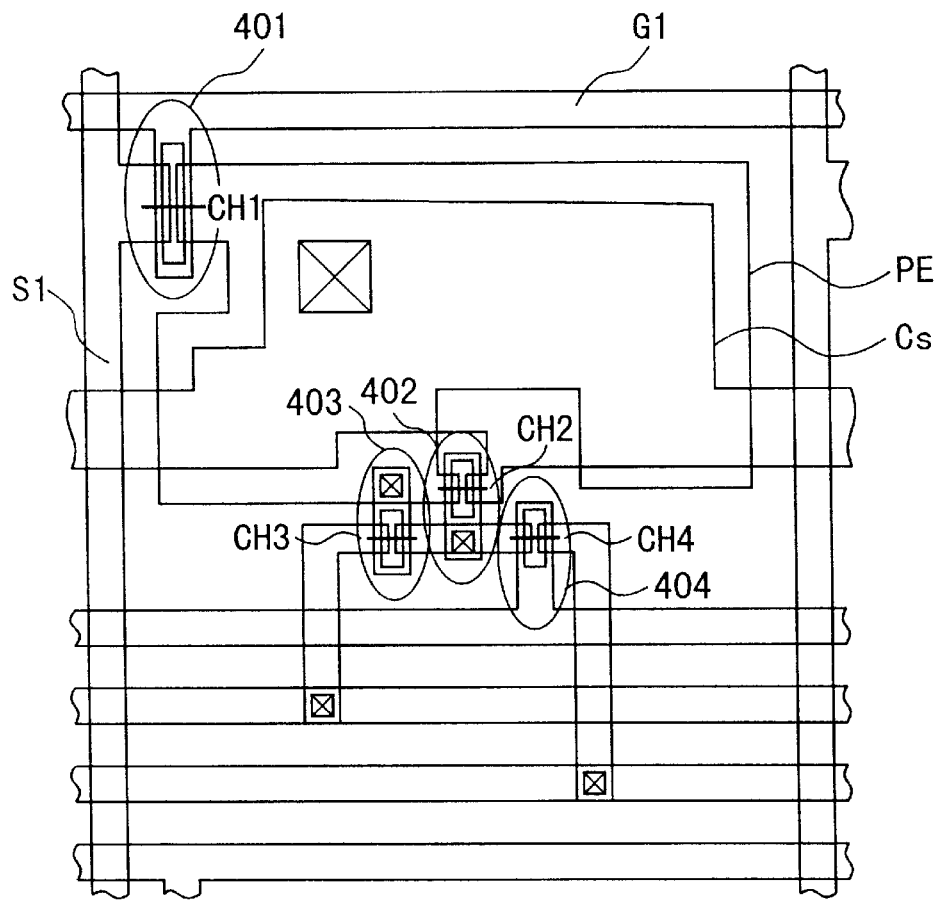
FIG. 37 is a plan view showing one pixel of an X-ray semiconductor detector according to Embodiment 5-2.
Figure 38:
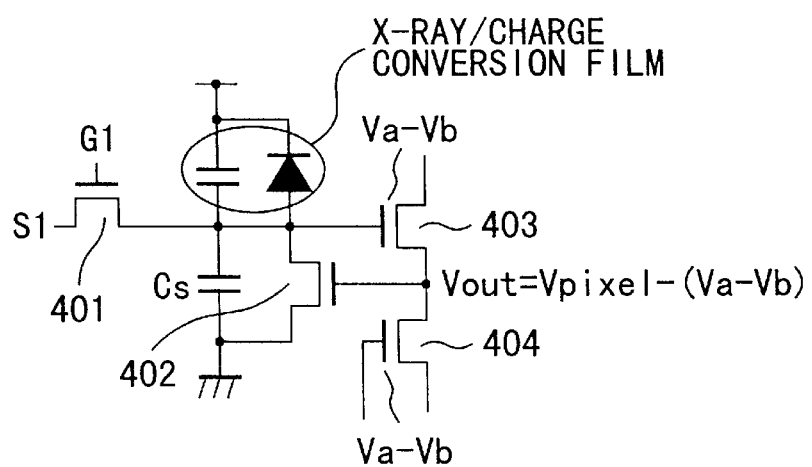
FIG. 38 is an equivalent circuit diagram showing one pixel of the X-ray semiconductor detector according to Embodiment 5-2.

FIG. 37 is a plan view showing one pixel of an X-ray semiconductor detector according to Embodiment 5-2. Note that the basic arrangement and operation are the same as in Embodiment 5-1, the same reference numerals denote the same parts, and a detailed description thereof will be omitted.

In Embodiment 5-2, a pixel includes a signal read a-Si TFT 401, a protective diode 402 for preventing breakdown of an insulator in the pixel upon application of a high voltage to a pixel electrode PE, and TFTs 403 and 404 of a bias circuit for controlling the breakdown voltage of the protective diode 402.

The signal read a-Si TFT 401 is turned on/off by a signal from a gate line G1, and transfers charges stored in the pixel electrode PE to a detection amplifier.

The protective diode 402 is an amorphous silicon thin-film transistor (a-Si TFT) which functions to prevent application of a predetermined voltage or more to the pixel electrode PE. The drain, source, and gate electrodes of the protective diode 402 are respectively connected to the pixel electrode PE, a storage capacitor line, and the TFTs 403 and 404 of the bias circuit. The breakdown voltage of the protective diode 402 can be controlled because the output Vout between the TFTs 403 and 404 of the bias circuit outputs a signal biased by "Va-Vb" with respect to an input signal (potential of the pixel electrode PE).

As shown in FIG. 37, a feature of Embodiment 5-2 is that the channel directions of all TFTs in the pixel, i.e., channel directions CH1, CH2, CH3, and CH4 of the signal read a-Si TFT 401, protective diode 402, TFT 403 of the bias circuit, and TFT 404 of the bias circuit are arranged parallel to each other.

Since the channel directions of all TFTs in the pixel are arranged parallel, even if a mask is misaligned, a plurality of TFTs in the pixel can be formed with the same shape. Variations in characteristics of a plurality of TFTs in the pixel can be suppressed to suppress degradation of the image quality such as an increase in noise. Although a shift of Vth influences the output Vout between the TFTs 403 and 404 of the bias circuit to influence the breakdown voltage of the protective diode 402, the arrangement of this embodiment can keep Vth of the bias circuit constant to set the breakdown voltage to a desired value.

Figure 39:
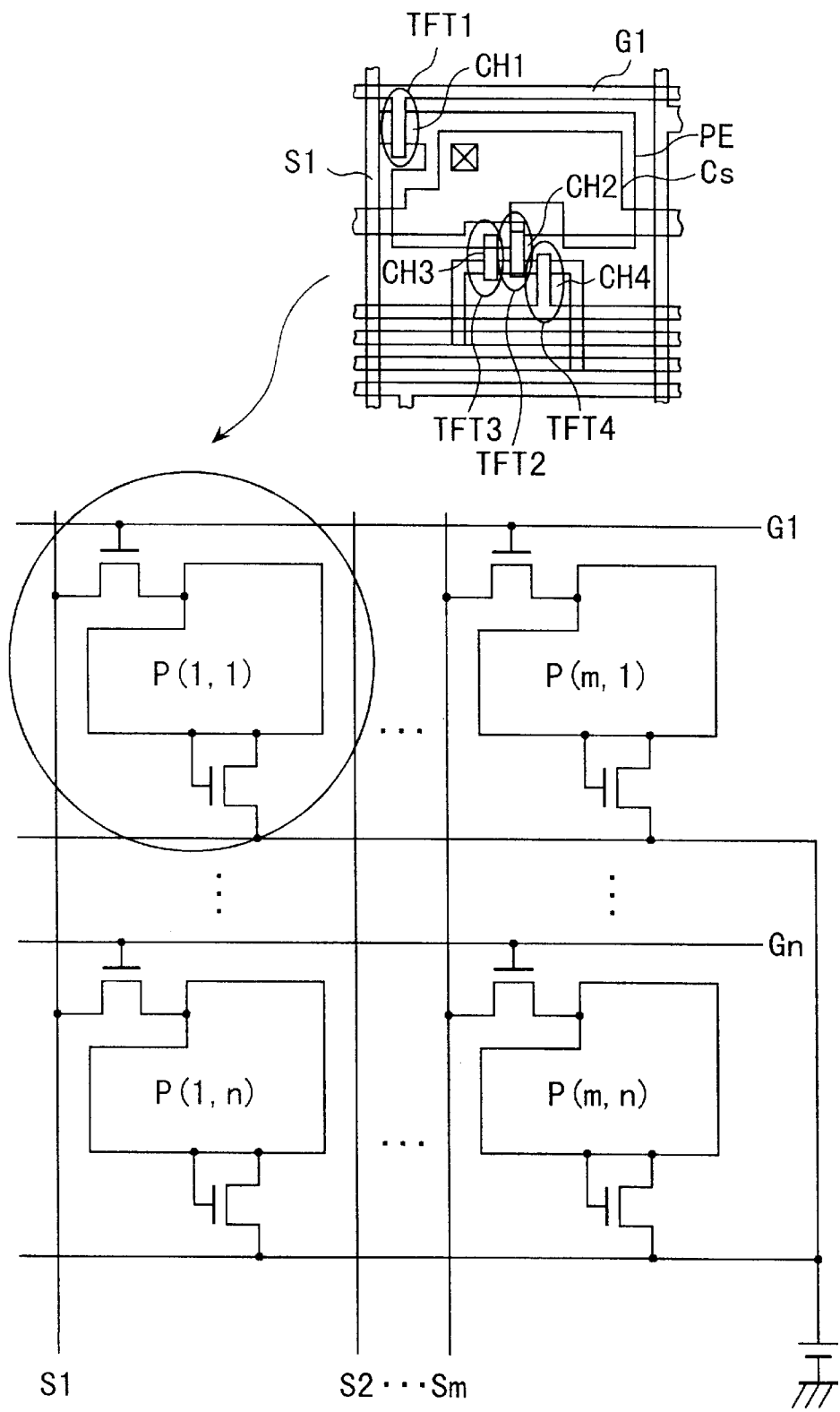
FIG. 39 is an equivalent circuit diagram showing the TFT array of the X-ray semiconductor detector according to Embodiment 5-2.

FIG. 39 is a plan view showing an application of pixels in Embodiment 5-2 to the whole TFT array. By applying the pixel structure shown in FIG. 37 to all pixels in the pixel area, variations between pixels can be reduced to obtain a high-quality image.

Note that the source electrode of the protective diode 402 is connected to the storage capacitor line in FIGS. 37 and 39, but may be connected to the power supply line B1 to obtain the same effects. The signal read a-Si TFT 401 is constituted by one TFT in FIGS. 37 and 39, but may be constituted by series-connecting a plurality of TFTs. Similarly, the protective diode 402 is constituted by one TFT in FIGS. 37 and 39, but may be constituted by series- or parallel-connecting a plurality of TFTs, as shown in FIGS. 36A, 36B, 36C, and 36D.

(Embodiment 5-3; Channel Directions of all TFTs in Pixel are Aligned)

Figure 40:
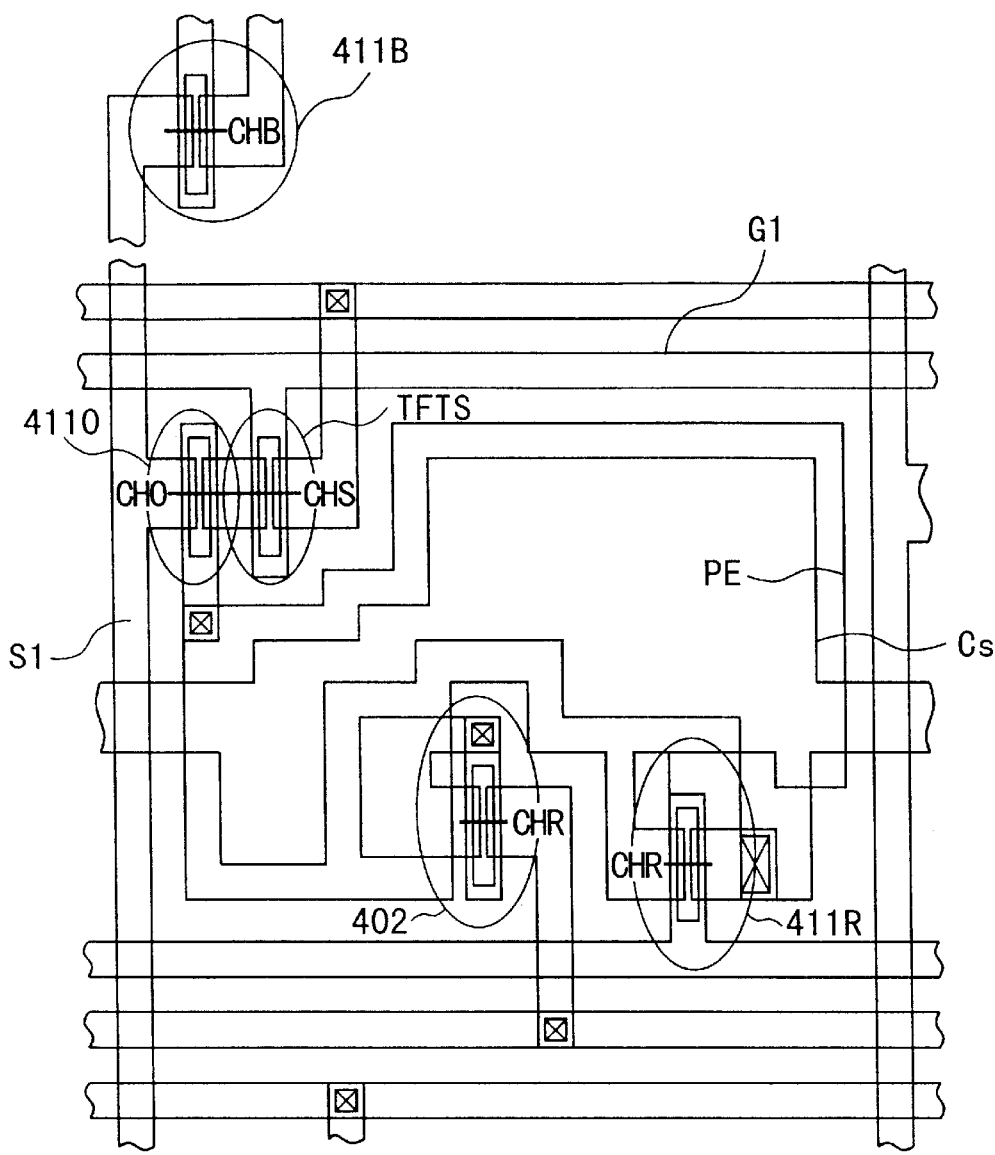
FIG. 40 is a plan view showing one pixel of an X-ray semiconductor detector according to Embodiment 5-3.
Figure 41:
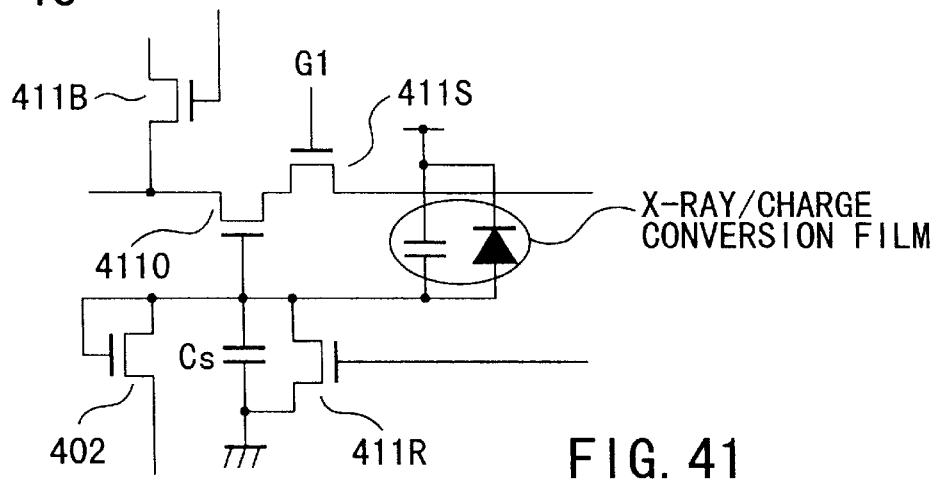
FIG. 41 is an equivalent circuit diagram showing one pixel of the X-ray semiconductor detector according to Embodiment 5-3.

FIG. 40 is a plan view showing one pixel of an X-ray semiconductor detector according to Embodiment 5-3 of the present invention. Note that the basic arrangement and operation are the same as in Embodiment 5-1, the same reference numerals denote the same parts, and a detailed description thereof will be omitted.

Embodiment 5-3 adopts a TFT structure called an AMI (Amplified MOS Imager) structure in which charges stored in the pixel are output after being converted into a voltage. A pixel includes a protective diode 402 for preventing dielectric breakdown of an insulator in the pixel upon application of a high voltage to the pixel electrode.

In the AMI structure, the drain electrode of a bias TFT 411B is connected to a signal read line Si. A bias voltage is applied to the gate and source electrodes to fix a voltage Vgs between the gate and source electrodes to a constant potential. In the pixel, the source, gate, and drain electrodes of an output TFT 4110 are respectively connected to the signal read line S1, a pixel electrode PE, and a selection TFT 411S. The gate electrode of the TFT 411S is connected to a gate line G1, and the drain electrode receives a bias voltage. The pixel electrode is connected to a reset TFT 411R, and the gate electrode of the TFT 411R is connected to a power supply line B1. A selection TFT 411S on an "H" gate line G1 is selected to be turned on and output the potential of a corresponding pixel. Charges stored in the pixel electrode PE are output after being converted into a voltage (pixel electrode voltage −Vgs) by the TFTs 411B and 4110. After the pixel signal is output, the TFT 411R is turned on to remove charges stored in the pixel electrode PE and reset the pixel potential.

Both the gate and drain electrodes of the protective diode 402 are connected to the pixel electrode, whereas the source electrode is connected to the power supply line B1. The power supply line B1 is kept at a predetermined potential Vb to control the breakdown voltage of the diode 402. When the pixel electrode rises to a predetermined voltage or more (e.g., 10V or more), the protective diode 402 is turned on to transfer signal charges to the power supply line B1. Thus, the pixel electrode PE can be controlled not to receive an excessively high voltage.

One feature of Embodiment 5-3 is that the channel directions (CHO, CHS, CHR, and CH2) of the thin-film transistors (411O, 411S, 411R, and 402) formed in the pixel are arranged parallel to each other and also to the channel direction CHB of the bias thin-film transistor 411B.

With the arrangement of this embodiment, even if a mask is misaligned, a plurality of TFTs and the bias TFT connected to the signal read line in the pixel can be formed with the same shape. Variations in characteristics of a plurality of TFTs and bias TFT in the pixel can be suppressed to suppress degradation of the image quality such as an increase in noise. Although a shift of Vth influences a pixel signal output in the TFTs 411B and 411O, the arrangement of this embodiment can keep Vth of the TFTs 411B and 411O constant to prevent variations in output. As for a long-term shift of Vth, since the values Vth of the TFTs 411B and 411O similarly change, an image can be efficiently detected without any cumbersome adjustment. Furthermore, since the reset TFTR and protective diode 402 can also be formed with the same shape, variations in OFF current can be reduced.

Figure 42:
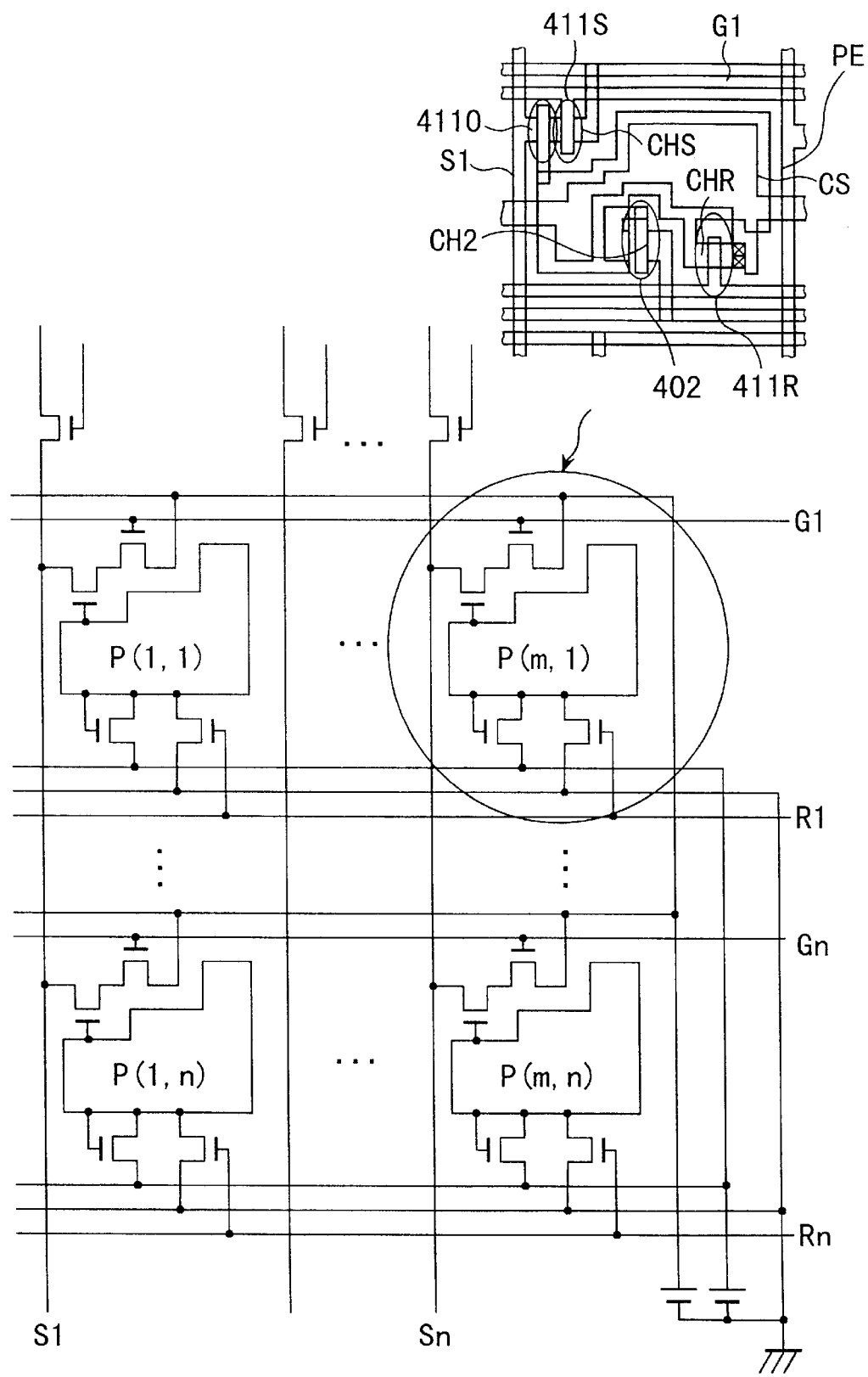
FIG. 42 is an equivalent circuit diagram showing the TFT array of the X-ray semiconductor detector according to Embodiment 5-3.

FIG. 42 is a plan view showing an application of pixels in Embodiment 5-3 to the whole TFT array. By applying the pixel structure shown in FIG. 40 to all pixels in the pixel area, variations between pixels can be reduced to obtain a high-quality image.

Note that the source electrode of the protective diode 402 is connected to the power supply line B1 in FIGS. 40 and 42, but may be connected to the storage capacitor electrode Cs (e.g., GND), like a protective diode 402 in FIG. 36, to obtain the same effects. Similarly, the protective diode 402 is constituted by one TFT in FIGS. 40 and 42, but may be constituted by series- or parallel-connecting a plurality of TFTs, as shown in FIGS. 36A, 36B, 36C, and 36D.

(Embodiment 5-4; Channel Directions of all TFTs in Pixel are Aligned)

Figure 43:
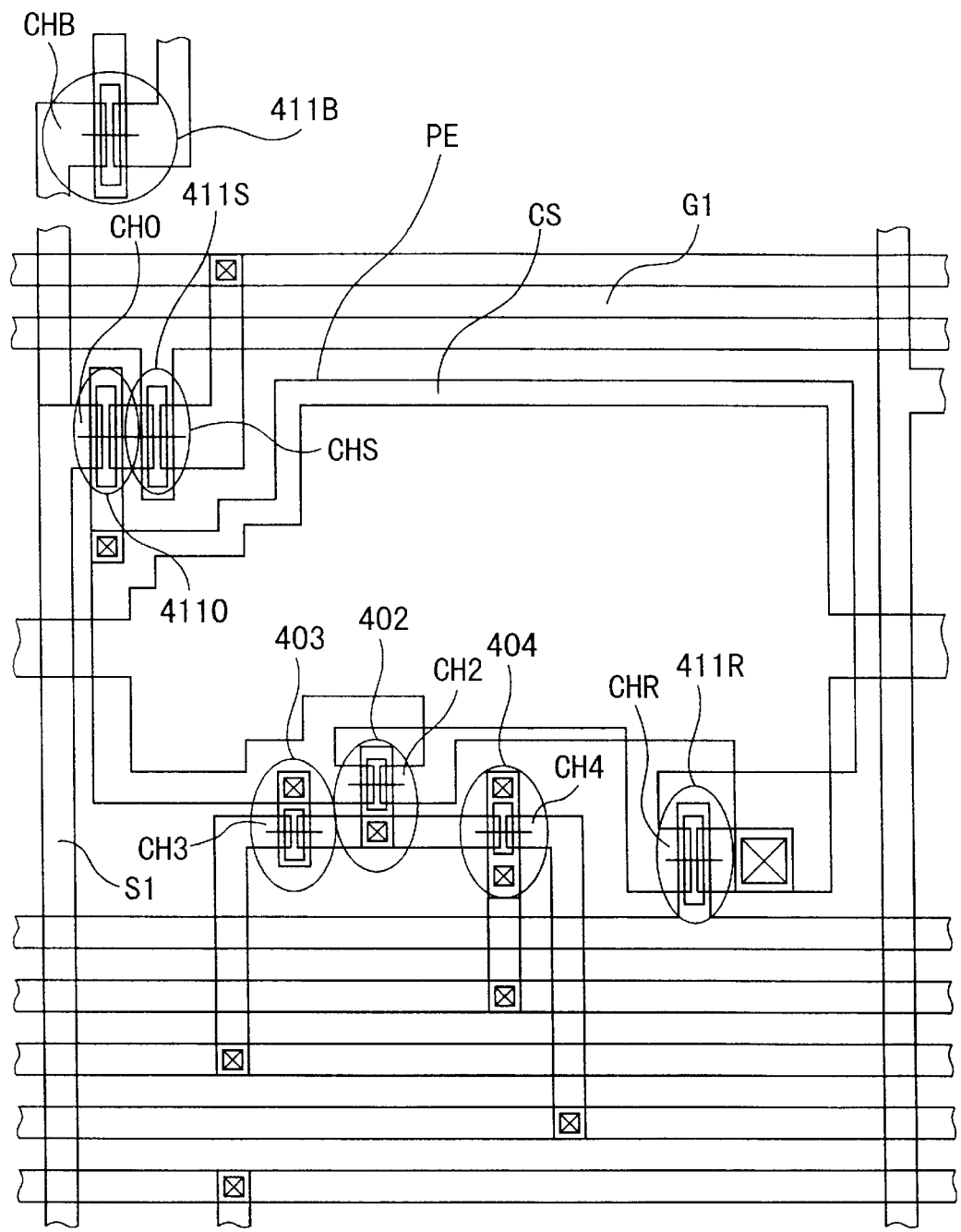
FIG. 43 is a plan view showing one pixel of an X-ray semiconductor detector according to Embodiment 5-4.

FIG. 43 is a plan view showing one pixel of an X-ray semiconductor detector according to Embodiment 5-4 of the present invention. Note that the basic arrangement and operation are the same as in Embodiment 5-3, the same reference numerals denote the same parts, and a detailed description thereof will be omitted.

Embodiment 5-4 adopts a TFT structure called an AMI (Amplified MOS Imager) structure in which charges stored in the pixel are output after being converted into a voltage. The pixel includes a protective diode 402 for preventing breakdown of an insulator in the pixel upon application of a high voltage to the pixel electrode, and TFTs 403 and 404 of a bias circuit for controlling the breakdown voltage of the protective diode.

With the arrangement of this embodiment, even if a mask is misaligned, a plurality of TFTs and the bias TFT connected to the signal read line in the pixel can be formed with the same shape. Variations in characteristics of a plurality of TFTs in the pixel and bias TFT can be suppressed to suppress degradation of the image quality such as an increase in noise. Although a shift of the threshold voltage Vth influences a pixel signal output in the TFTs 411B and 411O, the arrangement of this embodiment can keep Vth of the TFTs 411B and 411O constant to prevent variations in output. As for a long-term shift of Vth, since the values Vth of the TFTs 411B and 411O similarly change, an image can be efficiently detected without any cumbersome adjustment. Although a shift of Vth influences an output Vout in the TFTs 403 and 404 of the bias circuit, the arrangement of this embodiment can keep Vth of the bias circuit constant to set the breakdown voltage of the protection diode 402 to a desired value.

Figure 44:
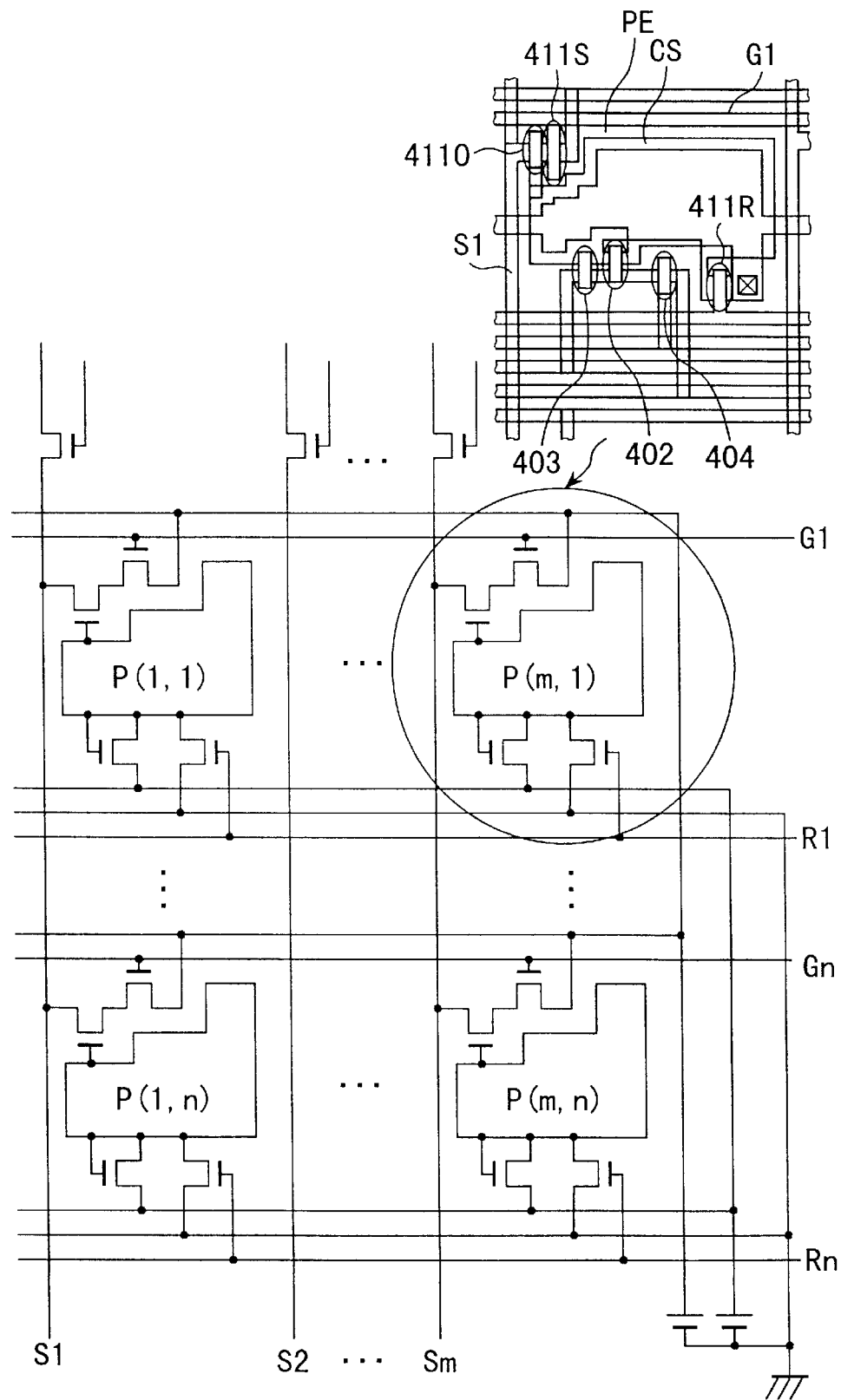
FIG. 44 is an equivalent circuit diagram showing the TFT array of the X-ray semiconductor detector according to Embodiment 5-4.

FIG. 44 is a plan view showing an application of pixels in Embodiment 5-4 to the whole TFT array. By applying the pixel structure shown in FIG. 43 to all pixels in the pixel area, variations between pixels can be reduced to obtain a high-quality image.

Note that the source electrode of the protective diode 402 is connected to the storage line in FIGS. 43 and 44, but may be connected to the power supply line B1 to obtain the same effects. Similarly, the protective diode 402 is constituted by one TFT in FIGS. 43 and 44, but may be constituted by series- or parallel-connecting a plurality of TFTs.

As described above, since the channel directions of all TFTs in the pixel are arranged parallel, even if a mask is misaligned during the manufacture of the TFT array, the TFTs can be formed with the same shape to suppress variations in TFT characteristics (OFF current, Vth, and the like). An increase in noise (e.g., fixed pattern noise) caused by variations in characteristics can be suppressed to improve the quality of a detected image and increase the working efficiency.

(Embodiment 5-5; Channel Directions of all TFTs in Pixel are Aligned (Second Embodiment in 10-72628))

Figure 45:
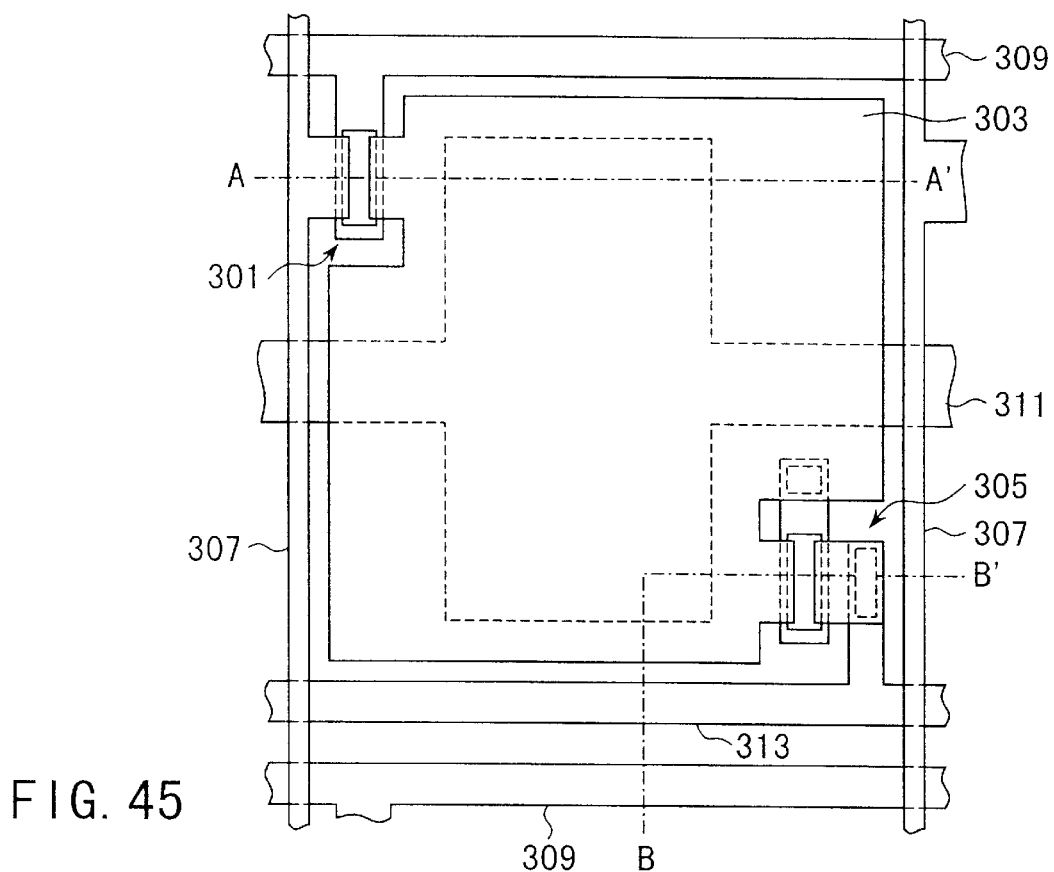
FIG. 45 is a plan view showing one pixel of an X-ray semiconductor detector according to Embodiment 5-5.

FIG. 45 is a plan view showing an X-ray semiconductor detector according to Embodiment 5-5 of the present invention. A pixel is made up of a signal read amorphous thin-film transistor (a-Si TFT) 301, a pixel electrode 303, a protective diode 305, a signal read line (signal line) 307, a gate line (scanning line) 309, an auxiliary electrode 311, and a power supply line (bias line) 313 of the protective diode 305.

The power supply line 313 for the protective diode is formed in the same step as not the signal read line 307 but the gate line 309. The power supply line 313 is arranged parallel to not the signal read line 307 but the gate line 309. This is because the yield in forming the gate line is higher than the yield in forming the signal read line.

Figure 46A:
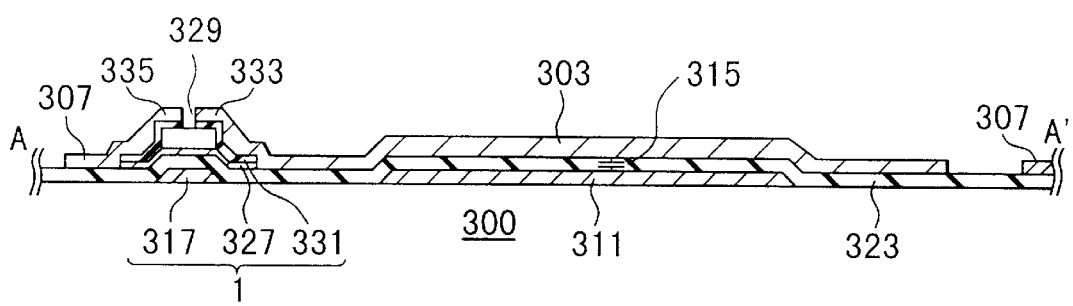
FIG. 46A is a sectional view taken along the line A–A' in FIG. 45.
Figure 46B:
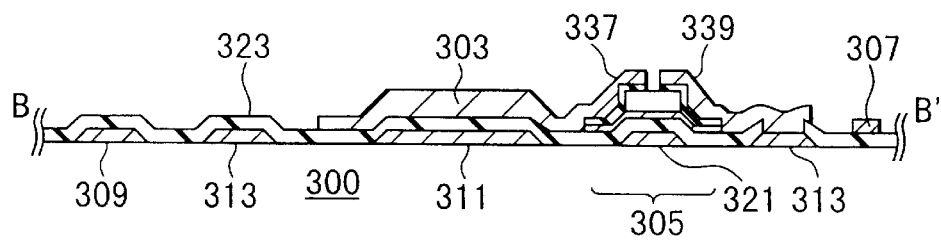
FIG. 46B is a sectional view taken along the line B–B' in FIG. 45.

FIG. 46A is a sectional view taken along the line A–A' in FIG. 45, and FIG. 46B is a sectional view taken along the line B–B' in FIG. 45. A gate electrode 317 of the a-Si TFT 301, the gate line 309, the auxiliary electrode 311, a gate electrode 321 of the protective diode 305, and the power supply line 313 are formed from a metal A47 on a glass substrate 300. An insulating film 323 is formed on the obtained structure though the insulating film 323 is removed from the through hole of the protective diode 305. The pixel electrode 303 is formed from a metal B'48 on the insulating film 323 within a pixel except for the a-Si TFT 301 and protective diode 305. An a-Si film 327, an etching stopper $SiN_x$ film 329, and an $n^+$-type a-Si film 331 for the a-Si TFT 301 are formed on the insulating film 323. Source and drain electrodes 333 and 335 are formed from a metal B49 on the $n^+$-type a-Si film 331. The signal read line 307, an extraction pad, a voltage application line, source and drain electrodes 337 and 339 of the protective diode 305, and the like are also formed from this metal B49. The pixel electrode 303 can be formed at the same time. In this case, the source electrode 333 of the TFT 301, the source electrode 337 of the protective diode 305, and the pixel electrode 303 are integrally formed. With this structure, the TFT array is complete. Although not shown, a passivation film, an X-ray/charge conversion film, and a common electrode made of a metal C51 are formed on the TFT array.

Figure 47:
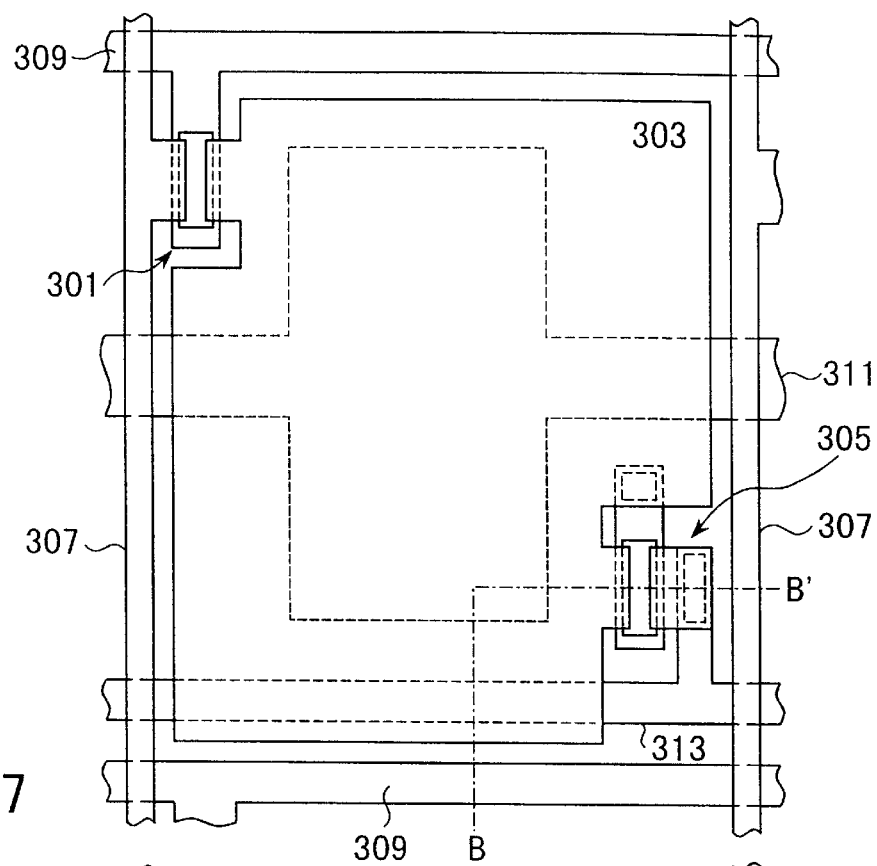
FIG. 47 is a plan view showing one pixel of another X-ray semiconductor detector according to Embodiment 5-5.
Figure 48:
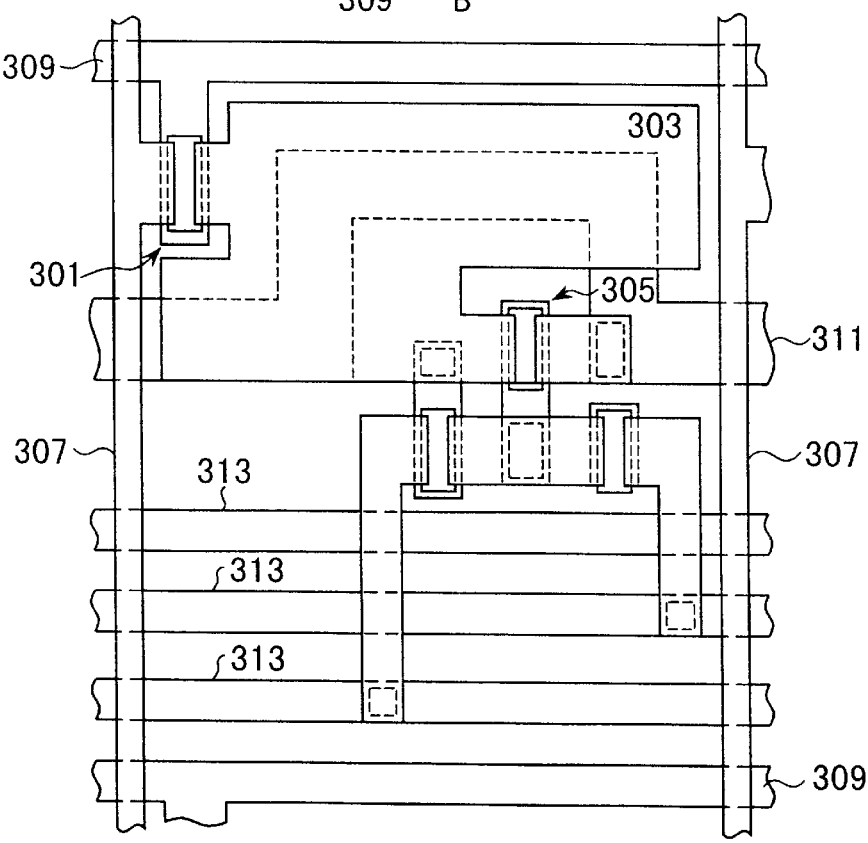
FIG. 48 is a plan view showing one pixel of still another X-ray semiconductor detector according to Embodiment 5-5.

Note that in the X-ray semiconductor detector, the pixel electrode 303 may extend to overlap the power supply line 313, as shown in the plan view of FIG. 47, thereby widening the effective pixel area. In FIG. 45, one TFT is used as the protective diode 305. Alternatively, the protective diode may be formed by series-connecting two or more TFTs to suppress the leakage current from the protective diode, or the leakage current from the protective diode may be reduced by any means. In FIG. 45, one TFT is used as the protective diode 305, but the leakage current may be further reduced using three TFTs. In this case, the number of power supply lines increases from one to three. As shown in FIG. 48, the three power supply lines 313 may be formed parallel to the gate line 309 at the same time as the gate line 309 in the gate line formation step. Alternatively, as shown in FIG. 49, two of the three power supply lines 313 may be formed parallel to the gate line 309 at the same time as the gate line 309 in the gate line formation step, and the remaining one power supply line 313 may be formed parallel to the signal read line 307 at the same time as the signal read line 307 in the signal read line formation step.

Figure 49:
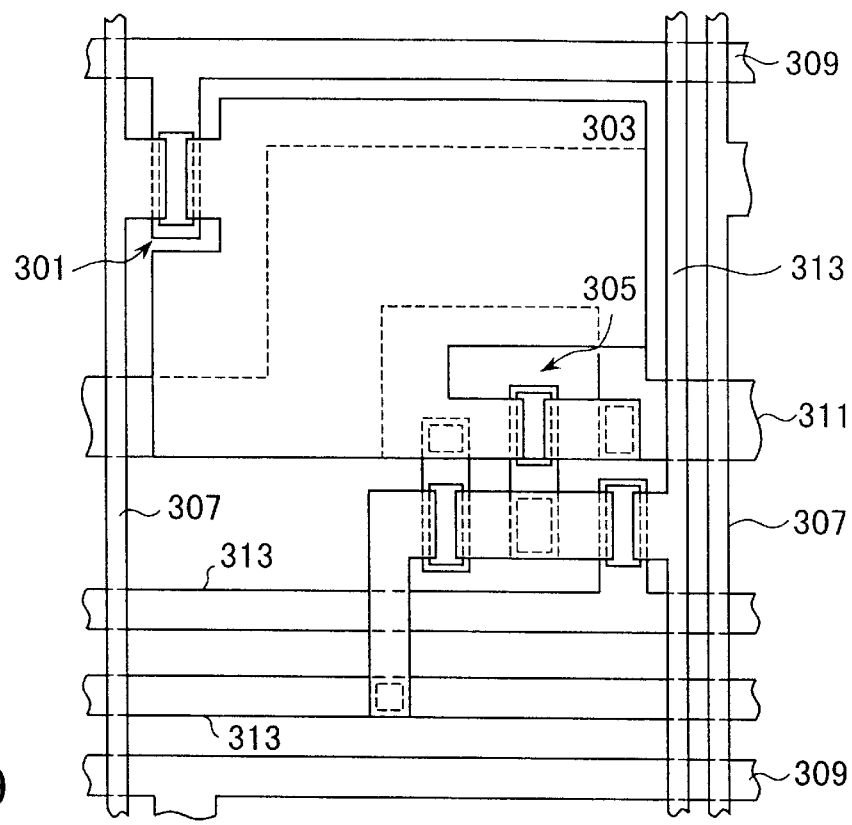
FIG. 49 is a plan view showing one pixel of still another X-ray semiconductor detector according to Embodiment 5-5.

If one power supply line 313 is arranged parallel to the signal read line 307, as shown in FIG. 49, the power supply line 313 and signal read line 307 do not cross each other, and thus the parasitic capacitance of the power supply line 313 can be eliminated. The numbers of signal read a-Si TFTs 301, power supply lines 313 for the protective diode, and other inter-connections are not limited to the above ones, and may be arbitrarily set with the above-described merits.

In addition, an interlevel insulating film may be formed on the TFT array, and a top pixel electrode in contact with and equal in potential to the pixel electrode 303 via the through hole of the interlevel insulating film may be formed. With this structure, the opening rate (the occupation rate of the pixel electrode in one pixel) which is decreased by increases in numbers of power supply lines and the like can always be kept high regardless of the numbers of power supply lines and TFTs in one pixel.

Examples of the metal A47 are Ti, Cr, Ta, Mo, MoW, MoTa, Al, ITO, an Al alloy, and a stacked structure of these metals. Since the metal A47 is used for the gate line, MoW and MoTa are preferable because they allow taper-etching the gate electrode of the TFT so as to prevent the insulating film 323 stacked on the gate electrode from poor step coverage. An Al alloy can form a low-resistance gate line and is more preferable for a large-size detector because the Al alloy can prevent a hillock formed in a high-temperature step when only Al is used.

Examples of the metal B'48 are Ti, Cr, Ta, Mo, MoW, MoTa, Al, ITO, an Al alloy, and a stacked structure of these metals.

Examples of the metal B49 are Ti, Cr, Ta, Mo, MoW, MoTa, Al, ITO, an Al alloy, and a stacked structure of these metals. Since the metal B49 is used for the signal read line, the resistance is desirably low, and thus Al, an Al-stacked structure, an Al alloy, and the like are preferable. When the metal B'48 is used, the metal B'48 must be free from the influence of etching of the metal B49, or an etching method which does not influence the metal B'48 must be adopted.

Examples of the material for the top pixel electrode are Ti, Cr, Ta, Mo, MoW, MoTa, Al, ITO, and a stacked structure of these metals. The material must be one which does not influence the metal B49 in etching the top pixel electrode, or an etching method which does not influence the metal B49 must be adopted.

Examples of the metal C51 for forming the common electrode are Ti, Cr, Ta, Mo, MoW, MoTa, Al, ITO, an Al alloy, and a stacked structure of these metals.

Examples of the material for the insulating film 323 are $SiO_2$, $SiN_x$, $SiO_xN_y$, and a stacked structure of these metals.

Examples of the material for the passivation film are an inorganic insulating film such as an $SiN_x$ or $SiO_2$ film, and an organic insulating film such as polyimides, a BCB film, an HRC film, or a black resist.

Examples of the material for the interlevel insulating film are an inorganic insulating film such as an $SiN_x$ or $SiO_2$ film, and an organic insulating film such as polyimides, a BCB film, an HRC film, a Teflon resin film, or a black resist. Examples of the material for the X-ray/charge conversion film are a-Se and a-Si.

The a-Si TFT 301 is of an etching stopper type in the inverted staggered structure, but may be a back-channel cut type in the inverted staggered structure.

The etching stopper type TFT hardly varies in TFT characteristics and is suitable for a large-size array because the channel is protected in etching the TFT channel. The back-channel cut type TFT realizes a low manufacturing cost because the number of steps is smaller than in the etching stopper type TFT.

Si for forming the a-Si TFT 301 is a-Si (amorphous silicon). Instead, the a-Si TFT 301 can be formed from poly-Si (polysilicon) to downsize the a-Si TFT 301 and widen the effective pixel area. Further, since a peripheral circuit can be formed on the same glass substrate, the manufacturing cost including the cost of the peripheral circuit can be reduced.

Embodiment 5-5 has exemplified the scheme of reading charges stored in the pixel using the ON/OFF state of the TFT. This embodiment is more effective for a non-destructive read scheme using a source electrode follower principle because the numbers of TFTs 301 and power supply lines 313 in the pixel are large.

As described above, in the X-ray semiconductor detector of the direct conversion type suitable for a medical X-ray diagnostic apparatus, since the yield in forming the gate line is higher than the yield in forming the signal read line, the power supply line of the high-voltage protective diode in the pixel is formed along the gate line in forming the gate line. The detector can therefore be formed while preventing a decrease in yield.

(Embodiment 6: Pixel Electrode Made of Aluminum Alloy)

Figure 50:
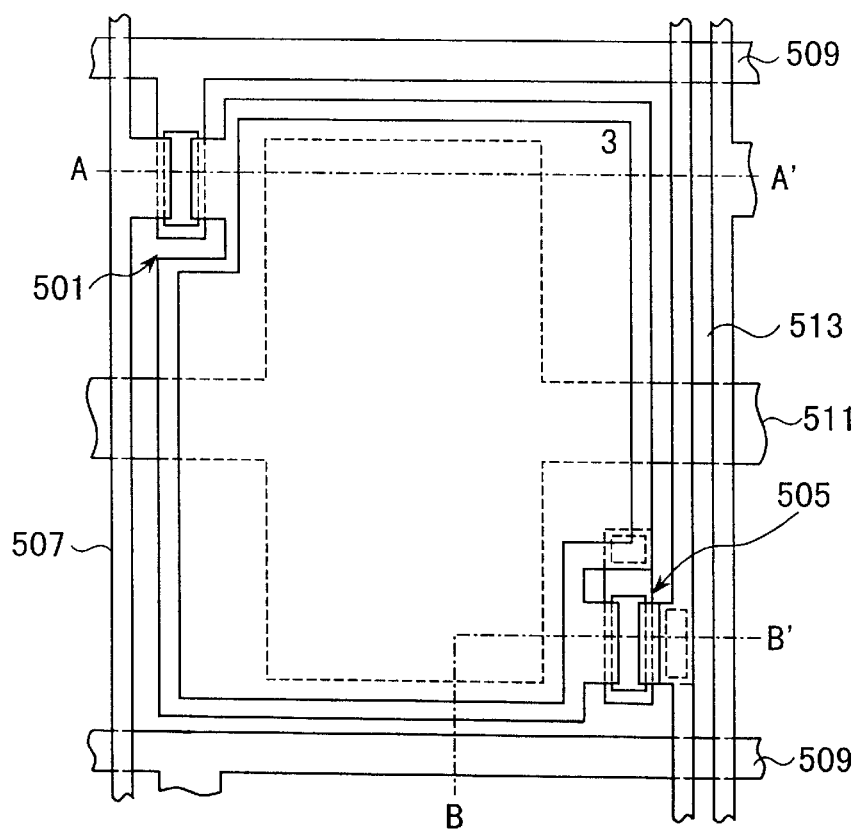
FIG. 50 is a plan view showing one pixel of an X-ray semiconductor detector according to Embodiment 6.

FIG. 50 is a plan view showing an X-ray semiconductor detector according to Embodiment 6. A power supply line 513 for the protective diode is formed parallel to and on a signal read line 507 via an insulating film. This is because the yield increases if the power supply line 513 is formed on a layer different from the signal read line 507 in a different step.

Figure 51A:
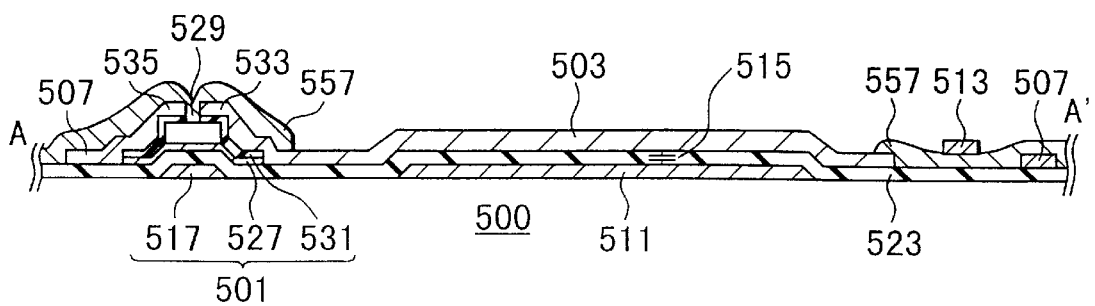
FIG. 51A is a sectional view taken along the line A–A' in FIG. 50.
Figure 51B:
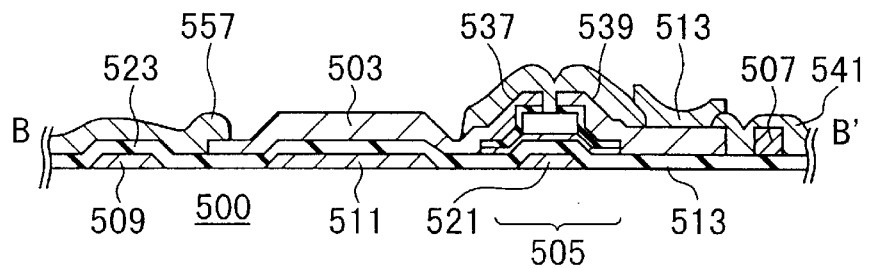
FIG. 51B is a sectional view taken along the line B–B' in FIG. 50.

FIG. 51A is a sectional view taken along the line A–A' in FIG. 50, and FIG. 51B is a sectional view taken along the line B–B' in FIG. 50. A gate electrode 517 of a signal read TFT 501, a gate line 509, an auxiliary electrode 511, and a gate electrode 521 of a protective diode 505 are formed from a metal A47 on a substrate 500. An insulating film 523 is formed on the obtained structure though the insulating film 523 is removed from the through hole of the protective diode 505. A pixel electrode 503 is formed from a metal B'48 on the insulating film 523 within a pixel except for the a-Si TFT 501 and protective diode 505. In the a-Si TFT 501 and protective diode 505, an a-Si film 527, an etching stopper $SiN_x$ film 529, and an $n^+$-type a-Si film 531 are formed on the insulating film 523. Source and drain electrodes 533 and 535 are formed from another metal B49 on the $n^+$-type a-Si film 531. The signal read line 507, an extraction pad, a voltage application line, source and drain electrodes 537 and 539 of the protective diode 505, and the like are also made of the metal B49. The pixel electrode 503 can be formed at the same time. In this case, the source electrode 533 of the TFT 501, the source electrode 537 of the protective diode 505, and the pixel electrode 503 are integrally formed. An insulating film 557 is formed on the resultant structure, and the power supply line 513 for the protective diode is formed from a metal E59 on the insulating film 557 parallel to the signal read line 507. For example, the pixel electrode 503 may be formed from this metal E59. The protective diode 505 and power supply line 513 are in contact with each other via the through hole of the insulating film 557 near the protective diode 505. Through holes are further formed in the insulating film 557 above the pixel electrode and the like. With this structure, the TFT array is complete.

A passivation film, an X-ray/charge conversion film, and a common electrode made of a metal C51 are formed on the TFT array.

Although not shown except for FIG. 50, the power supply line 513 is formed from the metal E59 along the gate line.

In FIG. 50, one TFT is used as the protective diode 505. Alternatively, the protective diode may be formed by series-connecting two or more TFTs to suppress the leakage current from the protective diode, or the leakage current from the protective diode may be reduced by any means. In addition, an interlevel insulating film may be formed on the TFT array, and a top pixel electrode 565 in contact with and equal in potential to the pixel electrode 503 via the through hole of the interlevel insulating film may be formed. With this structure, the opening rate (the occupation rate of the pixel electrode in one pixel) which is decreased by increases in numbers of power supply lines and the like can always be kept high regardless of the numbers of power supply lines and TFTs in one pixel.

Examples of the metal A47 are Ti, Cr, Ta, Mo, MoW, MoTa, Al, ITO, an Al alloy, and a stacked structure of these metals. Since the metal A47 is used for the gate line, MoW and MoTa are preferable because they allow taper-etching the gate electrode of the TFT so as to prevent the insulating film 523 stacked on the gate electrode from poor step coverage. An Al alloy can form a low-resistance gate line and is more preferable for a large-size detector because the Al alloy can prevent a hillock formed in a high-temperature step when only Al is used.

Examples of the metal B'48 for the pixel electrode 503 are Ti, Cr, Ta, Mo, MoW, MoTa, Al, ITO, an Al alloy, and a stacked structure of these metals. The pixel electrode 503 is most preferably formed from an aluminum alloy consisting of one or more metals selected from the group consisting of Ag, Nd, Au, Sm, Cu, Mn, Si, Ni, Co, Y, Fe, Sc, Pd, Ti, Pt, Zr, Cr, V, Rh, Hf, Ru, B, Ir, Nb, Mo, Ta, Os, Re, and W and aluminum. An aluminum alloy can form a low-resistance gate line and is more preferable for a large-size detector because the aluminum alloy can prevent a hillock formed in a high-temperature step when only Al is used.

Examples of the metal B49 are Ti, Cr, Ta, Mo, MoW, MoTa, Al, ITO, an Al alloy, and a stacked structure of these metals. Since the metal B49 is used for the signal read line, the resistance is desirably low, and thus Al, an Al-stacked structure, an Al alloy, and the like are preferable. When the metal B'48 is used, the metal B'48 must be free from the influence of etching of the metal B49, or an etching method which does not influence the metal B'48 must be adopted.

Examples of the metal E59 are Ti, Cr, Ta, Mo, MoW, MoTa, Al, ITO, an Al alloy, and a stacked structure of these metals. Note that the metals B'48 and B49 must be free from the influence of etching of the metal E59, or an etching method which does not influence the metals B'48 and B49 must be adopted.

Examples of the material for the top pixel electrode are Ti, Cr, Ta, Mo, MoW, MoTa, Al, ITO, and a stacked structure of these metals. The material must be one which does not influence the metal B49 in etching the top pixel electrode, or an etching method which does not influence the metal B49 must be adopted.

Examples of the metal C51 for forming the common electrode are Ti, Cr, Ta, Mo, MoW, MoTa, Al, ITO, an Al alloy, and a stacked structure of these metals.

Examples of the material for the insulating film 523 are $SiO_2$, $SiN_x$, $SiO_xN_y$, and a stacked structure of these metals.

Examples of the material for the insulating film 557 are an inorganic insulating film such as an $SiN_x$ or $SiO_2$ film, and an organic insulating film such as polyimides, a BCB film, an HRC film, or a black resist.

Examples of the material for the passivation film are an inorganic insulating film such as an $SiN_x$ or $SiO_2$ film, and an organic insulating film such as polyimides, a BCB film, an HRC film, or a black resist.

Examples of the material for the interlevel insulating film are an inorganic insulating film such as an $SiN_x$ or $SiO_2$ film, and an organic insulating film such as polyimides, a BCB film, an HRC film, or a black resist.

Examples of the material for the X-ray/charge conversion film are a-Se and a-Si.

The TFT 501 is of an etching stopper type in the inverted staggered structure, but may be a back-channel cut type in the inverted staggered structure. The etching stopper type TFT hardly varies in TFT characteristics and is suitable for a large-size array because the channel is protected in etching the TFT channel. The back-channel cut type TFT realizes a low manufacturing cost because the number of steps is smaller than in the etching stopper type TFT.

Si for forming the TFT is a-Si (amorphous silicon). Instead, the TFT can be formed from poly-Si (polysilicon) to downsize the TFT and widen the effective pixel area. Further, since a peripheral circuit can be formed on the same glass substrate, the manufacturing cost including the cost of the peripheral circuit can be reduced.

Embodiment 6 has exemplified the scheme of reading charges stored in the pixel using the ON/OFF state of the TFT. This embodiment is more effective for a non-destructive read scheme using a source electrode follower principle because the numbers of TFTs and power supply lines in the pixel are large.

As described above, in the x-ray semiconductor detector of the direct conversion type, since the power supply line of the high-voltage protective diode in the pixel is formed from a layer different from the signal read and gate lines, the detector can be formed with the merits of Embodiments 1 and 2 while more effectively preventing a decrease in yield.

Moreover, the pixel electrode is formed from an Al alloy. Since an Al alloy can prevent a hillock formed in a high-temperature step when only Al is used, the Al alloy can form a lower-resistance gate line and is more preferable for a large-size detector.

(Embodiment 7-1; Signal Read Line is Arranged Below Gate Insulating Film of Signal Read a-Si TFT)

Figure 52:
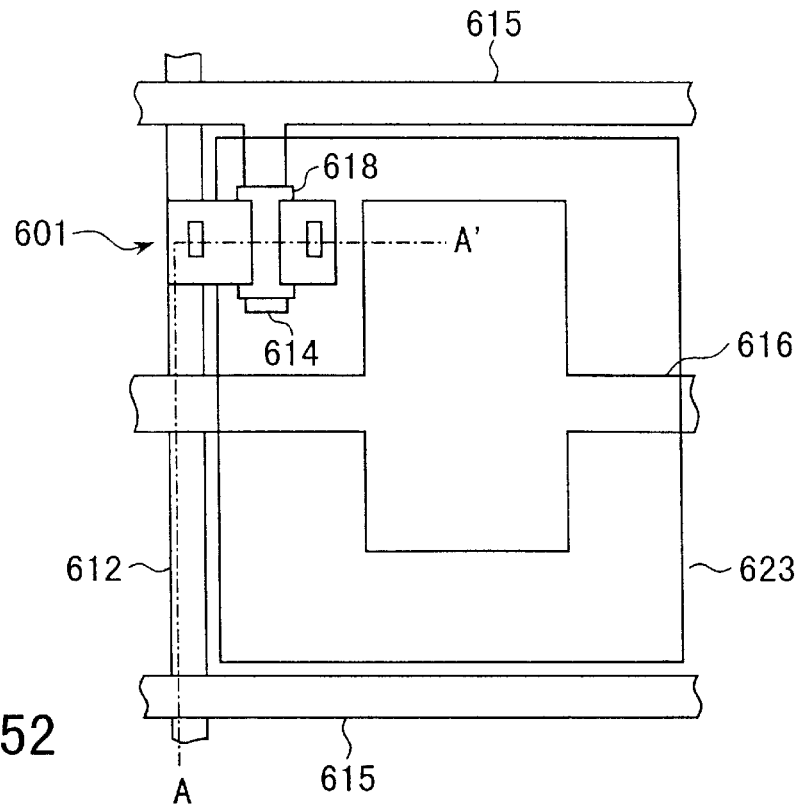
FIG. 52 is a plan view showing one pixel of an X-ray semiconductor detector according to Embodiment 7-1.
Figure 53:
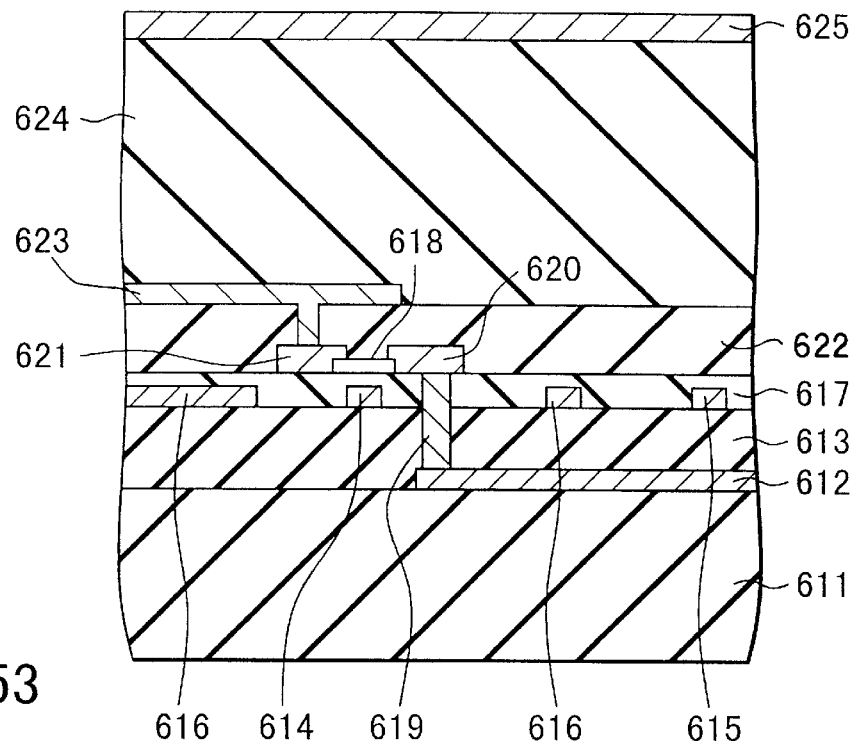
FIG. 53 is a sectional view taken along the line A–A' in FIG. 52.

FIG. 52 is a plan view showing one pixel of an X-ray semiconductor detector according to Embodiment 7-1. FIG. 53 is a sectional view taken along the line A–A' in FIG. 52. A signal read line 612 is formed on a glass substrate 611. In this embodiment, the X-ray semiconductor detector is of the indirect conversion type. A silicon oxide film 613 is formed as a lower insulating film on the glass substrate 611 having the signal read line 612. A gate electrode 614 of a signal read a-Si TFT 601, a gate line (address line) 615, and a storage capacitor line (including an storage capacitor electrode) 616 are formed as the same layer on the silicon oxide film 613. An insulating film 617 is formed on the resultant structure.

An a-Si film 618 serving as a channel formation layer of the a-Si TFT 601 is formed on the insulating film 617, and a silicon nitride film is formed as a stopper insulating film on the a-Si film 618. $N^+$-type a-Si films serving as source and drain electrodes are formed in regions corresponding to the two sides of the a-Si film 618, and connected to source and drain electrodes 621 and 620. The drain electrode 620 is connected to the signal read line 612 via a connection electrode 619.

An upper insulating film (passivation film or the like) 622 is formed on the insulating film 617. A pixel electrode 623 is formed on the upper insulating film 622 via a connection hole formed in the upper insulating film 622. Note that the storage capacitor line 616, pixel electrode 623, and insulating film sandwiched between them form an storage capacitor. Instead of the pixel electrode 623, the source electrode 621 may extend to serve as the other electrode of the storage capacitor. An a-Si photosensitive film (photoelectric conversion film) 624 is formed on the pixel electrode 623, and an upper electrode 625 is formed on the photosensitive film 624.

A process of manufacturing the structure shown in FIGS. 52 and 53 will be explained.

MoW or MoTa is deposited to 3,000 Å to form a signal read line 612 on a glass substrate 611. An $SiO_2$ film 613 is deposited to 6,000 Å as a lower insulating film by plasma CVD. An MoW film is deposited to 2,500 Å and patterned into a gate electrode 614, a gate line 615, and a storage capacitor line 616.

As an insulating film 617, $SiO_2$ and $Si_3N_4$ films are respectively stacked to 3,500 Å and 500 Å. An a-Si film 618 is formed to 500 Å on the insulating film 617, and an $Si_3N_4$ film is deposited to 2,000 Å as a stopper insulating film on the a-Si film 618. After a resist pattern is formed by backside exposure or the like, the $Si_3N_4$ film is etched using this resist pattern as a mask, and left on only the gate electrode. An $n^+$-type a-Si film is formed to 500A by plasma CVD. The $n^+$-type a-Si and a-Si films are etched to leave the a-Si film in an island shape. Then, Mo and Al are respectively deposited to 500A and 3,500 Å, and patterned into source and drain electrodes 621 and 620 of an a-Si TFT.

As an upper insulating film 622, an $Si_3N_4$ film, and an acrylic photosensitive resin, Optomer PC, or BCB film are respectively formed to 2,000 Å and 3 μm. A contact hole is formed in the upper insulating film 622. A pixel electrode 623 is formed from ITO on the insulating film 622. An a-Si photosensitive film 624 is formed, and an Al upper electrode 625 is formed on the photosensitive film 624.

Since the signal read line 612 is arranged below the insulating film 617 of the signal read a-Si TFT 601 in this way, the silicon oxide film 613, insulating film 617, and upper insulating film 622 are interposed between the signal read line 612 and photosensitive film 624.

Accordingly, the insulating film (613, 617, and 622) between the signal read line 612 and photosensitive film 624 can be substantially made thick to greatly reduce noise caused by coupling between the signal read line, pixel electrode, and photosensitive film. In particular, noise in the upper electrode of the photosensitive film to which a high voltage of several kV is applied, and noise in the pixel electrode whose potential rises due to a strong X-ray can be reduced. Further, noise caused by coupling between the signal read, gate, and storage capacitor lines 612, 615, and 616 can be greatly reduced. If the pixel electrode 623 is further formed on the signal read line 612, the opening rate of the pixel can increase, e.g., about 15%, and thus the ratio of the signal current can increase about 15% to increase the S/N ratio.

(Embodiment 7-2; Signal Read Line is Arranged Below Insulating Film of Signal Read TFT)

Figure 54:
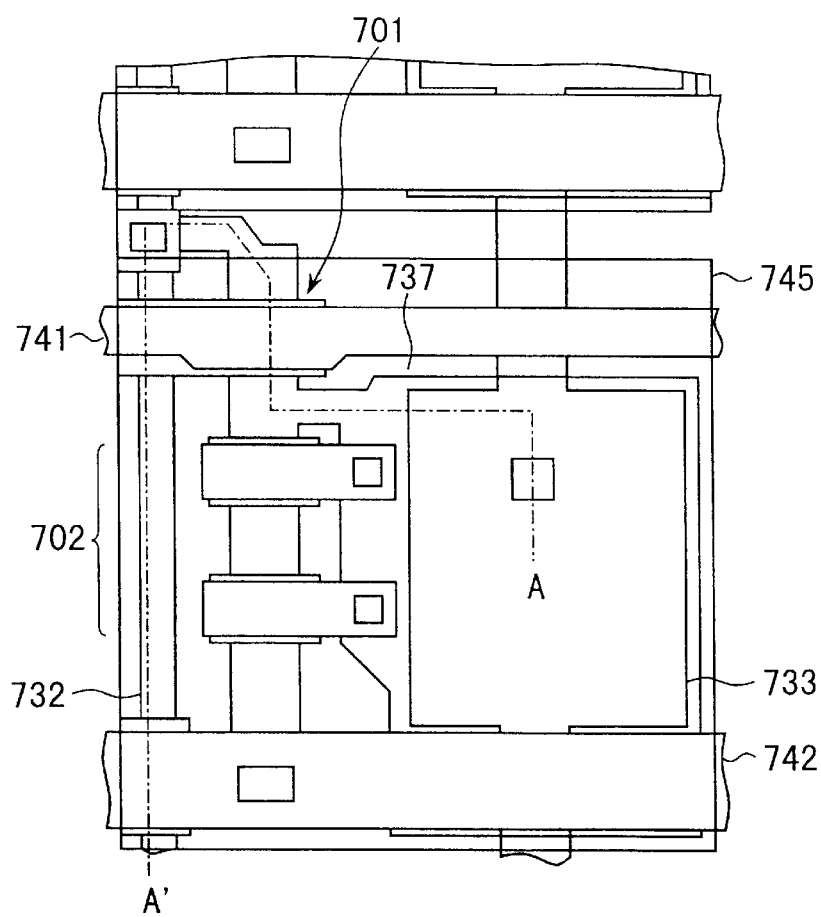
FIG. 54 is a plan view showing one pixel of an X-ray semiconductor detector according to Embodiment 7-2.
Figure 55:
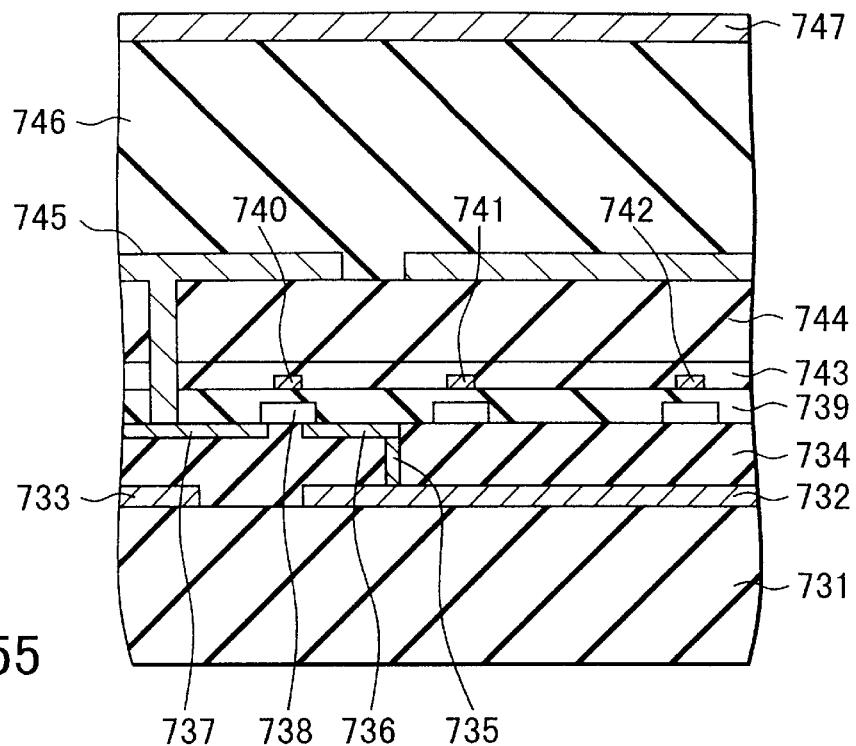
FIG. 55 is a sectional view showing one pixel of the X-ray semiconductor detector according to Embodiment 7-2.

FIG. 54 is a plan view showing one pixel of an X-ray semiconductor detector according to Embodiment 7-2. FIG. 55 is a sectional view taken along the line A–A' in FIG. 54. In this embodiment, the X-ray semiconductor detector is of the indirect conversion type.

Signal read and storage capacitor lines 732 and 733 are formed on a glass substrate 731, and a silicon oxide film 734 is formed as a lower insulating film on the signal read and storage capacitor lines 732 and 733. Source and drain electrodes 737 and 736 of a signal read a-Si TFT 701 are formed on the silicon oxide film 734. Note that the source and drain electrodes of a protective diode 702 are simultaneously formed in the same step as the source and drain electrodes 737 and 736 of the signal read a-Si TFT 701. The source electrode 737 of the signal read a-Si TFT 701 extends to the upper electrode of an storage capacitor, and the drain electrode 736 is connected to the signal read line 732 via a connection electrode 735.

An a-Si film 738 serving as a channel formation layer of the a-Si TFT 701 or the like is formed on the lower insulating film 734, and an insulating film 739 of the a-Si TFT 701 is formed on the a-Si film 738. A gate electrode 740 of the signal read a-Si TFT 701, a gate electrode of the protective diode 702, a gate line (address line) 741, and a power supply line (bias line) 742 of the protective diode 702 are formed on the insulating film 739.

Upper insulating films 743 and 744 are formed on the obtained structure. A pixel electrode 745 is formed on the insulating film 744 via a connection hole formed in the insulating films 743 and 744. An a-Si X-ray/charge conversion film 746 is formed on the pixel electrode 745, and an upper electrode 747 is formed on the X-ray/charge conversion film 746.

A process of manufacturing the structure shown in FIGS. 54 and 55 will be explained.

MoW or MoTa is deposited to 3,000 Å to form signal read and storage capacitor lines 732 and 733 on a glass substrate 731. An $SiO_2$ film is deposited to 6,000 Å as a lower insulating film 734 by plasma CVD, and a contact hole is formed in this $SiO_2$ film. An MoW film is formed to 2,500 Å and patterned into source and drain electrodes 737 and 736 of an a-Si TFT 701. At the same time, the upper electrode 747 of the storage capacitor is formed. The source and drain electrodes 737 and 736 are processed by $PH_3$ plasma. An a-Si film 738 is formed to 1,000 Å. At this time, $n^+$-type a-Si films are formed on the source and drain electrodes 737 and 736 by the $PH_3$ plasma processing.

A silicon nitride film is formed to 3,000 Å as an insulating film 739. An Al alloy is formed to 3,000 Å and patterned into a gate electrode 740, an gate line 741, and a power supply line 742 of a protective diode. As an upper insulating film, an $SiN_x$ film (passivation film) 743, and an acrylic photosensitive resin, Optomer PC, or BCB film (interlevel insulating film) 744 are respectively formed to 3,000 Å and 3 μm. A contact hole is formed in the upper insulating film.

After a pixel electrode 745 is formed from ITO, an X-ray/charge conversion film 746 using an X-ray/charge conversion film is formed, and an Al upper electrode 747 is formed on the X-ray/charge conversion film 746.

With the structure shown in FIGS. 54 and 55, the lower insulating film 734, insulating film 739, and upper insulating films 743 and 744 are interposed between the signal read line 732, pixel electrode 745, and X-ray/charge conversion film 746. Hence, noise caused by coupling between the signal read, gate, and power supply lines 732, 741, and 742 can also be reduced. Further, since the signal read and storage capacitor lines 732 and 733 are arranged parallel, noise caused by coupling between the signal read and storage capacitor lines can also be reduced. If the pixel electrode 745 is formed on the signal read line 732, the opening rate of the pixel can increase, e.g., about 15%, and thus the rate of the signal current can increase about 15% to increase the S/N ratio.

(Embodiment 8)

Figure 56:
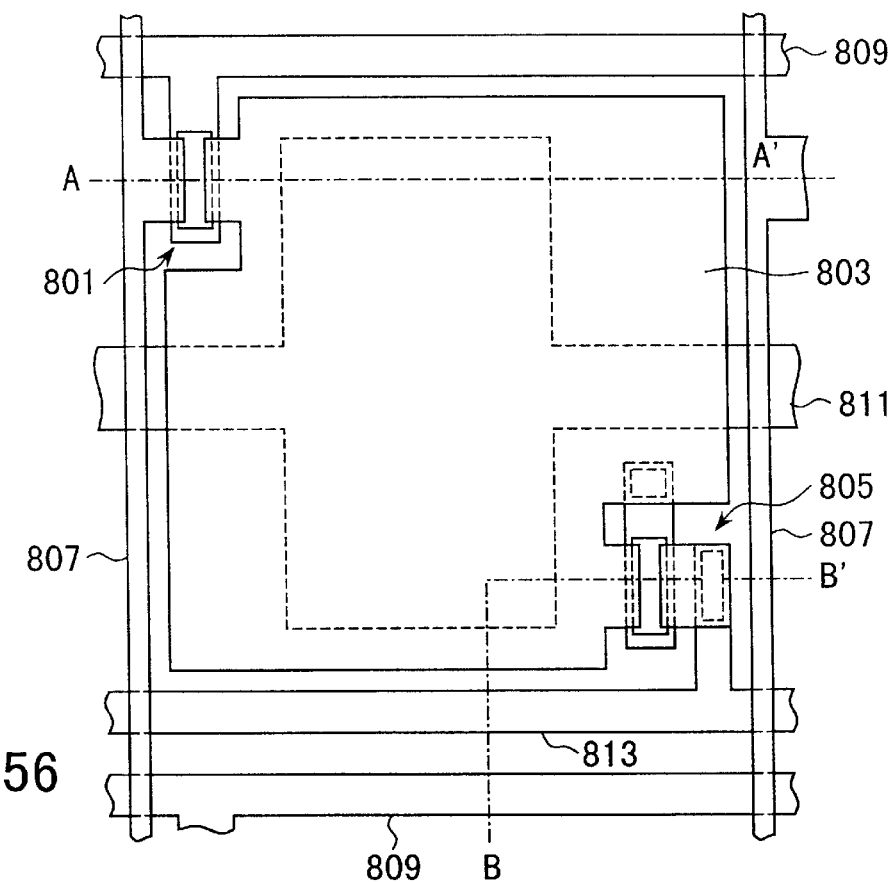
FIG. 56 is a plan view showing one pixel of an X-ray semiconductor detector according to Embodiment 8.

FIG. 56 is a plan view showing one pixel of an X-ray semiconductor detector according to Embodiment 8. As shown in FIG. 56, a pixel is made up of an amorphous thin-film transistor (a-Si TFT) 801, a pixel electrode 803, a protective diode 805, a signal read line (signal line) 807, a gate line (scanning line) 809, an auxiliary electrode 811, and a power supply line (bias line) 813 of the protective diode 805.

The power supply line 813 for the protective diode is formed parallel to the gate line 809 on a layer different from the gate line 809. For this reason, no short circuit is generated between the gate and power supply lines 809 and 813 to more effectively prevent a decrease in yield. Also, various unpreferable phenomena caused by electrical interference such as noise can be avoided. Since the gate and power supply lines 809 and 813 are formed on different layers, the line interval can be decreased to form a large pixel electrode 803 and storage capacitor.

Figure 57A:
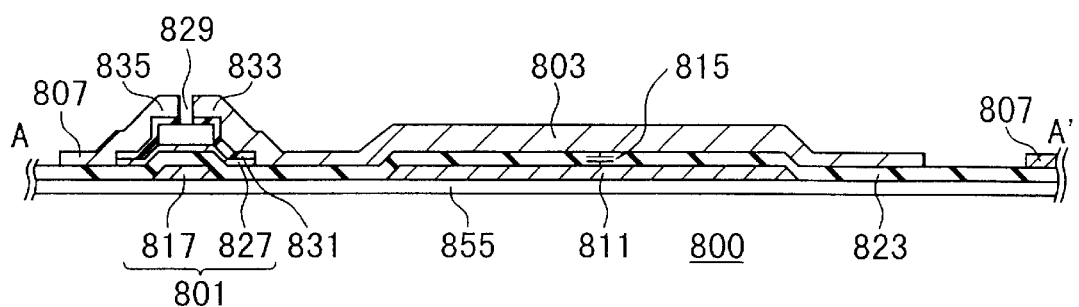
FIG. 57A is a sectional view taken along the line A–A' in FIG. 56.
Figure 57B:
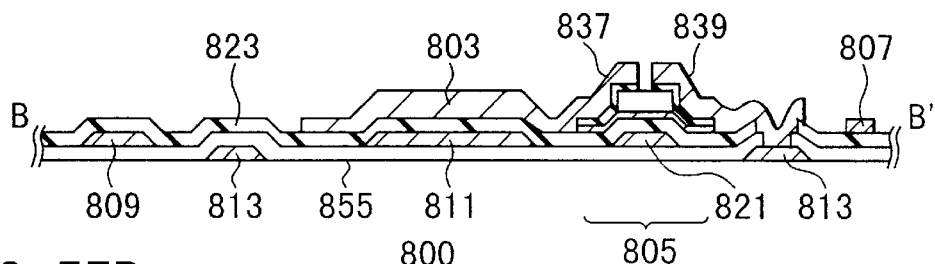
FIG. 57B is a sectional view taken along the line B–B' in FIG. 56.

FIG. 57A is a sectional view taken along the line A–A' in FIG. 56, and FIG. 57B is a sectional view taken along the line B–B' in FIG. 56. The power supply line 813 for the protective diode is formed from a metal D53 on a substrate 800. An insulating film 855 is formed on the power supply line 813 though the insulating film 855 is partially removed at the contact of a voltage application line, the contact between the power supply line 813 and protective diode 805, and the like.

A gate electrode 817 of the signal read TFT 801, the gate line 809, the auxiliary electrode 811, and a gate electrode 821 of the protective diode 805 are formed from a metal A47 on the insulating film 855. An insulating film 823 is formed on the gate electrodes 817 and 821.

Note that the insulating film 823 is partially removed at the through hole of the protective diode 805, and the like. The pixel electrode 803 is formed from a metal B'48 on the insulating film 823. An a-Si film 827, an etching stopper $SiN_x$ film 829, and an $n^+$-type a-Si film 831 are formed on the insulating film 823 in the a-Si TFT 801. Source and drain electrodes 833 and 835 are formed from another metal B49 on the $n^+$-type a-Si film 831. The signal read line 807, an extraction pad, a voltage application line, source and drain electrodes 837 and 839 of the protective diode 805, and the like are also formed from this metal B49. The pixel electrode 803 may be formed from the same metal B49. In this case, the source electrode 833 of the TFT 801, the source electrode 837 of the protective diode 805, and the pixel electrode 803 are integrally formed. With this structure, the TFT array is complete.

Although not shown in FIGS. 57A and 57B, a passivation film, an X-ray/charge conversion film, and a common electrode made of a metal C51 are formed on the TFT array. Accordingly, an X-ray semiconductor detector suitable for a medical X-ray diagnostic apparatus is realized.

Figure 58:
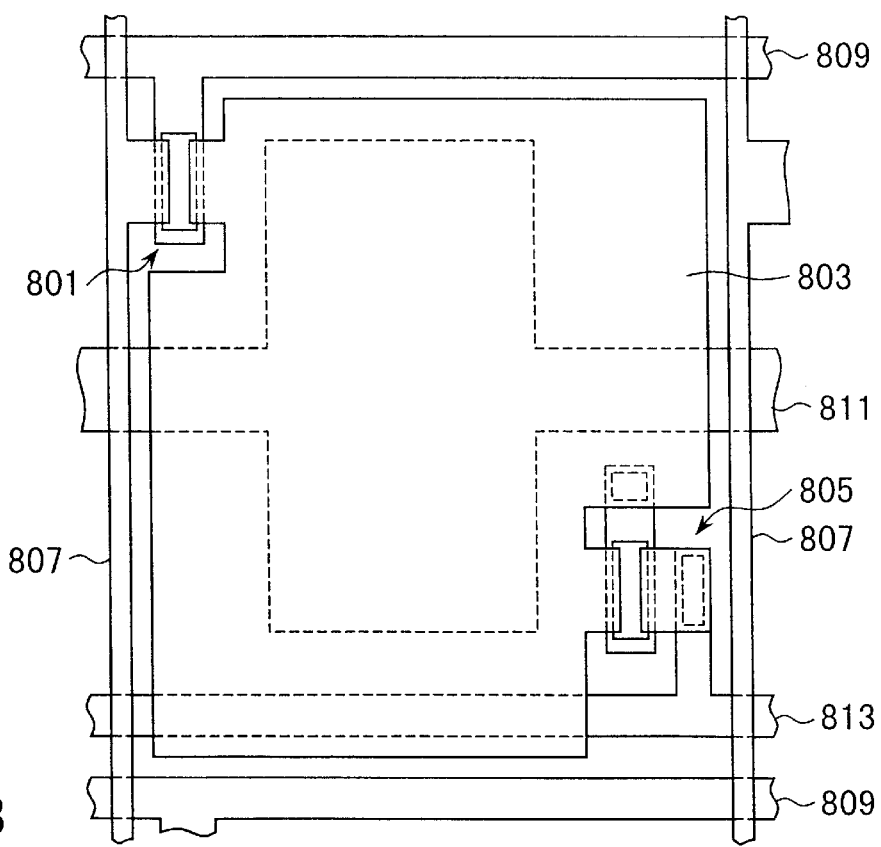
FIG. 58 is a plan view showing one pixel of another X-ray semiconductor detector according to Embodiment 8.
Figure 59:
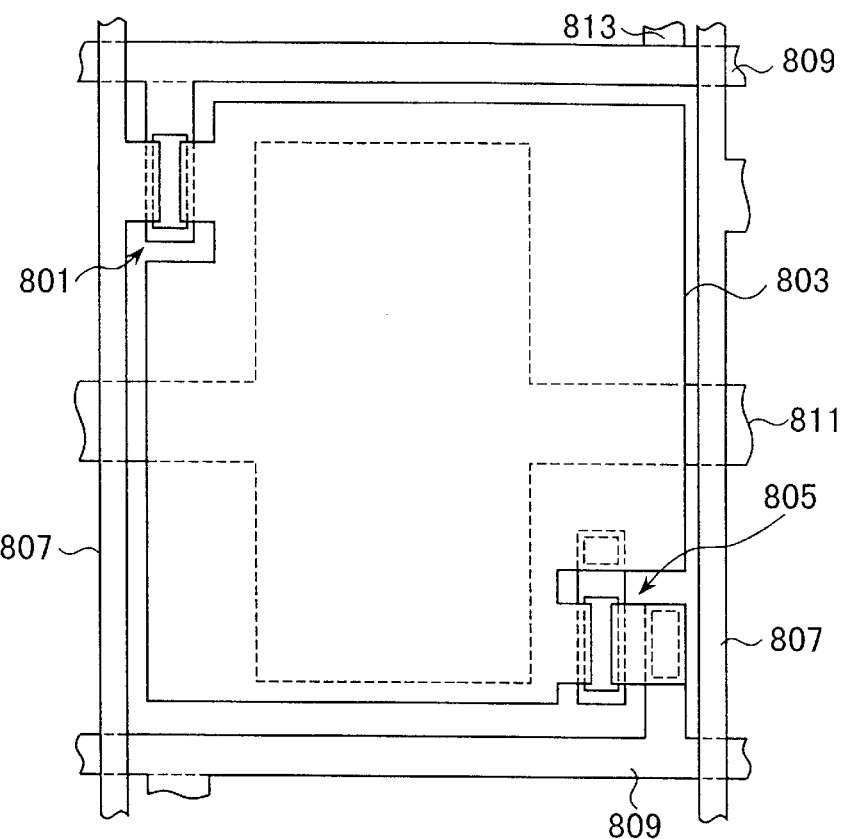
FIG. 59 is a plan view showing one pixel of still another X-ray semiconductor detector according to Embodiment 8.

In addition to the structure in FIG. 56, the pixel electrode 803 may overlap the power supply line 813, as shown in FIG. 58, or may be arranged below the gate line 809, as shown in FIG. 59. These structures can widen the effective pixel area.

Figure 60:
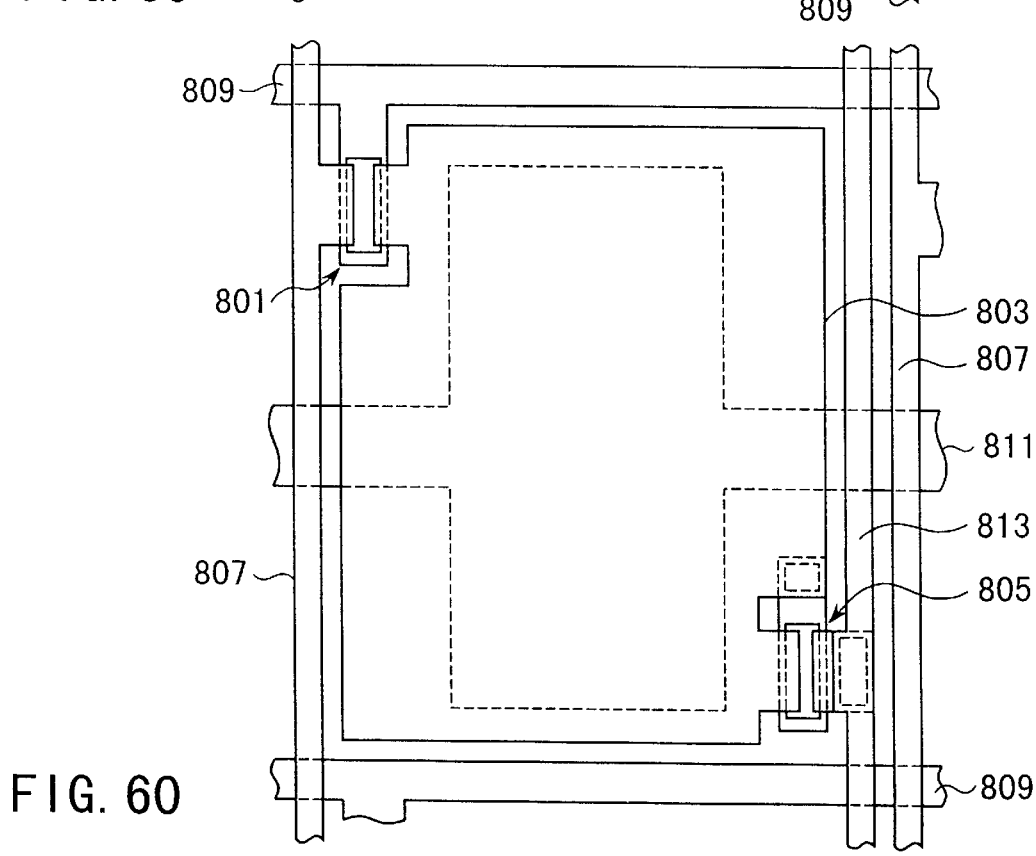
FIG. 60 is a plan view showing one pixel of still another X-ray semiconductor detector according to Embodiment 8.

In addition to the structure in FIG. 56, the power supply line 813 made of the metal D53 may be arranged parallel to the signal read line 807, as shown in FIG. 60. This structure can widen the effective pixel area and reduce the parasitic capacitance of the signal read line.

In FIG. 56, one TFT is used as the protective diode. Alternatively, the protective diode may be formed by series-connecting two or more TFTs to suppress the leakage current from the protective diode, or the leakage current from the protective diode may be reduced by any means.

Examples of the metal A47 are Ti, Cr, Ta, Mo, MoW, MoTa, Al, ITO, an Al alloy, and a stacked structure of these metals. Since the metal A47 is used for the gate line, MoW and MoTa are preferable because they allow taper-etching the gate electrode of the TFT 801 so as to prevent the insulating film 823 stacked on the gate electrode from poor step coverage. An Al alloy can form a low-resistance gate line and is more preferable for a large-size detector because the Al alloy can prevent a hillock formed in a high-temperature step when only Al is used.

Examples of the metal D53 are Ti, Cr, Ta, Mo, MoW, MoTa, Al, ITO, an Al alloy, and a stacked structure of these metals. Since the metal D53 is used under the same conditions as the gate line, preferable examples of the metal A47 can also be applied to the metal D53.

Examples of the metal B'48 are Ti, Cr, Ta, Mo, MoW, MoTa, Al, ITO, an Al alloy, and a stacked structure of these metals.

Examples of the metal B49 are Ti, Cr, Ta, Mo, MoW, MoTa, Al, ITO, an Al alloy, and a stacked structure of these metals. Since the metal B49 is used for the signal read line 807, the resistance is desirably low, and thus Al, an Al-stacked structure, an Al alloy, and the like are preferable. When the metal B'48 is used, the metal B'48 must be free from the influence of etching of the metal B49, or an etching method which does not influence the metal B'48 must be adopted.

Examples of the material for the top pixel electrode are Ti, Cr, Ta, Mo, MoW, MoTa, Al, ITO, and a stacked structure of these metals. The material must be one which does not influence the metal B49 in etching the top pixel electrode, or an etching method which does not influence the metal B49 must be adopted.

Examples of the metal C51 for forming the common electrode are Ti, Cr, Ta, Mo, MoW, MoTa, Al, ITO, an Al alloy, and a stacked structure of these metals.

Examples of the material for the insulating film 823 are $SiO_2$, $SiN_x$, $SiO_xN_y$, and a stacked structure of these metals.

Examples of the material for the insulating film 855 are $SiO_2$, $SiN_x$, $SiO_xN_y$, and a stacked structure of these metals.

Examples of the material for the passivation film are an inorganic insulating film such as an $SiN_x$ or $SiO_2$ film, and an organic insulating film such as polyimides, a BCB film, an HRC film, or a black resist.

Examples of the material for the interlevel insulating film are an inorganic insulating film such as an $SiN_x$ or $SiO_2$ film, and an organic insulating film such as polyimides, a BCB film, an HRC film, or a black resist.

An example of the material for the X-ray/charge conversion film is an a-Se and a-Si.

The TFT 801 is of an etching stopper type in the inverted staggered structure, but may be a back-channel cut type in the inverted staggered structure. The etching stopper type TFT hardly varies in TFT characteristics and is suitable for a large-size array because the channel is protected in etching the TFT channel. The back-channel cut type TFT realizes a low manufacturing cost because the number of steps is smaller than in the etching stopper type TFT.

Si for forming the TFT 801 is a-Si (amorphous silicon). Instead, the TFT 801 can be formed from poly-Si (polysilicon) to downsize the TFT and widen the effective pixel area. Further, since a peripheral circuit can be formed on the same glass substrate, the manufacturing cost including the cost of the peripheral circuit can be reduced.

Embodiment 8 has exemplified the scheme of reading charges stored in the pixel using the ON/OFF state of the TFT. This embodiment is more effective for a non-destructive read scheme using a source electrode follower principle because the numbers of TFTs and power supply lines in the pixel are large.

As described above, since the power supply line of the high-voltage protective diode in the pixel is formed from a layer different from the gate line, no short circuit is generated between the power supply and gate lines to more effectively prevent a decrease in yield. Further, adverse effects such as harmful noise can be suppressed. Since the power supply and gate lines are formed from different layers, the line interval can be decreased to form a large pixel electrode and storage capacitor.

(Embodiment 9)

Figure 61:
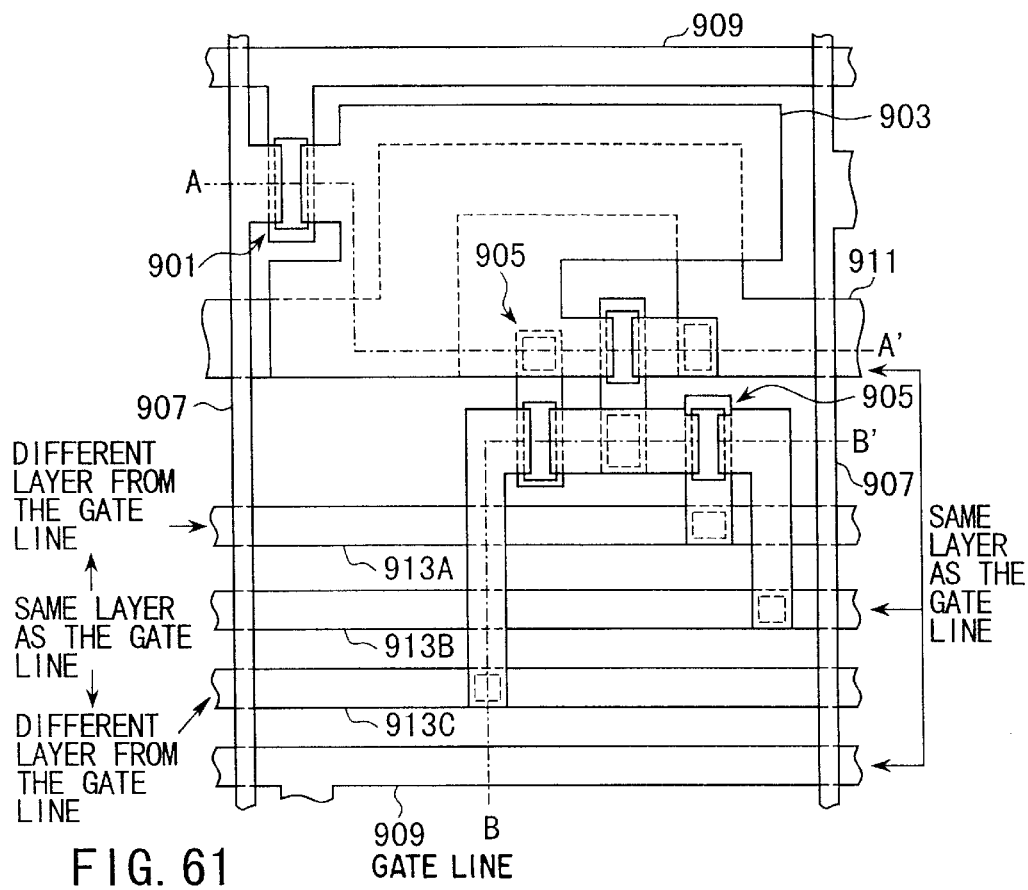
FIG. 61 is a plan view showing one pixel of an X-ray semiconductor detector according to Embodiment 9.

FIG. 61 is a plan view showing one pixel of an X-ray semiconductor detector according to Embodiment 9. A plurality of protective diodes 905 are arranged in one pixel. Each of a plurality of power supply lines 913 for the plurality of protective diodes 905 is formed parallel to a gate line 909 of a signal read TFT 901 on a layer different form the gate line 909 and/or other power supply lines 913. Since each power supply line 913 is formed parallel to the gate line 909, an electrical short circuit with the gate line 909 or another power supply line 913 can be prevented. Since each power supply line 913 is formed on a layer different from the gate line 909 or another power supply line 913, the line interval can be decreased to form a large pixel electrode and storage capacitor.

Figure 62A:
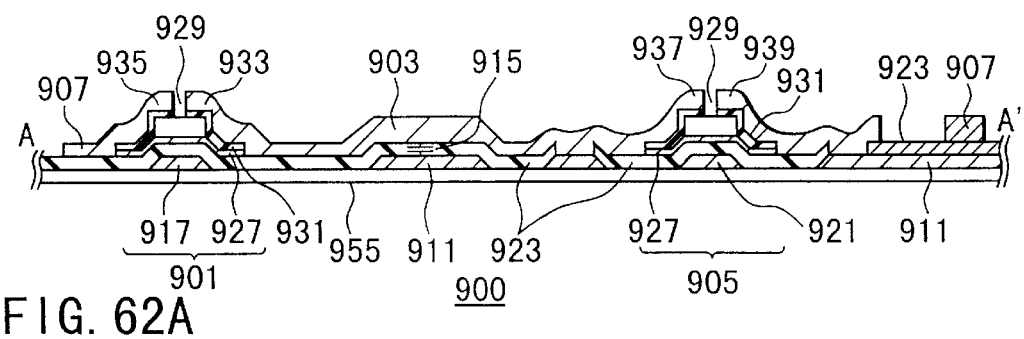
FIG. 62A is a sectional view taken along the line A–A' in FIG. 61.
Figure 62B:
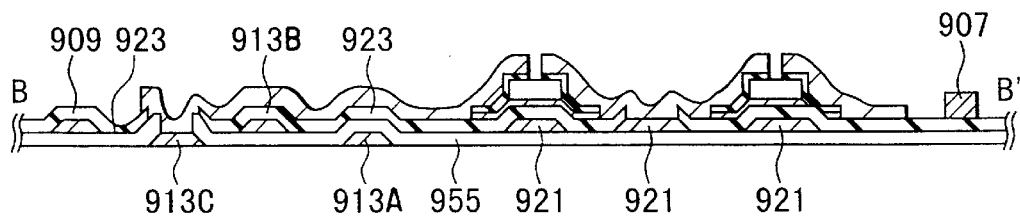
FIG. 62B is a sectional view taken along the line B–B' in FIG. 61.

FIG. 62A is a sectional view taken along the line A–A' in FIG. 61, and FIG. 62B is a sectional view taken along the line B–B' in FIG. 61. The power supply line 913A and 913C for the protective diode is formed from a metal D53 on a substrate 900. An insulating film 955 is formed on the power supply line 913 though the insulating film 955 is partially removed at the contact of a voltage application line, the contact between the power supply line 913A and 913C and protective diode 905, and the like. A gate electrode 917 of the TFT 901, the gate, line 909, an auxiliary electrode 911, a gate electrode 921 of the protective diode 905, and the power supply line 913B for the protective diode are formed from a metal A47 on the insulating film 955. An insulating film 923 is formed on the gate electrode 917 and the like though the insulating film 923 is removed from the through hole of the protective diode 905. A pixel electrode 903 is formed from a metal B'48 on the insulating film 923. An a-Si film 927, an etching stopper $SiN_x$ film 929, and an n$^+$-type a-Si film 931 are formed on the insulating film 923 of the a-Si TFT 901. Source and drain electrodes 933 and 935 are formed from another metal B49 on the n$^+$-type a-Si film 931. A signal read line 907, an extraction pad, a voltage application line, source and drain electrodes 937 and 939 of the protective diode 905, and the like are also formed from this metal B49.

The pixel electrode 903 may be formed at the same time. In this case, the source electrode 933 of the TFT 901, the source electrode 937 of the protective diode 905, and the pixel electrode 903 are integrally formed.

With this structure, the TFT array is complete. A passivation film, an X-ray/charge conversion film, and a common electrode made of a metal C51 are formed on the TFT array.

Although not shown except for FIG. 61, the pixel electrode 903 may be formed onto the power supply line 913. This structure can widen the effective pixel area.

Although not shown, an interlevel insulating film may be formed on the TFT array described in Embodiment 9, and a top pixel electrode in contact with and equal in potential to the pixel electrode 903 via the through hole of the interlevel insulating film may be formed. With this structure, the opening rate (the occupation rate of the pixel electrode in one pixel) which is decreased by increases in numbers of power supply lines and the like can always be kept high regardless of the numbers of power supply lines and TFTs in one pixel.

The numbers of pixel switch TFTS, protective diodes, power supply lines, and other interconnections are not limited to the above ones, and may be arbitrarily set.

Examples of the metal A47 are Ti, Cr, Ta, Mo, MoW, MoTa, Al, ITO, an Al alloy, and a stacked structure of these metals. Since the metal A47 is used for the gate line, MoW and MoTa are preferable because they allow taper-etching the gate electrode of the TFT so as to prevent the insulating film 923 stacked on the gate electrode from poor step coverage. An Al alloy can form a low-resistance gate line and is more preferable for a large-size detector because the Al alloy can prevent a hillock formed in a high-temperature step when only Al is used.

Examples of the metal D53 are Ti, Cr, Ta, Mo, MoW, MoTa, Al, ITO, an Al alloy, and a stacked structure of these metals. Since the metal D53 is used under the same conditions as the gate line, preferable examples of the metal A47 can also be applied to the metal D53.

Examples of the metal B'48 are Ti, Cr, Ta, Mo, MoW, MoTa, Al, ITO, an Al alloy, and a stacked structure of these metals.

Examples of the metal B49 are Ti, Cr, Ta, Mo, MoW, MoTa, Al, ITO, an Al alloy, and a stacked structure of these metals. Since the metal B49 is used for the signal read line, the resistance is desirably low, and thus Al, an Al-stacked structure, an Al alloy, and the like are preferable. When the metal B'48 is used, the metal B'48 must be free from the influence of etching of the metal B49, or an etching method which does not influence the metal B'48 must be adopted.

Examples of the material for the top pixel electrode are Ti, Cr, Ta, Mo, MoW, MoTa, Al, ITO, and a stacked structure of these metals. The material must be one which does not influence the metal B49 in etching the top pixel electrode, or an etching method which does not influence the metal B49 must be adopted.

Examples of the metal C51 for forming the common electrode are Ti, Cr, Ta, Mo, MoW, MoTa, Al, ITO, an Al alloy, and a stacked structure of these metals.

Examples of the material for the insulating film 923 are $SiO_2$, $SiN_x$, $SiO_xN_y$, and a stacked structure of these metals.

Examples of the material for the insulating film 955 are $SiO_2$, $SiN_x$, $SiO_xN_y$, and a stacked structure of these metals.

Examples of the material for the passivation film are an inorganic insulating film such as an $SiN_x$ or $SiO_2$ film, and an organic insulating film such as polyimides, a BCB film, an HRC film, or a black resist.

Examples of the material for the interlevel insulating film are an inorganic insulating film such as an $SiN_x$ or $SiO_2$ film, and an organic insulating film such as polyimides, a BCB film, an HRC film, or a black resist.

An example of the material for the X-ray/charge conversion film is an a-Se and a-Si.

The TFT 901 is of an etching stopper type in the inverted staggered structure, but may be a back-channel cut type in the inverted staggered structure.

The etching stopper type TFT hardly varies in TFT characteristics and is suitable for a large-size array because the channel is protected in etching the TFT channel. The back-channel cut type TFT realizes a low manufacturing cost because the number of steps is smaller than in the etching stopper type TFT.

Si for forming the TFT is a-Si (amorphous silicon). Instead, the TFT can be formed from poly-Si (polysilicon) to downsize the TFT and widen the effective pixel area. Further, since a peripheral circuit can be formed on the same glass substrate, the manufacturing cost including the cost of the peripheral circuit can be reduced.

Embodiment 9 has exemplified the scheme of reading charges stored in the pixel using the ON/OFF state of the TFT. This embodiment is more effective for a non-destructive read scheme using a source electrode follower principle because the numbers of TFTs and power supply lines in the pixel are large.

As described above, in the X-ray semiconductor detector of the direct conversion type, as one of X-ray semiconductor detectors for a medical X-ray diagnostic apparatus, the high-voltage protective diode which has a smaller leakage current and hardly varies between pixels is employed in the pixel. The power supply lines (plurality) increased accordingly are formed from a layer different from the gate line or formed from different layers. This structure can prevent a short circuit between the gate and power supply lines or between the power supply lines to prevent a decrease in yield. Since the gate and power supply lines or the power supply lines are formed from different layers, the line interval can be decreased to form a large pixel electrode and storage capacitor.

Figure 63:
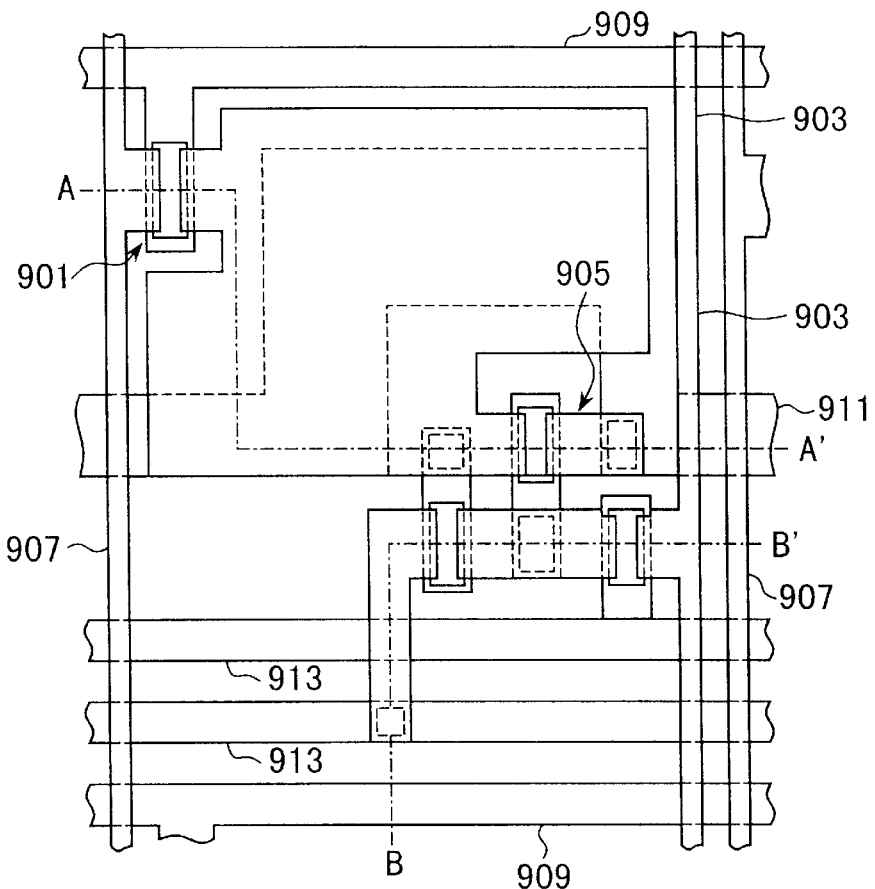
FIG. 63 is a plan view showing one pixel of another X-ray semiconductor detector according to Embodiment 9.
Figure 64A:
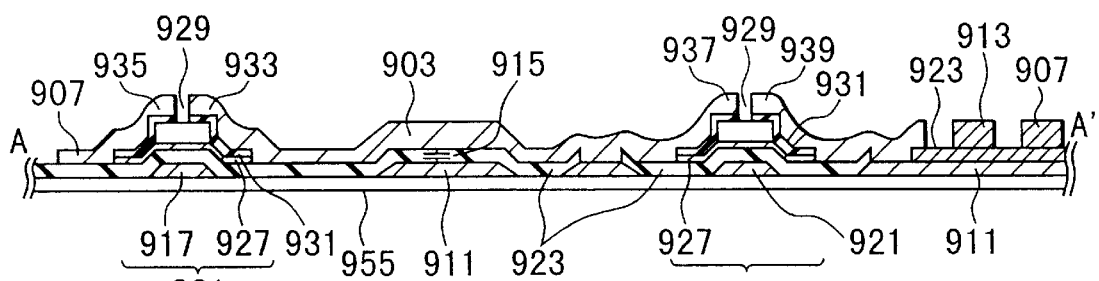
FIG. 64A is a sectional view taken along the line A–A' in FIG. 63.
Figure 64B:
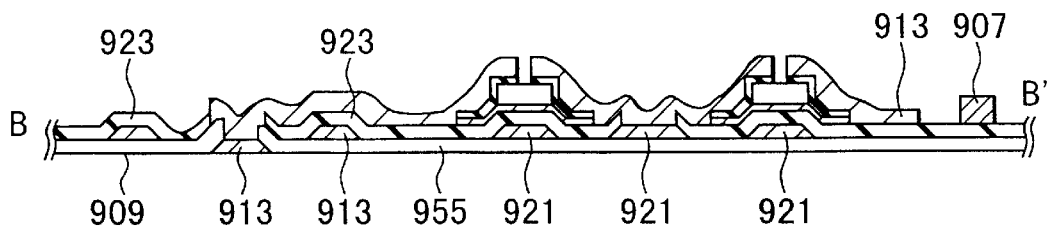
FIG. 64B is a sectional view taken along the line B–B' in FIG. 63.

In Embodiment 9, as shown in the plan view of FIG. 63, the sectional view of FIG. 64A taken along the line A–A' in FIG. 63, and the sectional view of FIG. 64B taken along the line B–B' in FIG. 63, two of the plurality of power supply lines 913 for the plurality of protective diodes 905 may be arranged parallel to the gate line 909 of the signal read TFT 901, and the remaining one power supply line 913 may be arranged parallel to the signal read line 907 of the signal read TFT 901.

Figure 65:
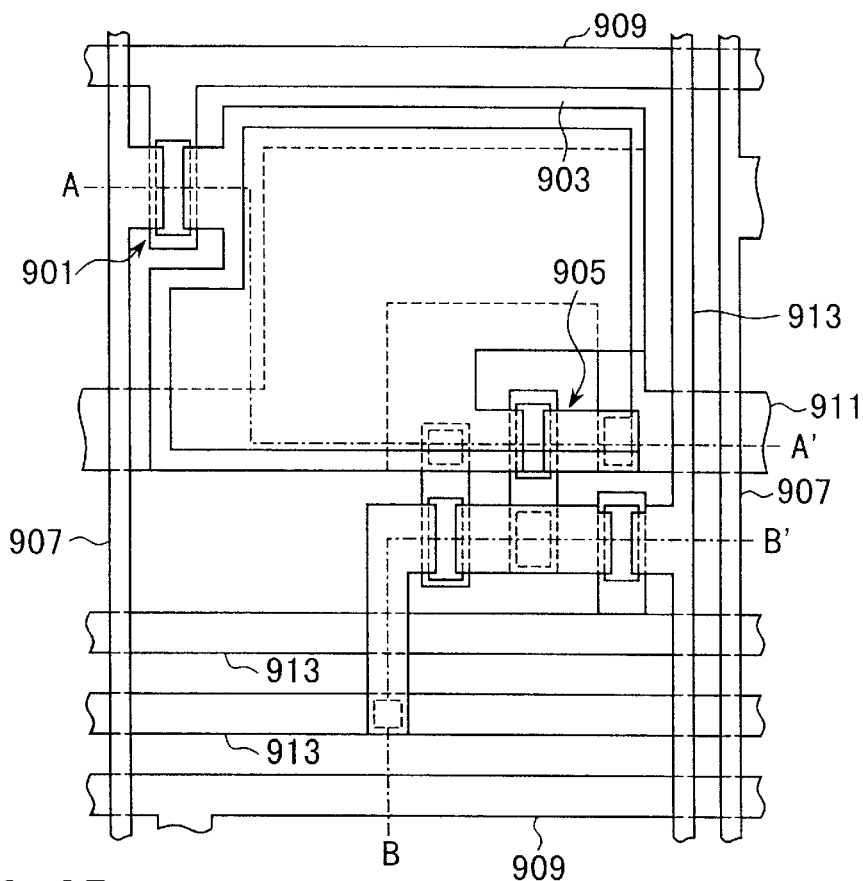
FIG. 65 is a plan view showing one pixel of still another X-ray semiconductor detector according to Embodiment 9.
Figure 66A:
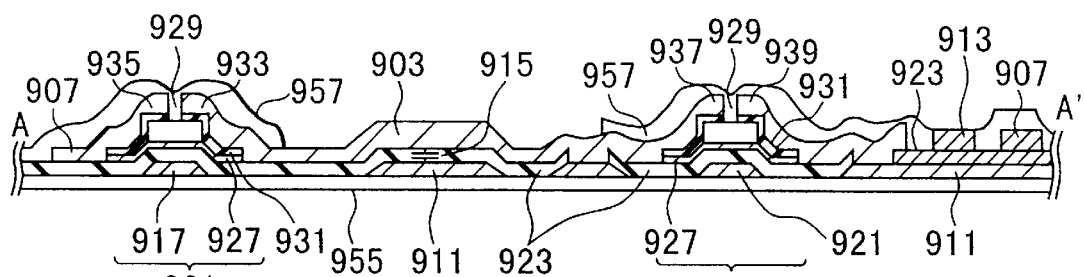
FIG. 66A is a sectional view taken along the line A–A' in FIG. 65.
Figure 66B:
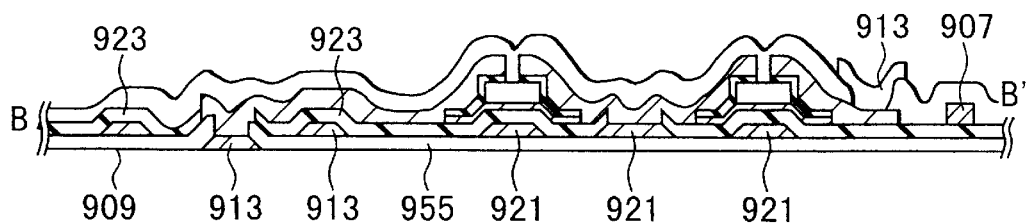
FIG. 66B is a sectional view taken along the line B–B' in FIG. 65.

In addition to the example of FIG. 63, as shown in FIGS. 65, 66A, and 66B, a power supply line 913 formed from the same layer as the signal line in the direction of the signal line may be formed from a metal E59 after an insulating film 957 is formed on the metal B49 which forms the signal line. This structure can prevent a short circuit between the signal and power supply lines 907 and 913 to prevent a decrease in yield in forming the signal and power supply lines 907 and 913. Furthermore, for example, the pixel electrode 903 may be formed from this metal E59.

(Embodiment 10)

Figure 67:
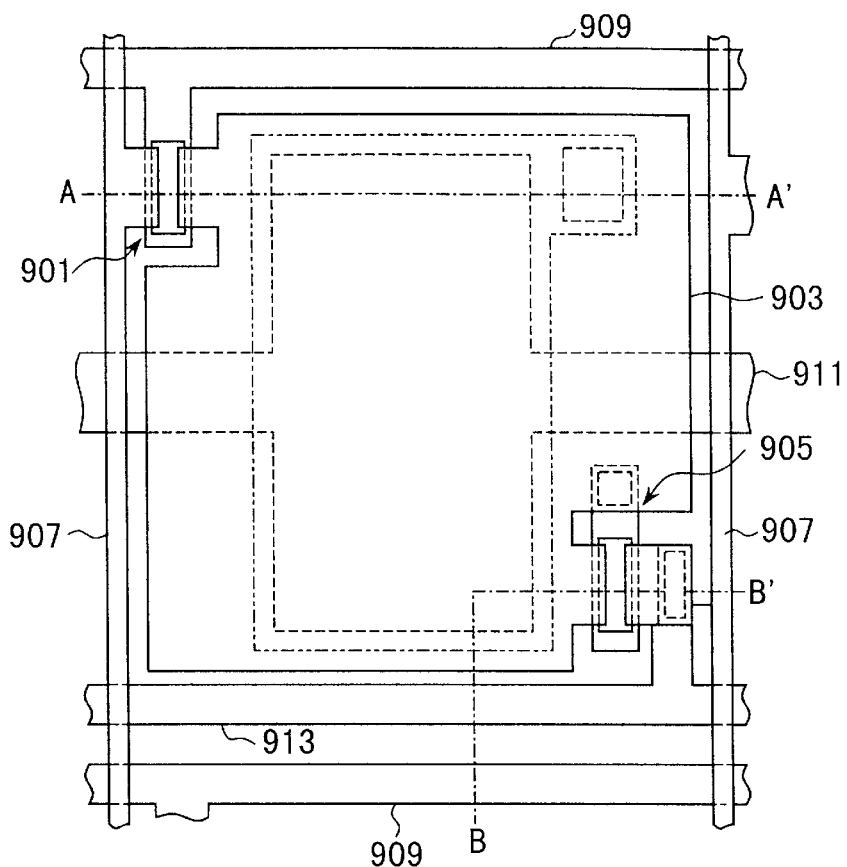
FIG. 67 is a plan view showing one pixel of an X-ray semiconductor detector according to Embodiment 10.
Figure 68A:
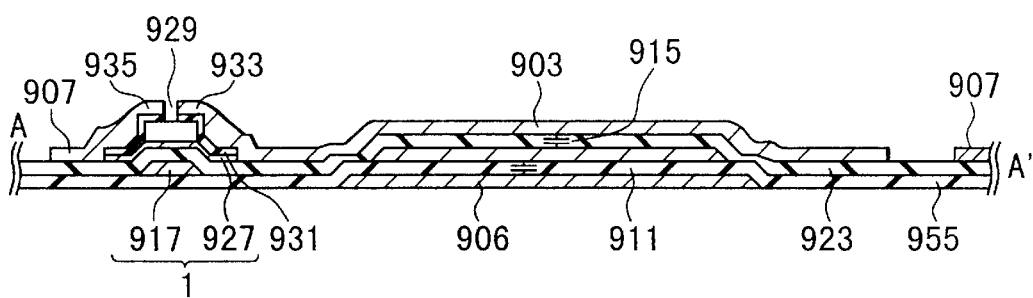
FIG. 68A is a sectional view taken along the line A–A' in FIG. 67.
Figure 68B:
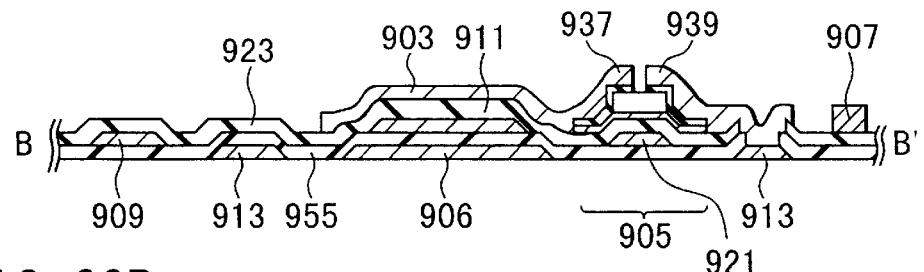
FIG. 68B is a sectional view taken along the line B–B' in FIG. 67.

FIG. 67 is a plan view showing one pixel of an X-ray semiconductor detector according to Embodiment 10. FIG. 68A is a sectional view taken along the line A–A' in FIG. 67, and FIG. 68B is a sectional view taken along the line B–B' in FIG. 67. In FIGS. 67, 68A, and 68B, the same reference numerals as in FIGS. 61, 62A, and 62B denote the same parts, and a description thereof will be omitted.

A feature of Embodiment 10 is that a power supply line 913 for the protective diode is formed parallel to a gate line 909 on a layer different from the gate line 909, e.g., a layer below the gate line 909, and an insulating film 955 is sandwiched between the power supply and gate lines 913 and 909. This insulating film 955 can also be used for a pixel capacitor 915 to form a large pixel capacitor. In particular, when the number of protective diodes 905 increases to increase the number of power supply lines 913, the areas of pixel and auxiliary electrodes 903 and 911 decrease. In this case, Embodiment 10 is effective.

(Embodiment 11)

Figure 69:
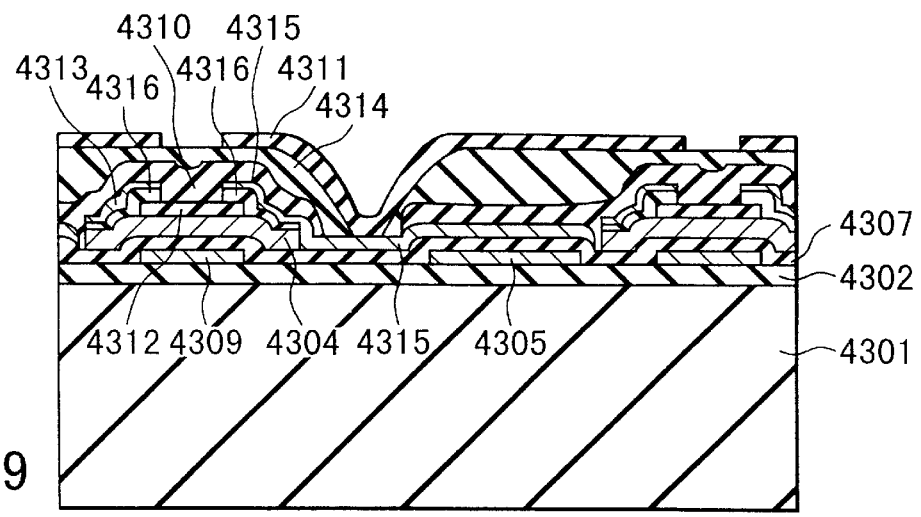
FIG. 69 is a sectional view showing one pixel of an X-ray semiconductor detector according to Embodiment 11.

FIG. 69 is a sectional view showing one pixel of an X-ray semiconductor detector according to Embodiment 11. A manufacturing method will be explained with reference to FIG. 69. An $SiO_x$ film 4302 is formed on a glass substrate 4301 by sputtering, CVD, or the like. MoTa, Ta, TaN, Ta/TaN, an Al alloy, Cu, MoW, or the like is deposited on the $SiO_x$ film 4302 to a thickness of 3,000 Å and etched to simultaneously form gate and capacitor electrodes 4309 and 4305. $SiO_x$ and $SiN_x$ are deposited on the gate and capacitor electrodes 4309 and 4305 to thickness of 3,000 Å and 500 Å, respectively, to form an insulating film 4307. A 1,000-Å thick a-Si layer 4304 is formed, and a 2,000-Å thick stopper $SiN_x$ layer 4312 is formed.

The stopper $SiN_x$ layer 4312 of the signal read TFT is patterned by backside exposure in conformity to the gate electrode. After an $n^+$-type a-Si layer (source and drain) 4316 is deposited to 500 Å, the $n^+$-type a-Si and a-Si layers of the TFT are etched into a-Si layer islands. Mo, an Al alloy, or the like is deposited on these islands to form drain and source electrodes 4313 and 4315, and the $n^+$-type a-Si layer at the channel of the TFT is etched. On its, a passivation $SiN_x$ film 4310 is formed.

An organic insulating film 4314 is formed from a photosensitive benzocyclobutene resin on the $SiN_x$ film 4310. This organic insulating film has a thickness of 3 to 4 $\mu$m at maximum. A via hole is formed in this organic insulating film so as to bring the pixel and source electrodes in contact with each other. This via hole has a circular shape. This is because when the via hole has a square shape, the stress may concentrate at the corner of the via hole to crack or peel the pixel electrode. Even when the via hole has a shape prepared by cutting square corners, concentration of the stress at the corner can be relaxed.

Then, an AlZr alloy is deposited to a thickness of 2,000 Å and etched into a pixel electrode 4311. Although an AlZr alloy having a high Zr concentration can more effectively prevent formation of a hillock, the etching rate for this AlZr alloy using an Al etching solution is low. Therefore, an AlZr alloy having a Zr concentration of 15 at. % is used for the pixel electrode 4311. The AlZr alloy is etched with an mixed acid of phosphoric, nitric, and acetic acids having the same composition as an Al etching solution. The etching rate of the AlZr alloy was about ½ the etching rate of Al. As a result of etching, when a 2,000-Å thick AlZr film was used for the pixel electrode and the overetching time was 10%, the minimum and maximum side etching amounts of each pixel in an 8 cm×8 cm pixel area were 0.1 $\mu$m and 0.2 $\mu$m, which are greatly smaller than the minimum and maximum side etching amounts of 0.5 $\mu$m and 10 $\mu$m when a 1,500-Å thick ITO film was used for the pixel electrode and the overetching time was 10%.

With this side etching amount in the use of AlZr, the maximum and minimum pixel areas are 9,980 $\mu m^2$ and about 9,960 $\mu m^2$ at a pixel electrode resist pattern size of 100 $\mu$m×100 $\mu$m. In the use of ITO, minimum pixel area/maximum pixel area 64.6%. To the contrary, in the use of AlZr, minimum pixel area/maximum pixel area =99.8%, which means that variations in pixel area could be greatly reduced.

Even when a 2,000-Å thick AlZr film was used for the pixel electrode and the overetching time was 200%, the maximum and minimum side etching amounts fell within 1 µm.

Even when an AlTi alloy having a Ti concentration of 10 at. % or an AlTi alloy having a Ti concentration of 15 at.% was used for the pixel electrode, the minimum pixel area was 99% or more the maximum pixel area, similar to AlZr, and variations in pixel area could be greatly reduced, compared to ITO.

(Embodiment 12)

Figure 70:
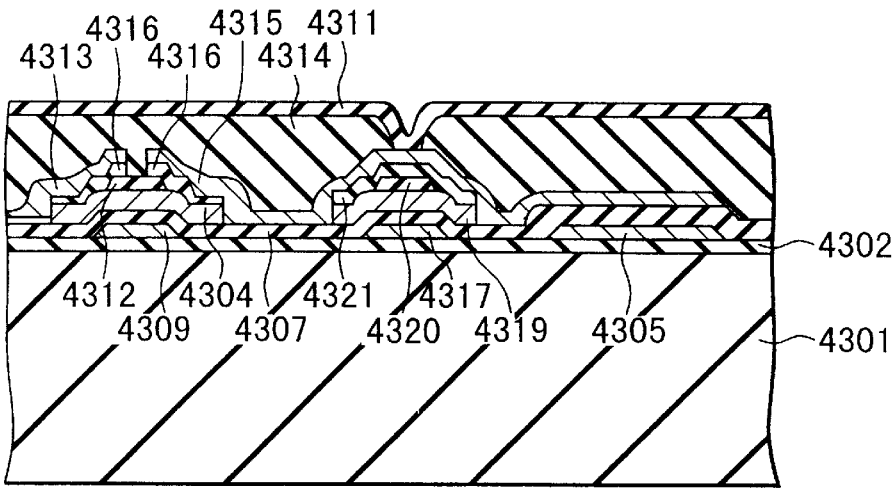
FIG. 70 is a sectional view showing one pixel of an X-ray semiconductor detector according to Embodiment 12.

FIG. 70 is a sectional view showing one pixel of an X-ray semiconductor detector according to Embodiment 12. In FIG. 70, the same reference numerals as in FIG. 69 denote the same parts, and a detailed description thereof will be omitted.

A feature of Embodiment 12 is that a layer 4317 made of the same metal as a gate electrode, an a-Si layer 4319, an $SiN_x$ layer 4320, and an $n^+$-type a-Si layer 4321 are stacked at the contact between pixel and source electrodes 4311 and 4315. This structure can reduce the step of the organic insulating film at the via hole to prevent errors such as a crack or poor step coverage of the pixel electrode at this portion.

(Embodiment 13)

Figure 71:
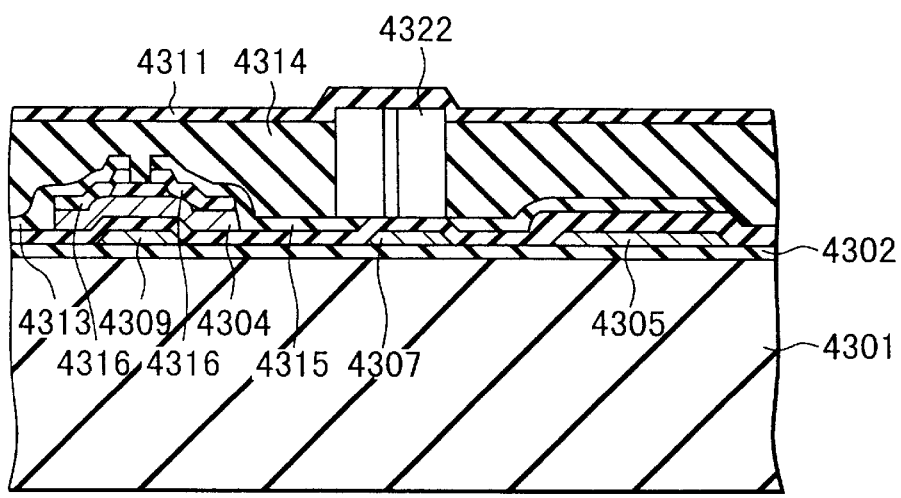
FIG. 71 is a sectional view showing one pixel of an X-ray semiconductor detector according to Embodiment 13.
Figure 72:
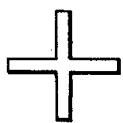
FIG. 72 is a plan view showing a contact bump in FIG. 71.

FIG. 71 is a sectional view showing one pixel of an X-ray semiconductor detector according to Embodiment 13. In FIG. 71, the same reference numerals as in FIG. 69 denote the same parts, and a detailed description thereof will be omitted. A feature of Embodiment 13 is that a bump 4322 is formed at the contact between a source electrode 4316 and a pixel electrode. The bump 4322 has a high aspect ratio. FIG. 72 shows the planar shape of this bump 4322. The planar shape of the bump 4322 is basically a narrow stripe. In this case, the planar shape is a cross shape.

Since the bump 4322 has a narrow stripe, an organic insulating film left on the electrode during spin coating can be reduced in forming the organic insulating film. Since the bump 4322 has a cross shape, and the bump strength can increase to prevent peeling or bending of the bump 4322 during the process.

The cross-shaped bump 4322 is preferably formed by RIE as anisotropic etching. By forming this bump 4322, the organic insulating film can be uniformly dissolved in a developing solution to expose the bump top onto the organic insulating film, thereby forming the contact between the source and pixel electrodes without any photolithography. This method can prevent errors such as peeling of the organic insulating film adhered to a photomask during exposure in photolithography, and cracks or peeling of the pixel electrode at the via hole after forming the pixel electrode.

Examples of the material for the organic insulating film used in this embodiment are a benzocyclobutene resin, an acrylic resin, a polyimide resin. Examples of the material for the pixel electrode are an AlZr alloy, and in addition a metal mainly made of one or a plurality of metals selected from the group consisting of Ag, Au, Cu, Ni, Co, Fe, Ti, Pt, Zr, Cr, V, Nb, Mo, Ta, and W, as a metal which does not form a hillock upon heating during deposition of an X-ray/charge conversion film. These metals are considered not to form a hillock because their melting points are higher than that of Al and their thermal expansion coefficients are smaller than that of Al. Non problem that the rectifying is lowered by a reaction between the metal and the doped Se occur.

Ti, Zr, and Ta do not form any hillock and can increase the sensitivity of the detector. These metals allow forming an oxide film on their surfaces, and this oxide film can function as a barrier with respect to electrons or holes to reduce a leakage current which may decrease the sensitivity.

Another example of the material for the pixel electrode is an alloy prepared by doping, in Al, one or more metals selected from the group consisting of Ag, Nd, Au, Sm, Cu, Mn, Si, Ni, Co, Y, Fe, Sc, Pd, Ti, Pt, Zr, Cr, V, Rh, Hf, Ru, B, Ir, Nb, Mo, Ta, Os, Re, and W. These metals have melting points higher than that of Al, and do not form any hillock owing to an effect of preventing migration of Al during heat treatment. The lowering of the rectifying due to the reaction with the metal don't occur.

An oxide film about 10 Å thick is formed in the atmosphere on the surface of an Al alloy doped using these metals. This oxide film can increase the sensitivity of the detector because the oxide film is chemically stable and allows forming a high-quality X-ray/charge conversion film excellent in electrical characteristics on the oxide film. This oxide film can function as a barrier with respect to electrons or holes to reduce a leakage current which may decrease the sensitivity.

The above metals and alloys were examined to obtain good results in any metal. This embodiment has exemplified the X-ray/charge conversion film, but the present invention is not limited to this. As for another material such as $PbI_2$, good results were obtained.

Moreover, the present invention can also be applied to a channel etching type a-Si TFT array, a top gate electrode type a-Si TFT array, and a polysilicon TFT array, in addition to a channel stopper type a-Si TFT array according to this embodiment.

In the X-ray semiconductor detector suitable for a medical X-ray diagnostic apparatus, an AlZr alloy is used for the pixel electrode for gathering charges of each pixel of the amorphous X-ray/charge conversion film for converting an X-ray into charges. Accordingly, variations in pixel area in the use of ITO can be prevented, and respective pixel electrode areas can be made uniform to obtain an accurate image. Since an organic insulating film such as a benzocyclobutene resin film is used as the insulating film below the pixel electrode, the electrostatic capacitance between the pixel electrode and lower electrode interconnection in the use of $SiN_x$ can be prevented to prevent an interlevel short circuit.

(Embodiment 14)

Figure 73:
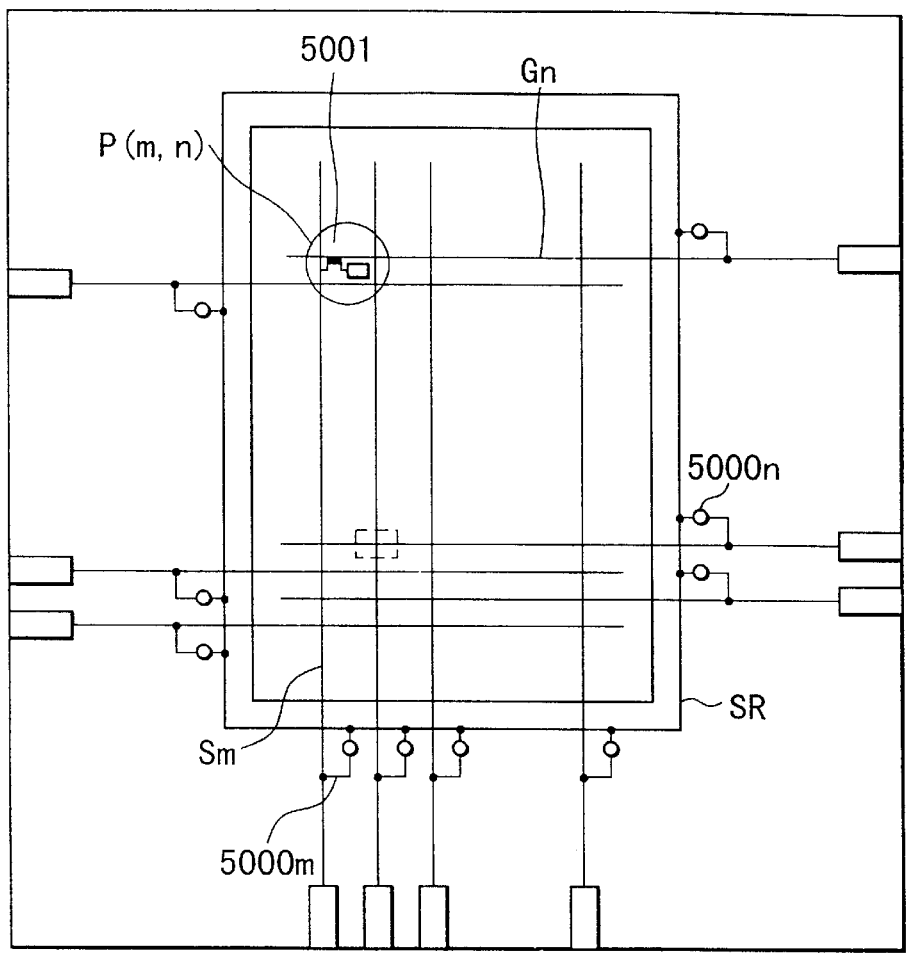
FIG. 73 is an equivalent circuit diagram showing one pixel of an X-ray semiconductor detector according to Embodiment 14.

FIG. 73 is a plan view showing the TFT array of an

X-ray semiconductor detector according to Embodiment 14. In FIG. 73, the TFT array is constituted by a first area having an array of m×n pixels P(m,n) each made up of a signal read line Sm, a gate line Gn, a signal read a-Si TFT 5001, an storage capacitor Cs, and a photosensitive X-ray/charge conversion film, and a second area around the pixel area in which the signal read and gate lines Sm and Gn are extracted and respectively connected to a detection amplifier and gate electrode driver (neither is shown). In the second area, the signal read and gate lines Sm and Gn are respectively connected to the terminals of electrostatic discharge means 5000*m* and 5000*n*. One terminal of each of the electrostatic discharge means 5000*m* and 5000*n* is connected to a common wiring line SR around the first area. All the signal read and gate lines Sm and Gn are connected by the electrostatic discharge means 5000*m* and 5000*n* and common wiring line SR.

If a potential difference is generated by electrostatic charging between the signal read and gate lines Sm and Gn during the manufacture of the TFT array, charges move through the electrostatic discharge means 5000*m* and 5000*n* to set the signal read and gate lines Sm and Gn at the same potential. As a result, the potential difference between the gate, source, and drain electrodes caused by static electricity can be decreased to prevent electrostatic destruction of the TFT.

Since the electrostatic discharge means 5000*m* and 5000*n* and common wiring line SR are formed in the second area, point and line defects caused by electro-static destruction during the manufacture of the TFT array can be decreased to obtain a high-quality image.

Figure 74:
FIG. 74 is an equivalent circuit diagram showing an electrostatic discharge means in FIG. 73.
Figure 75:
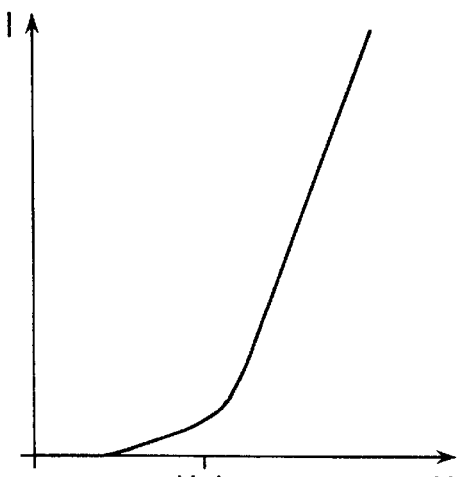
FIG. 75 is a graph showing the curve I-V of the electrostatic discharge means in FIG. 74.

FIG. 74 shows the basic arrangement of the electrostatic discharge means 5000*m* and 5000*n*. The electrostatic discharge means 5000*m* and 5000*n* are preferably made from TFTs which can be formed in the same process as a signal read switch formed in the first area without any additional process. This TFT has a diode structure in which the gate and drain electrodes are connected. FIG. 75 shows the I-V characteristics of the electrostatic discharge means shown in FIG. 74. When the voltage reaches a predetermined level or more by static electricity, the TFT is turned on to prevent application of a high voltage which may destruct the TFT.

FIGS. 76A, 76B, 76C, 76D, 76E, 76F, 76G, 76H, and 76I show other examples of the electrostatic discharge means 5000*m* and 5000*n*. It is important that one terminal of each of the electrostatic discharge means 5000*m* and 5000*n* is connected to the signal read or gate line Sm or Gn, and the other terminal is connected to the common wiring line SR. The structure such as the number of TFTs or series/parallel-connection can be changed in accordance with an application purpose and design.

(Embodiment 15)

Figure 77:
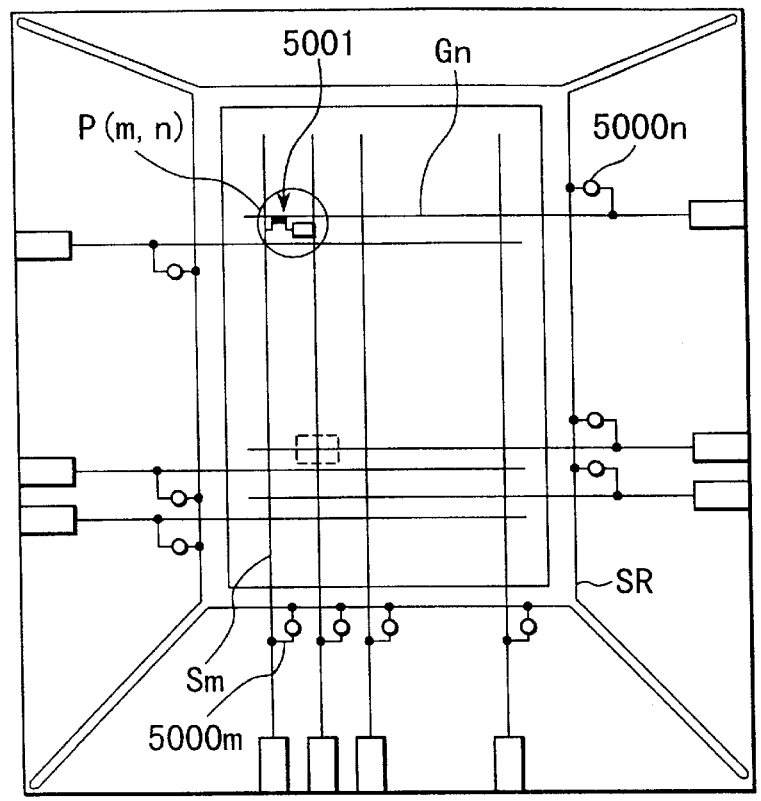
FIG. 77 is an equivalent circuit diagram showing the TFT array of an X-ray semiconductor detector according to Embodiment 15.

FIG. 77 is a plan view showing an X-ray semiconductor detector according to Embodiment 15. In FIG. 77, the same reference numerals as in FIG. 73 denote the same parts, and a detailed description thereof will be omitted.

This X-ray semiconductor detector is constituted by a first area having a matrix array of m×n pixels P(m,n) each made up of a signal read line Sm, a gate line Gn, a signal read a-Si TFT 5001, an storage capacitor Cs, and an X-ray/charge conversion film, and a second area around the first area in which the signal read and gate lines Sm and Gn are extracted and respectively connected to a detection amplifier and gate electrode driver (neither is shown).

In the second area, the signal read and gate lines Sm and Gn are respectively connected to the terminals of electrostatic discharge means 5000*m* and 5000*n*. One terminal of each of the electrostatic discharge means 5000*m* and 5000*n* is connected to an common wiring line SR around the first area. All the signal read and gate lines Sm and Gn are connected by the electrostatic discharge means 5000*m* and 5000*n* and common wiring line SR. Part of the common wiring line SR is extracted to an end of the TFT array.

If a potential difference is generated by static electricity between the signal read and gate lines Sm and Gn during the manufacture of the TFT array, charges move through the electrostatic discharge means 5000*m* and 5000*n* to set the signal read and gate lines Sm and Gn at the same potential. As a result, the potential difference between the gate, source, and drain electrodes by static electricity can be decreased to prevent electrostatic destruction of the TFT. Point and line defects caused by electrostatic destruction can be decreased to obtain a high-quality image.

The electrostatic discharge means 5000*m* and 5000*n* and common wiring line SR shown in FIG. 77 are necessary for the manufacture of the TFT array during which static electricity is generated, but become unnecessary after the TFT array is connected to the detection amplifier and gate electrode driver and actually detects an image.

However, these circuits are difficult to eliminate because they are formed on the TFT array.

When the electrostatic discharge means 5000*m* and 5000*n* and common wiring line SR are present, if a potential difference is generated between the signal read or gate line Sm or Gn and common wiring line SR, the electrostatic discharge means 5000*m* and 5000*n* flow a current and undesirably function as a noise source with respect to the detection amplifier. For this reason, the potential of the common wiring line SR must be determined not to generate any potential difference between these lines.

However, the gate line Gn is set to a potential lower than the potential of the source electrode (i.e., the signal read line Sm) of the TFT 5001 in order to suppress the OFF leakage current of the signal read a-Si TFT 5001. Therefore, the signal read and gate lines Sm and Gn do not have the same potential, and a common wiring line SRm on the signal read line Sm side and a common wiring line SRn on the gate line Gn side must be set to proper potentials.

The common wiring line SR can be divided into SRm and SRn after the manufacture of the TFT array by cutting a portion extracted to an end of the TFT array shown in FIG. 77. At the end of the TFT array, the glass substrate is shaved for deflashing in cutting the glass substrate to a desired size, thereby preventing damage to the TFT array in mounting a signal read circuit, gate electrode driver, and the like. At the same time, the extracted portion is shaved to divide the common wiring line SR into SRm and SRn.

Figure 78:
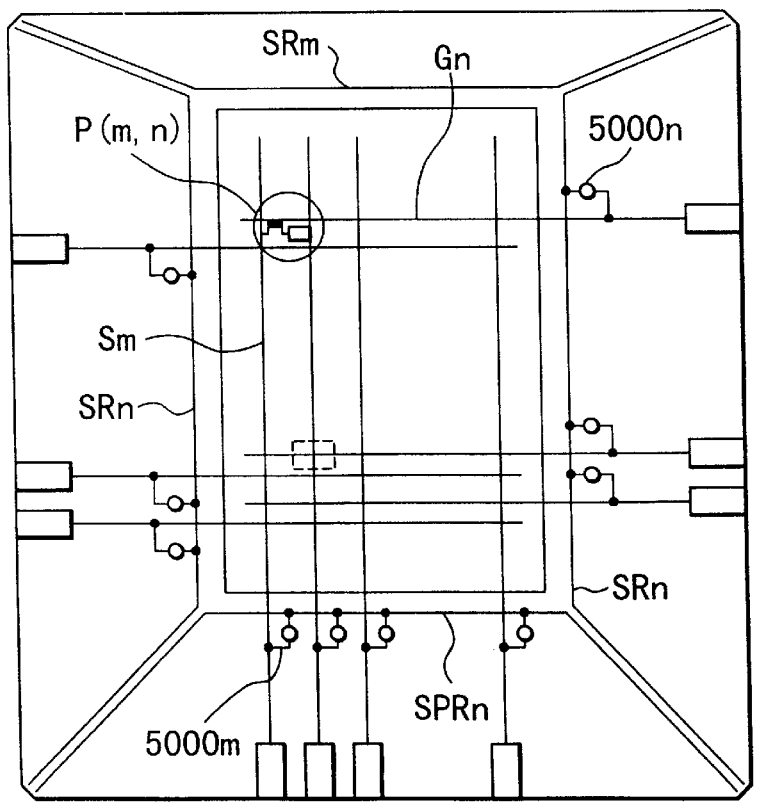
FIG. 78 is an equivalent circuit diagram showing the TFT array of another X-ray semiconductor detector according to Embodiment 15.

FIG. 78 shows the arrangement of the TFT array after the common wiring line SR is divided into SRm and SRn. No noise current flows through the electrostatic discharge means 5000*m* and 5000*n* by supplying proper potentials, i.e., a potential equal to the signal read line Sm to the common wiring line SRm and a potential equal to the gate line Gn to the common wiring line SRn. Therefore, a high-quality detected image almost free from noise can be obtained.

As described above, according to this embodiment, electrical destruction of the charge read switch during the manufacture of the TFT array can be prevented to obtain a high-quality pixel free from any pixel defect caused by destruction of the switch. Further, since the common wiring line is divided into the signal read and gate line sides, and proper potentials are respectively supplied, the thin-film transistor of the electrostatic discharge means does not operate as a noise source, and a high-quality detected image almost free from noise can be attained.

(Embodiment 16)

Figure 79:
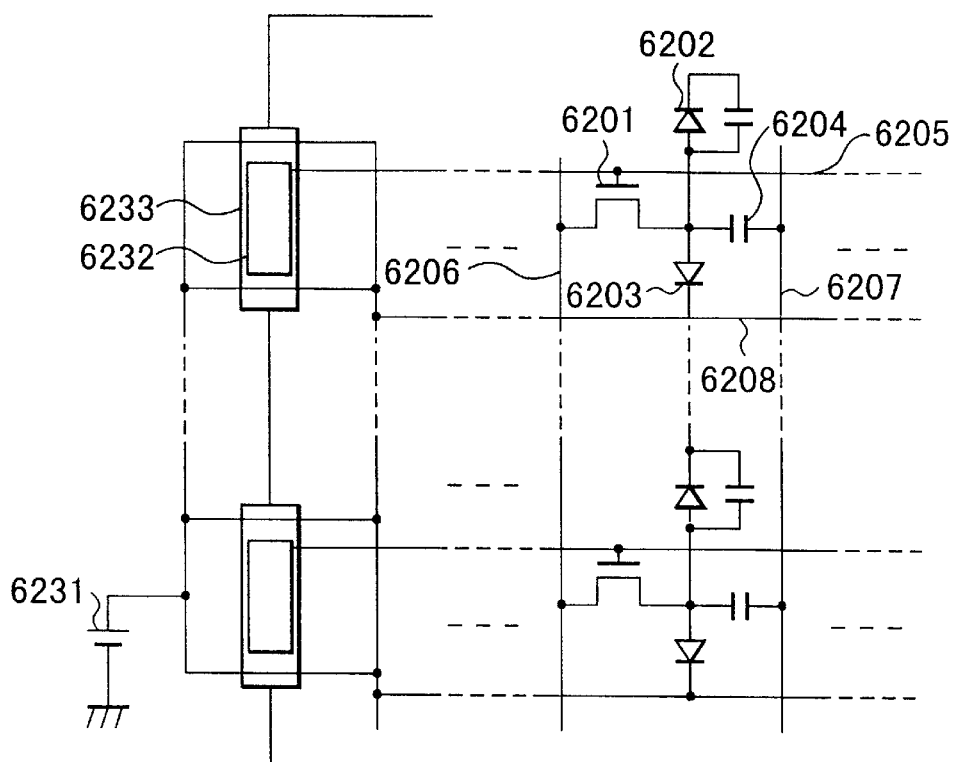
FIG. 79 is an equivalent circuit diagram showing an X-ray semiconductor detector according to Embodiment 16.

FIG. 79 is an equivalent circuit diagram showing an X-ray semiconductor detector according to Embodiment 16. A feature of Embodiment 16 is that power supply lines 6208 for supplying a reference potential to protective diodes 6203 are combined outside an array area where a plurality of pixels are arranged, and connected to a power supply 6231 arranged outside the array area.

The protective diode 6203 is turned on when the voltage reaches a predetermined level or more, and functions to prevent destruction of the TFT by an excessive amount of stored charges. When the protective diode 6203 is turned on, the power supply line flows a current to remove charges to outside the array. To avoid variations in reference potential or heat generation caused by the resistance of the power supply line, the resistance of the power supply line must be set as low as possible.

In this embodiment, as shown in FIG. 79, the power supply lines 6208 are connected to the external power supply 6231 at a plurality of points. This is because the line width of the power supply line 6208 is limited to about several hundred μm, and the resistance is reduced by arranging the power supply lines 6208 parallel. The power supply line 6208 can be connected to the external power supply 6231 via a TCP 6233 on which a gate line driving circuit 6232 is mounted, without any special cable, pad, or the like.

The arrangement of this embodiment can suppress variations in reference potential and heat generation upon operation of the protective diode to prevent destruction of the TFT array, and the like.

(Embodiment 17)

Figure 80:
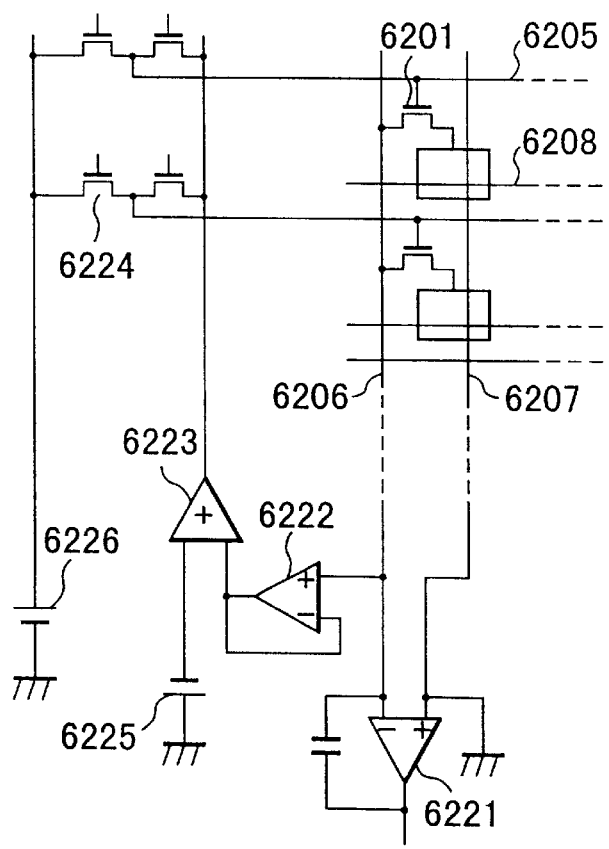
FIG. 80 is an equivalent circuit diagram showing an X-ray semiconductor detector according to Embodiment 17.

FIG. 80 is an equivalent circuit diagram showing an X-ray semiconductor detector according to Embodiment 17. In FIG. 80, the same reference numerals as in FIG. 79 denote the same parts, and a detailed description thereof will be omitted. A feature of Embodiment 17 is that a coupling capacitance with another wiring line which capacitively couples with a signal read line 6206 is reduced by a circuit specification. A change in potential difference across the coupling capacitance can be eliminated by changing the potential of another wiring line by the same amount as a change in potential of the signal read line 6206. As a result, no charges flow to or from the coupling capacitance. The coupling capacitance can be substantially greatly reduced. The parasitic line capacitance of the signal read line can decrease to greatly reduce the noise amount (almost proportional to the line capacitance value) generated by the line capacitance.

The arrangement will be described in detail with reference to FIG. 80. In FIG. 80, a buffer amplifier 6222 with a high input impedance is connected to the signal read line 6206 to control the potential supply source of another line by an output from this amplifier 6222. In FIG. 80, the buffer amplifier 6222 is applied to a gate electrode driving circuit in order to reduce the capacitive coupling with a gate line 6205, and the OFF potential of the gate electrode driving circuit is controlled by an output from the buffer amplifier 6222. Controlling the OFF potential is effective because the OFF-potential period is most of the operation period of the TFT array.

The buffer amplifier 6222 receives the potential of the signal read line 6206, and inputs an output to an amplifier 6223 for generating the OFF potential of the gate electrode. That is, the potential of the signal read line 6206 is added to the original OFF potential of the gate electrode, and thus the above-mentioned effect can be attained. The frequency band of each amplifier is preferably set equal to the frequency band of noise to be reduced.

In this embodiment, the coupling capacitance between the signal read and gate lines is reduced. The present invention can be similarly applied to a wiring line having a large coupling capacitance such as a capacitor or power supply line.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An X-ray semiconductor detector having a pixel array structure in which a plurality of pixel elements are arrayed in a matrix, each pixel element comprising:
   a charge generation film for generating charges in accordance with an incident X-ray;
   a pixel electrode for storing signal charges generated in said charge generation film, an entire surface of said pixel electrode being in direct contact with said charge generation film;
   a signal read transistor, electrically connected to said pixel electrode, for reading said signal charges from said pixel electrode;
   a protective diode arranged below said pixel electrode, said protective diode being arranged to remove excessive charges from said pixel electrode and prevent dielectric breakdown of said signal read transistor; and
   an insulating film formed between said pixel electrode and said protective diode.

2. A detector according to claim 1, wherein said protective diode is covered with said pixel electrode.

3. A detector according to claim 1, further comprising:
   a power supply line serving as a discharge path of said excessive charges connected to said protective diode; and
   a signal read line serving as an output path of said signal charges connected to said signal read transistor,
   said power supply and signal read lines being arranged not to cross each other in said pixel array structure.

4. A detector according to claim 3, wherein said power supply and signal read lines are arranged substantially parallel to each other.

5. A detector according to claim 1, further comprising:
   a gate line connected to said signal read transistor;
   a signal read line serving as an output path of said signal charges connected to said signal read transistor; and
   an amorphous silicon film sandwiched between said gate and signal read lines together with an insulating film at an intersection of said gate and signal read lines.

6. A detector according to claim 1, further comprising:
   a storage capacitor line providing a storage capacitor with said pixel electrode,
   wherein said storage capacitor line and a signal read line serving as an output path of said signal charges connected to said signal read transistor are arranged not to cross each other in said pixel array structure.

7. A detector according to claim 6, wherein said capacitor and signal read lines are arranged substantially parallel to each other.

8. A detector according to claim 6, further comprising:
   a reset transistor connected to said storage capacitor, said reset transistor being arranged to have a channel direction substantially parallel to a channel direction of said signal read transistor.

9. A detector according to claim 1, wherein all transistors in said pixel array structure including said signal read transistor are arranged to have channel directions substantially parallel to each other.

10. A detector according to claim 1, wherein said protective diode is arranged to have a channel direction substantially parallel to a channel direction of said signal read transistor.

11. A detector according to claim 1, further comprising a bias circuit for controlling a breakdown voltage of said protective diode, said bias circuit having a plurality of transistors, said transistors of said bias circuit being arranged to have channel directions substantially parallel to a channel direction of said signal read transistor.

12. A detector according to claim 1, wherein said pixel electrode is formed from an aluminum alloy.

13. A detector according to claim 1, wherein said pixel electrode is formed from an aluminum alloy consisting of aluminum and at least one metal selected from said group consisting of Ag, Nd, Au, Sm, Cu, Mn, Sl, Ni, Co, Y, Fe, Sc, Pd, Ti, Pt, Zr, Cr, V, Rh, Hf, Ru, B, Ir, Nb, Mo, Ta, Os, Re, and W.

14. A detector according to claim 1, wherein a signal read line serving as an output path of said signal charges connected to said signal read transistor is arranged below a gate insulating film of said signal read transistor.

15. A detector according to claim 1, wherein said protective dione has a same TFT structure as that of said signal read transistor.

16. A detector according to claim 1, wherein said protective diode has a TFT structure.

17. An X-ray semiconductor detector having a pixel array structure in which a plurality of pixel elements are arrayed in a matrix, each pixel element comprising:
- a substrate;
- a signal read transistor formed on said substrate;
- a protective diode formed on said substrate to prevent dielectric breakdown of said signal read transistor;
- a pixel electrode formed above said protective diode to cover said protective diode, signal charges being read from said pixel electrode via said signal read transistor;
- a charge generation film formed on said pixel electrode to generate charges in accordance with an incident X-ray, said charge generation film being in direct contact with an entire surface of said pixel electrode;
- a storage capacitor line formed on said charge generation film to storage said signal charges generated in said charge generation film together with said pixel electrode; and
- an insulating film formed between said pixel electrode and said protective diode.

18. A detector according to claim 17, further comprising:
- a power supply line serving as a discharge path of excessive charges connected to said protective diode; and
- a signal read line serving as an output path of said signal charges connected to said signal read transistor,
- said power supply and signal read lines being arranged not to cross each other in said pixel array structure.

19. A detector according to claim 17, further comprising:
- a gate line connected to said signal read transistor;
- a signal read line serving as an output path of said signal charges connected to said signal read transistor; and
- an amorphous silicon film sandwiched between said gate and signal read lines together with an insulating film at an intersection of said gate and signal read lines.

20. A detector according to claim 17, wherein said storage capacitor is made up of a storage capacitor line and said pixel electrode, and said storage capacitor line and a signal read line serving as an output path of said signal charges connected to said signal read transistor are arranged substantially parallel to each other.

21. A detector according to claim 17, wherein all transistors in said pixel array structure including said signal read transistor are arranged to have channel directions substantially parallel to each other.

22. A medical X-ray diagnostic apparatus having an X-ray semiconductor detector, said X-ray semiconductor detector having a pixel array structure in which a plurality of pixel elements are arrayed in a matrix, each pixel element comprising:
- a charge generation film for generating charges in accordance with an incident X-ray;
- a pixel electrode of a storage capacitor for storing said signal charges generated in said charge generation film, an entire surface of said pixel electrode being in direct contact with said charge generation film;
- a signal read transistor for reading said signal charges from said storage capacitor;
- a protective diode arranged below a pixel electrode of said storage capacitor, said protective diode being arranged to remove excessive charges from said storage capacitor and prevent dielectric breakdown of said signal read transistor; and
- an insulating film formed between said pixel electrode and said protective diode.

* * * * *